United States Patent
Iwasawa et al.

(10) Patent No.: US 9,244,357 B2
(45) Date of Patent: Jan. 26, 2016

(54) METHOD FOR FORMING RESIST PATTERN

(71) Applicant: Tokyo Ohka Kogyo Co., Ltd., Kawasaki-shi (JP)

(72) Inventors: Yuta Iwasawa, Kawasaki (JP); Kotaro Endo, Kawasaki (JP); Junichi Tsuchiya, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 26 days.

(21) Appl. No.: 14/154,455

(22) Filed: Jan. 14, 2014

(65) Prior Publication Data
US 2014/0205956 A1    Jul. 24, 2014

(30) Foreign Application Priority Data

Jan. 22, 2013 (JP) .................................. 2013-009505

(51) Int. Cl.
| G03F 7/40 | (2006.01) |
| G03F 7/004 | (2006.01) |
| G03F 7/38 | (2006.01) |
| G03F 7/039 | (2006.01) |
| G03F 7/20 | (2006.01) |
| G03F 7/32 | (2006.01) |

(52) U.S. Cl.
CPC .............. G03F 7/40 (2013.01); G03F 7/0045 (2013.01); G03F 7/0046 (2013.01); G03F 7/0397 (2013.01); G03F 7/2041 (2013.01); G03F 7/325 (2013.01); G03F 7/38 (2013.01)

(58) Field of Classification Search
CPC .................................. G03F 7/40; G03F 7/0397
USPC .............................. 430/325, 326, 330, 270.1
See application file for complete search history.

(56) References Cited

U.S. PATENT DOCUMENTS

| 4,743,529 A * | 5/1988 | Farid et al. ................. 430/281.1 |
| 2004/0110085 A1 | 6/2004 | Iwai et al. |
| 2005/0019690 A1 * | 1/2005 | Kodama ..................... 430/270.1 |
| 2009/0197204 A1 | 8/2009 | Shiono et al. |
| 2009/0317743 A1 | 12/2009 | Shiono et al. |
| 2010/0310985 A1 | 12/2010 | Mori et al. |
| 2011/0117499 A1 | 5/2011 | Matsumiya et al. |
| 2011/0244399 A1 | 10/2011 | Hirano et al. |
| 2011/0262864 A1 | 10/2011 | Hirano et al. |
| 2012/0149916 A1 | 6/2012 | Utsumi et al. |

FOREIGN PATENT DOCUMENTS

| JP | A-2002-090991 | 3/2002 |
| JP | A-2003-241385 | 8/2003 |
| JP | A-2010-002870 | 1/2010 |
| JP | A-2010-032994 | 2/2010 |
| JP | A-2010-277043 | 12/2010 |
| JP | A-2011-013569 | 1/2011 |
| JP | A-2011-128226 | 6/2011 |
| JP | A-2011-191727 | 9/2011 |
| JP | A-2012-073565 | 4/2012 |

* cited by examiner

*Primary Examiner* — John S Chu
(74) *Attorney, Agent, or Firm* — Knobbe Martens Olson & Bear LLP

(57) ABSTRACT

A method for forming a negative type resist pattern having a high residual film rate of exposed areas of a resist film by heating an exposed resist film and subjecting it to patterning by negative type development with a developing solution containing an organic solvent, in which a resist composition containing a high-molecular weight compound having a constituent unit represented by a particular general formula.

8 Claims, No Drawings

METHOD FOR FORMING RESIST PATTERN

CROSS-REFERENCE TO RELATED APPLICATIONS

This application claims priority under 35 U.S.C. §119(a)-(e) to Japanese Patent Application No. 2013-009505, filed Jan. 22, 2013, the content of which is incorporated herein by reference.

TECHNICAL FIELD

The present invention relates to a method for forming a resist pattern.

DESCRIPTION OF RELATED ART

Techniques (pattern-forming techniques) in which a fine pattern is formed on the top of a substrate, and a lower layer beneath that pattern is then processed by conducting etching with this pattern as a mask are widely used in the production of semiconductor devices and liquid display devices. These types of fine patterns are usually composed of an organic material and formed using a technique such as a lithography method and a nanoimprint method. For example, the lithography method is conducted by steps including forming a resist film on a support such as a substrate by using a resist material containing a base material component such as a resin and selectively exposing the resist film with radial rays such as light and electron beams, followed by conducting a development treatment, thereby forming a resist pattern having a prescribed shape on the resist film. A semiconductor or the like is then produced through a step of processing the substrate by means of etching while using the resist pattern as a mask.

The above-described resist material is classified into a positive type and a negative type. A resist material in which the exposed portions exhibit increased solubility in a developing solution is called a positive type, and a resist material in which the exposed portions exhibit decreased solubility in a developing solution is called a negative type.

In general, an alkali aqueous solution (alkali developing solution) such as a tetramethylammonium hydroxide (TMAH) aqueous solution is used as the developing solution. In addition, an organic solvent such as an aromatic solvent, an aliphatic hydrocarbon-based solvent, an ether-based solvent, a ketone-based solvent, an ester-based solvent, an amide-based solvent, and an alcohol-based solvent is also used as the developing solution.

In recent years, advances in lithography techniques have led to rapid progress in the field of pattern miniaturization.

In general, these miniaturization techniques involve shortening of the wavelength (increasing the energy) of the exposure light source. Specifically, ultraviolet rays represented by g-line or i-line have hitherto been used. But, nowadays KrF excimer lasers and ArF excimer lasers are starting to be introduced in mass production of semiconductors. In addition, investigations are also being conducted on EB (electron beams), EUV (extreme ultraviolet radiation), X rays, and the like, which have a shorter wavelength (higher energy) than these excimer lasers.

Following shortening of the wavelength of the exposure light source, the resist material is required to have enhancements of lithography properties such as sensitivity to the exposure light source and resolution capable of reproducing patterns of minute dimensions. As the resist material that satisfies such requirements, a chemically amplified resist composition is known.

As the chemically amplified resist composition, a composition containing a base material component which exhibits changed solubility in a developing solution by the action of an acid and an acid generator component that generates an acid upon exposure is generally used. For example, in the case where the developing solution is an alkali developing solution (alkali development process), a base material component exhibiting increased solubility in the alkali developing solution by the action of an acid is used.

Conventionally, a resin (base resin) is mainly used as the base material component of the chemically amplified resist composition. At present, because of excellent transparency in the vicinity of 193 nm, a resin having a constituent unit derived from a (meth)acrylic ester in a main chain thereof (acrylic resin) is the mainstream as the base resin for the chemically amplified resist composition which is used in the ArF excimer laser lithography or the like.

Here, the term "(meth)acrylic acid" means either one or both of acrylic acid having a hydrogen atom bonded at the α-position and methacrylic acid having a methyl group bonded at the α-position. The term "(meth)acrylic ester" means either one or both of an acrylic ester having a hydrogen atom bonded at the α-position and a methacrylic ester having a methyl group bonded at the α-position. The term "(meth)acrylate" means either one or both of an acrylate having a hydrogen atom bonded at the α-position and a methacrylate having a methyl group bonded at the α-position.

In general, the base resin of the chemically amplified resist composition has plural kinds of constituent units for the purpose of enhancing lithography properties and the like. For example, a constituent unit having a lactone structure, a constituent unit having a polar group such as a hydroxyl group, or the like as well as a constituent unit having an acid decomposable group which is decomposed by the action of an acid generated from an acid generator to generate an alkali-soluble group, is used (see, for example, Patent Document 1). In the case where the base resin is an acrylic resin, in general, a resin in which a carboxy group of (meth)acrylic acid or the like is protected by an acid dissociable group such as a tertiary alkyl group and an acetal group is used as the acid decomposable group.

As compared with a negative type development process using a combination of a negative type, chemically amplified resist composition with an alkali developing solution, a positive type development process using a combination of a positive type, chemically amplified resist composition, namely a chemically amplified resist composition whose solubility in an alkali developing solution increases upon exposure, with an alkali developing solution has such advantages that a structure of a photomask can be simplified; and that properties of a formed pattern are excellent. For that reason, at present, the positive type development process using a combination of a positive type, chemically amplified resist composition with an alkali developing solution is manly used for the formation of a fine resist pattern.

In recent years, as further progress is made in lithography techniques and expansion of the application field is being advanced, further improvements have also been demanded in terms of various lithography properties in the positive type development process.

In the case of applying the positive type development process, when a resist film obtained by coating the chemically amplified resist composition on a support is selectively exposed, exposed areas of the resist film change from sparingly soluble properties to soluble properties in the alkali developing solution upon decomposition of the acid decomposable group in the base resin by the action of an acid generated from the acid generator or the like, whereas unexposed areas of the resist film do not change in the state where they are still sparingly alkali-soluble. Thus, by the development with the alkali developing solution, a dissolution contrast can be created between the exposed areas and the unexposed areas, and a positive type resist pattern can be formed.

However, even if it is contemplated to apply the positive type development process to form a finer pattern (for example, an isolated trench pattern or a fine and high-density contact hole pattern), in the exposed areas of the resist film, a region with a weak optical intensity is generated particularly in the film thickness direction, whereby the resolution of the resist pattern is easily lowered.

For the above-described fine pattern formation, a method in which a region with a weak optical intensity is selectively dissolved and removed to form a resist pattern (negative type resist pattern) is useful. As a method of forming a negative type resist pattern using a chemically amplified resist composition which is used in the positive type development process as the mainstream, a negative type development process in combination with a developing solution containing an organic solvent (organic developing solution) is known (see, for example, Patent Documents 2 and 3).

In the case of applying the negative type development process, when a resist film obtained by coating the chemically amplified resist composition on a support is selectively exposed, exposed areas of the resist film change from soluble properties to sparingly soluble properties in the organic developing solution upon decomposition of the acid decomposable group in the base resin by the action of an acid generated from the acid generator or the like, whereas unexposed areas of the resist film do not change in the state where they are still soluble. Thus, by the development with the organic developing solution, a dissolution contrast can be created between the exposed areas and the unexposed areas, and a negative type resist pattern can be formed.

DOCUMENT OF RELATED ART

Patent Document

Patent Document 1: JP-A-2003-241385
Patent Document 2: JP-A-2011-191727
Patent Document 3: JP-A-2012-073565

SUMMARY OF THE INVENTION

However, the conventional negative type development process involves such a problem that in the case of after exposure, applying a heating treatment (post exposure bake) and conducting development, it is difficult to sufficiently ensure the film thickness of exposed areas of the resist film.

In view of the foregoing circumstances, the present invention has been made, and an object thereof is to provide a method capable of forming a negative type resist pattern having a high residual film rate of exposed areas of a resist film.

For solving the above-described problems, the present invention employs the following embodiment.

Specifically, the present invention is concerned with a method for forming a resist pattern comprising a step of forming a resist film on a support by using a resist composition which generates an acid upon exposure and exhibits changed solubility in a developing solution by the action of the acid; a step of exposing the resist film; and a step of heating the exposed resist film and conducting patterning by negative type development with a developing solution containing an organic solvent, thereby forming a resist pattern, wherein the resist composition contains a resin component (A) which exhibits decreased solubility in the organic solvent under the action of the acid and which contains a high-molecular weight compound (A1) having a constituent unit (a0) represented by the following general formula (a0-1).

(Chemical formula 1)

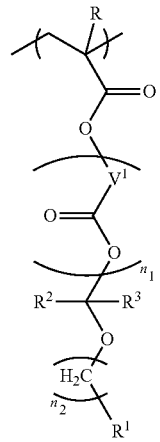

(a0-1)

In the formula, R represents a hydrogen atom, an alkyl group having 1 to 5 carbon atoms, or a halogenated alkyl group having 1 to 5 carbon atoms; $V^1$ represents a divalent hydrocarbon group which may have an ether bond, a urethane bond, or an amide group; $n_1$ is 0 to 2; $n_2$ is 0 to 3; $R^1$ represents a lactone-containing cyclic group, an —$SO_2$—-containing cyclic group, or a carbonate-containing cyclic group; and each of $R^2$ and $R^3$ independently represents a hydrogen atom or an alkyl group having 1 to 5 carbon atoms.

According to the method for forming a resist pattern according to the present invention, a negative type resist pattern having a high residual film rate of exposed areas of a resist film can be formed.

DETAILED DESCRIPTION OF THE INVENTION

In the present specification and claims, the term "aliphatic" is a relative concept used in relation to the term "aromatic" and defines a group or a compound each having no aromaticity.

The term "alkyl group" includes a linear, branched or cyclic, monovalent saturated hydrocarbon group, unless otherwise specified. The same applies for the alkyl group within an alkoxy group.

The term "alkylene group" includes a linear, branched or cyclic, divalent saturated hydrocarbon group, unless otherwise specified.

The term "halogenated alkyl group" refers to a group in which a part or all of hydrogen atoms of an alkyl group are substituted with a halogen atom. Examples of the halogen atom include a fluorine atom, a chlorine atom, a bromine atom, and an iodine atom.

The term "fluorinated alkyl group" or "fluorinated alkylene group" refers to a group in which a part or all of hydrogen atoms of an alkyl group or an alkylene group are substituted with a fluorine atom.

The term "constituent unit" means a monomer unit constituting a high-molecular weight compound (for example, a resin, a polymer, or a copolymer).

The case of describing "may have a substituent" or "optionally substituted" includes both of the case where the hydrogen atom (—H) is substituted with a monovalent group and the case where the methylene group (—CH$_2$—) is substituted with a divalent group.

The term "exposure" is a concept including irradiation with any form of radial rays.

The term "constituent unit derived from an acrylic ester" means a constituent unit constituted upon cleavage of an ethylenic double bond of an acrylic ester.

The term "acrylic ester" refers to a compound in which a terminal hydrogen atom of a carboxy group of acrylic acid (CH$_2$=CH—COOH) is substituted with an organic group.

In the acrylic ester, a hydrogen atom bonded to a carbon atom at the α-position may be substituted with a substituent. The substituent ($R^{\alpha 0}$) with which the hydrogen atom bonded to the carbon atom at the α-position is substituted is an atom other than the hydrogen atom or a group, and examples thereof include an alkyl group having 1 to 5 carbon atoms and a halogenated alkyl group having 1 to 5 carbon atoms. In addition, examples of the acrylic ester also include an itaconic acid diester in which the substituent ($R^{\alpha 0}$) is substituted with an ester bond-containing substituent and an α-hydroxyacrylic ester in which the substituent ($R^{\alpha 0}$) is substituted with a hydroxyalkyl group or a group in which the hydroxyl group of the hydroxyalkyl group is modified. It is to be noted that the carbon atom at the α-position of the acrylic ester refers to a carbon atom to which the carbonyl group of acrylic acid is bonded, unless otherwise specified.

The acrylic ester in which the hydrogen atom bonded to the carbon atom at the α-position is substituted with a substituent is hereinafter sometimes referred to as "α-substituted acrylic ester". In addition, the acrylic ester and the α-substituted acrylic ester are sometimes referred to comprehensively as an "(α-substituted) acrylic ester".

The term "constituent unit derived from acrylamide" means a constituent unit constituted upon cleavage of an ethylenic double bond of acrylamide.

In the acrylamide, the hydrogen atom bonded to the carbon atom at the α-position may be substituted with a substituent, and either one or both of the hydrogen atoms of the amino group of the acrylamide may be substituted with a substituent. It is to be noted that the carbon atom at the α-position of the acrylamide refers to a carbon atom to which the carbonyl group of the acrylamide is bonded, unless otherwise specified.

Examples of the substituent with which the hydrogen atom bonded to the carbon atom at the α-position of the acrylamide is substituted include those exemplified above as the substituent at the α-position (substituent ($R^{\alpha 0}$)) for the α-substituted acrylic ester.

The term "constituent unit derived from hydroxystyrene or a hydroxystyrene derivative" means a constituent unit constituted upon cleavage of an ethylenic double bond of hydroxystyrene or a hydroxystyrene derivative.

The term "hydroxystyrene derivative" is a concept including compounds in which the hydrogen atom at the α-position of hydroxystyrene is substituted with other substituent such as an alkyl group and a halogenated alkyl group, and derivatives thereof. Examples of such derivatives include those in which the hydrogen atom of the hydroxyl group of hydroxystyrene in which the hydrogen atom at the α-position may be substituted with a substituent is substituted with an organic group; and those in which a substituent other than the hydroxyl group is bonded to the benzene ring of hydroxystyrene in which the hydrogen atom at the α-position may be substituted with a substituent. It is to be noted that the term "α-position (carbon atom at the α-position)" refers to a carbon atom to which the benzene ring is bonded, unless otherwise specified.

Examples of the substituent with which the hydrogen atom at the α-position of hydroxystyrene is substituted include those exemplified above as the substituent at the α-position for the α-substituted acrylic ester.

The term "constituent unit derived from vinylbenzoic acid or a vinylbenzoic acid derivative" means a constituent unit constituted upon cleavage of an ethylenic double bond of vinylbenzoic acid or a vinylbenzoic acid derivative.

The term "vinylbenzoic acid derivative" is a concept including compounds in which the hydrogen atom at the α-position of vinylbenzoic acid is substituted with other substituent such as an alkyl group and a halogenated alkyl group, and derivatives thereof. Examples of such derivatives include those in which the hydrogen atom of the carboxy group of vinylbenzoic acid in which the hydrogen atom at the α-position may be substituted with a substituent is substituted with an organic group; and those in which a substituent other than a hydroxyl group and a carboxy group is bonded to the benzene ring of vinylbenzoic acid in which the hydrogen atom at the α-position may be substituted with a substituent. It is to be noted that the term "α-position (carbon atom at the α-position)" refers to a carbon atom to which the benzene ring is bonded, unless otherwise specified.

The term "styrene" is a concept including styrene and compounds in which the hydrogen atom at the α-position of styrene is substituted with other substituent such as an alkyl group and a halogenated alkyl group.

The term "constituent unit derived from styrene" or "constituent unit derived from a styrene derivative" means a constituent unit constituted upon cleavage of an ethylenic double bond of styrene or a styrene derivative.

The alkyl group as the substituent at the α-position is preferably a linear or branched alkyl group. Specifically, examples thereof include an alkyl group having 1 to 5 carbon atoms (for example, a methyl group, an ethyl group, a propyl group, an isopropyl group, an n-butyl group, an isobutyl group, a tert-butyl group, a pentyl group, an isopentyl group, or a neopentyl group).

In addition, specifically, examples of the halogenated alkyl group as the substituent at the α-position include a group in which a part or all of hydrogen atoms of the above-described "alkyl group as the substituent at the α-position" are substituted with a halogen atom. Examples of the halogen atom include a fluorine atom, a chlorine atom, a bromine atom, and an iodine atom, with a fluorine atom being especially preferable.

In addition, specifically, examples of the hydroxyalkyl group as the substituent at the α-position include a group in which a part or all of hydrogen atoms of the above-described "alkyl group as the substituent at the α-position" are substituted with a hydroxyl group. The number of the hydroxyl group in the hydroxyalkyl group is preferably 1 to 5, and most preferably 1.

<<Method for Forming a Resist Pattern>>

The method for forming a resist pattern according to the present invention includes a step of forming a resist film on a support by using a resist composition which generates an acid upon exposure and exhibits changed solubility in a developing solution by the action of the acid; a step of exposing the resist film; and a step of heating the exposed resist film and conducting patterning by negative type development with a developing solution containing an organic solvent, thereby forming a resist pattern.

In such a method for forming a resist pattern, the resist composition contains a resin component (A) (hereinafter referred to as "component (A)") whose solubility in an organic solvent contained in a developing solution to be used in the negative type development decreases by the action of an acid, and the component (A) contains a high-molecular weight compound (A1) having a constituent unit (a0) represented by the general formula (a0-1).

In the resist composition containing the component (A), when radial rays are used for irradiation (exposure), an acid is generated, and the solubility of the component (A) in an organic solvent decreases by the action of the acid. For that reason, in the method for forming a resist pattern, when a resist film obtained using the resist composition is selectively exposed, the solubility of exposed areas in the resist film in a developing solution containing an organic solvent (organic developing solution) decreases, whereas the solubility of unexposed areas in the organic developing solution does not change. Therefore, by conducting the negative type development with the organic developing solution, the unexposed areas are removed to form a resist pattern. Details of the resist composition are described later.

The method for forming a resist pattern according to the present invention can be, for example, conducted in the following manner.

[Step of Forming a Resist Film on a Support by Using a Resist Composition]

First of all, the resist composition which generates an acid upon exposure and exhibits changed solubility in a developing solution by the action of the acid is coated on a support using a spinner or the like, and a bake (post-apply bake (PAB)) treatment is conducted under a temperature condition of, for example, 80 to 150° C. for 40 to 120 seconds, and preferably 60 to 90 seconds, thereby forming a resist film.

The support is not particularly limited, and a conventionally known support can be used. For example, substrates for electronic components, and such substrates having a prescribed wiring pattern formed thereon can be exemplified. More specifically, examples thereof include a metal-made substrate such as silicon wafer, copper, chromium, iron, and aluminum; and a glass substrate. As a material for the wiring pattern, for example, copper, aluminum, nickel, or gold can be used.

In addition, as the support, a support in which an inorganic and/or organic film is provided on the above-described substrate may also be used. Examples of the inorganic film include an inorganic antireflection film (inorganic BARC). Examples of the organic film include an organic film such as an organic antireflection film (organic BARC) and a lower layer organic film in the multilayer resist method.

Here, the multilayer resist method is a method in which at least one layer of an organic film (lower layer organic film) and at least one layer of a resist film (upper layer resist film) are provided on a substrate, and the lower layer organic film is subjected to patterning while using, as a mask, a resist pattern formed on the upper layer resist film, and it is said that a pattern with a high aspect ratio can be formed. That is, according to the multilayer resist method, since a prescribed thickness can be ensured by the lower layer organic film, the resist film can be made thin, so that it becomes possible to form a fine pattern with a high aspect ratio. Basically, the multilayer resist method is classified into a method of forming a two-layer structure of an upper layer resist film and a lower layer organic film (two-layer resist method); and a method of forming a multilayer structure of three or more layers, in which one or more interlayers (for example, a metal thin film) are provided between an upper layer resist film and a lower layer organic film (three-layer resist method).

Furthermore, as the support, a support in which an inorganic antireflection film is formed on a substrate having an organic antireflection film formed on a substrate can also be used.

[Step of Exposing the Resist Film]

Subsequently, by using an exposure apparatus, for example, a KrF exposure apparatus, an ArF exposure apparatus, an electron beam drawing apparatus, or an EUV exposure apparatus, the resist film formed on the support is exposed through a mask having a prescribed pattern formed thereon (mask pattern) or selectively exposed without using a mask pattern by drawing by means of direct irradiation with electron beams, or the like.

The wavelength to be used for the exposure is not particularly limited, and the exposure can be conducted using radial rays such as ArF excimer lasers, KrF excimer lasers, $F_2$ excimer lasers, EUV (extreme ultraviolet rays), VUV (vacuum ultraviolet rays), EB (electron beams), X rays, and soft X rays. The method for forming a resist pattern according to the present invention is high in usefulness for KrF excimer lasers, ArF excimer lasers, EB, or EUV, and is especially useful for ArF excimer lasers, EB, or EUV.

The exposure method of the resist film may be conducted by means of general exposure (dry exposure) which is conducted in air or an inert gas such as nitrogen, or it may be conducted by means of liquid immersion lithography.

The liquid immersion lithography is an exposure method in which a region between a resist film and a lens located at the lowermost position of an exposure apparatus is previously filled with a solvent (liquid immersion medium) having a refractive index larger than a refractive index of air, and the exposure (immersion exposure) is conducted in that state.

The immersion medium is preferably a solvent having a refractive index larger than a refractive index of air and smaller than a refractive index of a resist film to be exposed. The refractive index of such a solvent is not particularly limited so long as it falls within the foregoing range.

Examples of the solvent having a refractive index larger than a refractive index of air and smaller than a refractive index of the resist film include water, a fluorine-based inert liquid, a silicon-based solvent, and a hydrocarbon-based solvent.

Specific examples of the fluorine-based inert liquid include a liquid composed mainly of a fluorine-based compound such as $C_3HCl_2F_5$, $C_4F_9OCH_3$, $C_4F_9OC_2H_5$, and $C_5H_3F_7$. Of these, fluorine-based inert liquids having a boiling point of 70 to 180° C. are preferable, and those having a boiling point of 80 to 160° C. are more preferable. A fluorine-based inert liquid having a boiling point falling within the foregoing range is preferable because after completion of the exposure, the removal of the medium used for the liquid immersion can be conducted by a simple method.

As the fluorine-based inert liquid, in particular, a perfluoroalkyl compound in which all of hydrogen atoms of an alkyl group are substituted with a fluorine atom is preferable. Specifically, examples of the perfluoroalkyl compound include a perfluoroalkylether compound and a perfluoroalkylamine compound.

Furthermore, specifically, examples of the perfluoroalkylether compound include perfluoro(2-butyl-tetrahydrofuran) (boiling point: 102° C.); and examples of the perfluoroalkylamine compound include perfluorotributylamine (boiling point: 174° C.)

As the liquid immersion medium, water is preferably used from the viewpoints of cost, safety, environmental issue, and versatility.

[Step of Heating the Exposed Resist Film and Conducting Patterning by Negative Type Development with a Developing Solution Containing an Organic Solvent (Organic Developing Solution), Thereby Forming a Resist Pattern]

After selectively exposing the resist film formed on the support, a heating (post exposure bake (PEB)) treatment is conducted under a temperature condition of, for example, 80 to 150° C. for 40 to 120 seconds, and preferably 60 to 90 seconds. Subsequently, the baked resist film is subjected to a development treatment with an organic developing solution. Thereafter, the developed resist film is preferably subjected to a rinse treatment with a rinse solution containing an organic solvent, followed by drying.

After the development treatment or rinse treatment, a treatment of removing the developing solution or rinse solution deposited on the pattern with a supercritical fluid may be conducted.

In addition, after the development treatment, the rinse treatment, or the treatment with a supercritical fluid, in order to remove the remaining organic solvent, a heating (post bake) treatment may be conducted as the case may be.

The organic solvent which is contained in an organic developing solution used for the development may be an organic solvent capable of dissolving the resin component (A) (component (A) before the exposure) therein, and it can be properly selected among known organic solvents. Specifically, examples thereof include a polar solvent and a hydrocarbon-based solvent such as a ketone-based solvent, an ester-based solvent, an alcohol-based solvent, a nitrile-based solvent, an amide-based solvent, and an ether-based solvent.

The ketone-based solvent is an organic solvent containing C—C(=O)—C in a structure thereof. The ester-based solvent is an organic solvent containing C—C(=O)—O—C in a structure thereof. The alcohol-based solvent is an organic solvent containing an alcoholic hydroxyl group in a structure thereof, and the term "alcoholic hydroxyl group" means a hydroxyl group bonded to a carbon atom of an aliphatic hydrocarbon group. The nitrile-based solvent is an organic solvent containing a nitrile group in a structure thereof. The amide-based solvent is an organic solvent containing an amide group in a structure thereof. The ether-based solvent is an organic solvent containing C—O—C in a structure thereof.

Among organic solvents, there is also present an organic solvent containing plural kinds of functional groups which characterize the above-described respective solvents, in a structure thereof. In that case, any solvent species containing a functional group which this organic solvent has falls under the definition thereof. For example, diethylene glycol monomethyl ether falls under the definition of any of the alcohol-based solvent or the ether-based solvent in the above-described classification. In addition, the hydrocarbon-based solvent is a hydrocarbon solvent which is composed of a hydrocarbon which may be halogenated and does not have a substituent other than the halogen atom. Examples of the halogen atom include a fluorine atom, a chlorine atom, a bromine atom, and an iodine atom, with a fluorine atom being preferable.

Examples of the ketone-based solvent include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetyl carbinol, acetophenone, methyl naphthyl ketone, isophorone, propylene carbonate, γ-butyrolactone, and 2-heptanone (methyl amyl ketone).

Examples of the ester-based solvent include an alkyl acetate (for example, methyl acetate, butyl acetate, ethyl acetate, isopropyl acetate, amyl acetate, or isoamyl acetate), ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl 3-methoxypropionate, ethyl 3-methoxypropionate, ethyl 3-ethoxypropionate, and propyl 3-methoxypropionate.

It is more preferably to use an alkyl acetate as the ester-based solvent, and above all, it is the most preferable to use butyl acetate.

Examples of the alcohol-based solvent include a monohydric alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, n-decanol, and 3-methoxy-1-butanol; a glycol-based solvent such as ethylene glycol, diethylene glycol, and triethylene glycol; and a glycol ether-based solvent containing a hydroxyl group, such as ethylene glycol monomethyl ether, propylene glycol monomethyl ether, diethylene glycol monomethyl ether, triethylene glycol monoethyl ether, methoxymethyl butanol, ethylene glycol monoethyl ether, ethylene glycol monopropyl ether, ethylene glycol monobutyl ether, propylene glycol monoethyl ether, propylene glycol monopropyl ether, propylene glycol monobutyl ether, and propylene glycol monophenyl ether. Of these, a glycol ether-based solvent is preferable.

Examples of the nitrile-based solvent include acetonitrile, propionitrile, valeronitrile, and butyronitrile.

Examples of the amide-based solvent include N-methyl-2-pyrrolidone, N,N-dimethylacetamide, N,N-dimethylformamide, hexamethylphosphoric triamide, and 1,3-dimethyl-2-imidazolidinone.

Examples of the ether-based solvent include the above-described glycol ether-based solvent containing a hydroxyl group; a glycol ether-based solvent not containing a hydroxyl group, such as propylene glycol dimethyl ether, propylene glycol diethyl ether, diethylene glycol dimethyl ether, and diethylene glycol diethyl ether; dioxane; tetrahydrofuran; anisole; perfluoro-2-butyltetrahydrofuran; perfluorotetrahydrofuran; and 1,4-dioxane. Of these, a glycol ether-based solvent such as a glycol ether-based solvent containing a hydroxyl group and a glycol ether-based solvent not containing a hydroxyl group is preferable.

Examples of the hydrocarbon-based solvent include an aliphatic hydrocarbon-based solvent such as pentane, hexane, octane, decane, 2,2,4-trimethylpentane, 2,2,3-trimethylhexane, perfluorohexane, and perfluoroheptane; and an aromatic hydrocarbon-based solvent such as toluene, xylene, ethylbenzene, propylbenzene, 1-methylpropylbenzene, 2-methylpropylbenzene, dimethylbenzene, diethylbenzene, ethylmethylbenzene, trimethylbenzene, ethyldimethylbenzene, and dipropylbenzene. Of these, an aromatic hydrocarbon-based solvent is preferable.

These organic solvents may be used solely, or may be used in admixture of two or more kinds thereof.

Above all, a boiling point of the organic solvent contained in the organic developing solution is preferably 50° C. or higher and lower than 250° C. An ignition point of the organic solvent contained in the organic developing solution is preferably 200° C. or higher.

Among the foregoing organic solvents, the organic solvent contained in the organic developing solution is preferably a polar solvent; more preferably at least one member selected from the group consisting of a ketone-based solvent, an ester-based solvent, an alcohol-based solvent, a nitrile-based solvent, an amide-based solvent, and an ether-based solvent; still more preferably at least one member selected from the group consisting of a ketone-based solvent and an ester-based solvent; and especially preferably an ester-based solvent.

The ester-based solvent is preferably butyl acetate. The ketone-based solvent is preferably 2-heptanone (methyl amyl ketone).

From the viewpoints of reducing costs of the solvent to be used for the development, and the like, it is preferable to use an organic solvent not containing a halogen atom as the organic solvent used in the organic developing solution. The content of the organic solvent not containing a halogen atom occupying in a total mass of the organic developing solution is preferably 60 mass % or more, more preferably 80 mass % or more, and still more preferably 90 mass % or more, and it may be even 100 mass %.

If desired, the organic developing solution can be blended with a known additive. Examples of the additive include a surfactant. Though the surfactant is not particularly limited, for example, an ionic or nonionic fluorine-based and/or silicon-based surfactant can be used.

Examples of commercially available surfactants which can be used include a fluorine-based surfactant and a silicon-based surfactant, such as EFTOP EF301 and EFTOP EF303 (all of which are manufactured by Shinakita Kasei K.K.); FLUORAD FC430 and FLUORAD FC431 (all of which manufactured by Sumitomo 3M Limited); MEGAFAC F171, MEGAFAC F173, MEGAFAC F176, MEGAFAC F189, and MEGAFAC R08 (all of which are manufactured by DIC Corporation); SURFLON S-382, SURFLON SC101, SURFLON SC102, SURFLON SC103, SURFLON SC104, SURFLON SC105, and SURFLON SC106 (all of which manufactured by Asahi Glass Co., Ltd.); and TROYSOL S-366 (manufactured by Troy Chemical Corporation). In addition, a polysiloxane polymer, KP-341 (manufactured by Shin-Etsu Chemical Co., Ltd.) can also be used as the silicon-based surfactant.

In addition, as the surfactant, besides the above-described known surfactants, a surfactant using a polymer having a fluoro aliphatic group derived from a fluoro aliphatic compound produced by a telomerization method (also called a telomer method) or an oligomerization method (also called an oligomer method) can be used. The fluoro aliphatic compound can be synthesized according to the method disclosed in JP-A-2002-90991.

As the polymer having a fluoro aliphatic group, a copolymer of a fluoro aliphatic group-containing monomer and a (poly(oxyalkylene)) acrylate and/or a (poly(oxyalkylene)) methacrylate is preferable; and such a monomer may be irregularly distributed or block copolymerized. In addition, examples of the poly(oxyalkylene) group include a poly(oxyethylene) group, a poly(oxypropylene) group, and a poly (oxybutylene) group. In addition, a unit having alkylenes having a different chain length within the same chain length, such as a poly (oxyethylene/oxypropylene/oxyethylene block connected body) group and a poly(oxyethylene/oxypropylene block connected body) group may also be used. Furthermore, the copolymer of a fluoro aliphatic group-containing monomer and a (poly(oxyalkylene)) acrylate (or methacrylate) may be not only a binary copolymer but a ternary or multi-component copolymer obtained by simultaneous copolymerization of two or more kinds of different fluoro aliphatic group-containing monomers or two or more kinds of different (poly(oxyalkylene)) acrylates (or methacrylates).

Examples of commercially available surfactants include MEGAFAC F178, MEGAFAC F-470, MEGAFAC F-473, MEGAFAC F-475, MEGAFAC F-476, and MEGAFAC F-472 (all of which are manufactured by DIC Corporation). Furthermore, examples of the surfactant include a copolymer of a $C_6F_{13}$ group-containing acrylate (or methacrylate) and a (poly(oxyalkylene)) acrylate (or methacrylate); a copolymer of a $C_6F_{13}$ group-containing acrylate (or methacrylate), (poly (oxyethylene)) acrylate (or methacrylate), and (poly(oxypropylene)) acrylate (or methacrylate); a copolymer of a $C_8F_{17}$ group-containing acrylate (or methacrylate) and a (poly(oxyalkylene)) acrylate (or methacrylate); and a copolymer of a $C_8F_{17}$ group-containing acrylate (or methacrylate), (poly (oxyethylene)) acrylate (or methacrylate), and (poly(oxypropylene)) acrylate (or methacrylate).

As the surfactant, a nonionic surfactant is preferable, and a fluorine-based surfactant or a silicon-based surfactant is more preferable.

In the case of blending the surfactant, its blending amount is usually 0.001 to 5 mass %, preferably 0.005 to 2 mass %, and more preferably 0.01 to 0.5 mass % relative to the whole amount of the organic developing solution.

It is possible to carry out the development treatment with an organic developing solution by a known development method. Examples of the development treatment include a method of dipping a support in a developing solution for a certain period of time (dip method); a method of raising a developing solution on the surface of a support due to a surface tension and making it stationary for a certain period of time (puddle method); a method of spraying a developing solution onto the surface of a support (spray method); and a method of continuously dispensing a developing solution onto a support rotating at a fixed rate while scanning a developing solution dispense nozzle at a fixed rate (dynamic dispense method).

After the development treatment and before conducting drying, a rinse treatment with a rinse solution containing an organic solvent can be conducted. By conducting the rinse treatment, a satisfactory pattern can be formed.

As the organic solvent which is used in the rinse solution, among the organic solvents exemplified above for the organic solvent which is used in the organic developing solution, an organic solvent which hardly dissolves the resist pattern can be properly selected and used. In general, at least one solvent selected from a hydrocarbon-based solvent, a ketone-based solvent, an ester-based solvent, a nitrile-based solvent, an alcohol-based solvent, an amide-based solvent, and an ether-based solvent is used. Of these, at least one solvent selected from a hydrocarbon-based solvent, a ketone-based solvent, an ester-based solvent, an alcohol-based solvent, and an amide-based solvent is preferable; at least one solvent selected from an alcohol-based solvent and an ester-based solvent is more preferable; and an alcohol-based solvent is especially preferable.

The alcohol-based solvent which is used in the rinse solution is preferably a monohydric alcohol having 6 to 8 carbon atoms, and the monohydric alcohol may be linear, branched, or cyclic. Specifically, examples thereof include 1-hexanol, 1-heptanol, 1-octanol, 2-hexanol, 2-heptanol, 2-octanol, 3-hexanol, 3-heptanol, 3-octanol, 4-octanol, and benzyl alcohol. Of these, 1-hexanol, 2-heptanol, or 2-hexanol is preferable, and 1-hexanol or 2-hexanol is more preferable.

The organic solvent which is used in the rinse solution may be used solely, or may be used in admixture of two or more kinds thereof. In addition, such an organic solvent may be mixed with an organic solvent other than the foregoing organic solvents or water and used. However, taking into consideration the development properties, a blending amount of water in the rinse solution is preferably not more than 30 mass %, more preferably not more than 10 mass %, still more preferably not more than 5 mass %, and especially preferably not more than 3 mass % relative to the whole amount of the rinse solution.

The rinse solution can be blended with a known additive, if desired. Examples of the additive include a surfactant. Examples of the surfactant include the same surfactants as those described above. Above all, a nonionic surfactant is preferable, and a fluorine-based surfactant or a silicon-based surfactant is more preferable. In the case of blending the surfactant in the rinse solution, its blending amount is usually 0.001 to 5 mass %, preferably 0.005 to 2 mass %, and more preferably 0.01 to 0.5 mass % relative to the whole amount of the rinse solution.

The rinse treatment (washing treatment) with a rinse solution can be carried out by a known rinse method. Examples of the method include a method of continuously dispensing a rinse solution onto a support rotating at a fixed rate (rotary coating method); a method of dipping a support in a rinse solution for a fixed time (dip method); and a method of spraying a rinse solution onto the surface of a support (spray method).

<Resist Composition>

In the method for forming a resist pattern according to the present invention, a resist composition which generates an acid upon exposure and exhibits changed solubility in a developing solution by the action of the acid is used.

The resist composition contains a resin component (A) whose solubility in an organic solvent contained in an organic developing solution decreases by the action of an acid.

[Component (A): Resin Component]

The component (A) is a polymer having film-forming ability and having a molecular weight of preferably 1,000 or more.

In the present specification and claims, the term "high-molecular weight compound" or "resin" refers to a polymer having a molecular weight of 1,000 or more. In the case of a high-molecular weight compound, a mass average molecular weight as converted into polystyrene by means of GPC (gel permeation chromatography) is employed for the "molecular weight".

The component (A) contains a high-molecular weight compound (A1) having a constituent unit (a0) represented by the general formula (a0-1) (hereinafter referred to as "component (A1)").

It is preferable that the component (A1) further has, in addition to the constituent unit (a0), a constituent unit (a1) other than the constituent unit (a0), which contains an acid decomposable group whose polarity increases by the action of an acid.

In addition, it is preferable that the component (A1) further has, in addition to the constituent unit (a0), or the constituent unit (a0) and the constituent unit (a1), a constituent unit (a2) other than the constituent unit (a0) containing a lactone-containing cyclic group, an —$SO_2$—-containing cyclic group, or a carbonate-containing cyclic group.

(Constituent Unit (a0))

The constituent unit (a0) is a constituent unit represented by the following general formula (a0-1).

In the general formula (a0-1), the group represented by "—$C(R^2)(R^3)$—O—$(CH_2)_{n2}$—$R^1$" is a so-called acetal type acid dissociable group.

In this acetal type acid dissociable group, a polar group (—C(=O)—O—) with high polarity is generated in the constituent unit (a0) upon dissociation of the acid dissociable group, whereby the polarity increases. As a result, the polarity of the whole of the component (A1) increases. When the polarity increases, the solubility in the organic developing solution relatively decreases.

By using a high-molecular weight compound having the constituent unit (a0), a negative type resist pattern having a high residual film rate of exposed areas of a resist film can be easily formed by the negative type development.

(Chemical formula 2)

(a0-1)

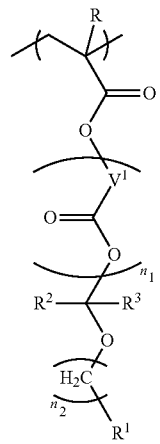

In the formula, R represents a hydrogen atom, an alkyl group having 1 to 5 carbon atoms, or a halogenated alkyl group having 1 to 5 carbon atoms; $V^1$ represents a divalent hydrocarbon group which may have an ether bond, a urethane bond, or an amide bond; $n_1$ is 0 to 2; $n_2$ is 0 to 3; $R^1$ represents a lactone-containing cyclic group, an —$SO_2$—-containing cyclic group, or a carbonate-containing cyclic group; and each of $R^2$ and $R^3$ independently represents a hydrogen atom or an alkyl group having 1 to 5 carbon atoms.

In the foregoing formula (a0-1), R represents a hydrogen atom, an alkyl group having 1 to 5 carbon atoms, or a halogenated alkyl group having 1 to 5 carbon atoms.

The alkyl group having 1 to 5 carbon atoms represented by R is preferably a linear or branched alkyl group having 1 to 5 carbon atoms. Specifically, examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having 1 to 5 carbon atoms is a group in which a part or all of the hydrogen atoms of the above-described alkyl group having 1 to 5 carbon atoms are substituted with a halogen atom. Examples of the halogen atom include a fluorine atom, a chlorine atom, a bromine atom, and an iodine atom, with a fluorine atom being especially preferable.

R is preferably a hydrogen atom, an alkyl group having 1 to 5 carbon atoms, or a fluorinated alkyl group having 1 to 5 carbon atoms, and R is most preferably a hydrogen atom or a methyl group from the viewpoint of easiness of availability in the industry.

In the foregoing formula (a0-1), $V^1$ represents a divalent hydrocarbon group which may have an ether bond, a urethane bond, or an amide bond.

In $V^1$, the ether bond represents C—O—C, the urethane bond represents NH—C(=O)—O, and the amide bond represents N—C(=O).

The divalent hydrocarbon group represented by $V^1$ may be either an aliphatic hydrocarbon group or an aromatic hydrocarbon group.

Aliphatic Hydrocarbon Group in $V^1$:

The aliphatic hydrocarbon group in $V^1$ means a hydrocarbon group having no aromaticity. The aliphatic hydrocarbon group as the divalent hydrocarbon group in $V^1$ may be either saturated or unsaturated, and in general, it is preferably saturated.

More specifically, examples of the aliphatic hydrocarbon group include a linear or branched aliphatic hydrocarbon group and an aliphatic hydrocarbon group containing a ring in a structure thereof.

In addition, $V^1$ may have an ether bond, a urethane bond, or an amide bond between the carbon atoms of the above-described divalent hydrocarbon group. The ether bond, the urethane bond, or the amide bond may be present in a number of 1 or 2 or more in $V^1$, and a mixture of these bonds may be present, too.

The linear or branched aliphatic hydrocarbon group is preferably one having 1 to 10 carbon atoms, more preferably one having 1 to 6 carbon atoms, still more preferably one having 1 to 4 carbon atoms, and most preferably one having 1 to 3 carbon atoms.

The linear aliphatic hydrocarbon group is preferably a linear alkylene group. Specifically, examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group is preferably a branched alkylene group. Specifically, examples thereof include an alkylalkylene group such as an alkylmethylene group, for example, —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; an alkylethylene group, for example, —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; an alkyltrimethylene group, for example, —$CH(CH_3)$ $CH_2CH_2$— and —$CH_2CH(CH_3)$ $CH_2$—; and an alkyltetramethylene group, for example, —$CH(CH_3)$ $CH_2CH_2CH_2$— and —$CH_2CH(CH_3)$ $CH_2CH_2$—. The alkyl group in the alkylalkylene group is preferably a linear alkyl group having 1 to 5 carbon atoms.

Examples of the aliphatic hydrocarbon group containing a ring in a structure thereof include an alicyclic hydrocarbon group (a group in which two hydrogen atoms are eliminated from an aliphatic hydrocarbon ring), a group in which an alicyclic hydrocarbon group is bonded to an end of a linear or branched aliphatic hydrocarbon group, and a group in which an alicyclic hydrocarbon group intervenes on the way of a linear or branched aliphatic hydrocarbon group. Examples of the linear or branched aliphatic hydrocarbon group include the same groups as those described above.

The alicyclic hydrocarbon group has preferably 3 to 20 carbon atoms, and more preferably 3 to 12 carbon atoms.

The alicyclic hydrocarbon group may be either polycyclic group or monocyclic group. The monocyclic alicyclic hydrocarbon group is preferably a group in which two hydrogen atoms are eliminated from a monocycloalkane. The monocycloalkane is preferably one having 3 to 6 carbon atoms. Specifically, examples thereof include cyclopentane and cyclohexane.

The polycyclic alicyclic hydrocarbon group is preferably a group in which two hydrogen atoms are eliminated from a polycycloalkane. The polycycloalkane is preferably one having 7 to 12 carbon atoms. Specifically, examples thereof include adamantane, norbornane, isobornane, tricyclodecane, and tetracyclododecane.

Aromatic Hydrocarbon Group in $V^1$:

The aromatic hydrocarbon group in $V^1$ is a hydrocarbon group having an aromatic ring.

The carbon number of the aromatic hydrocarbon group is preferably 3 to 30, more preferably 5 to 30, still more preferably 5 to 20, especially preferably 6 to 15, and most preferably 6 to 10. However, the carbon number does not include the carbon number in the substituent.

Specifically, examples of the aromatic ring which the aromatic hydrocarbon group has include an aromatic hydrocarbon ring such as benzene, biphenyl, fluorene, naphthalene, anthracene, and phenanthrene; and an aromatic heterocyclic ring in which a part of the carbon atoms constituting the aromatic hydrocarbon ring is substituted with a hetero atom. Examples of the hetero atom in the aromatic heterocyclic ring include an oxygen atom, a sulfur atom, and a nitrogen atom.

Specifically, examples of the aromatic hydrocarbon group include a group (arylene group) in which two hydrogen atoms are eliminated from the above-described aromatic hydrocarbon ring; and a group in which one of the hydrogen atoms of a group (aryl group) in which one hydrogen atom is eliminated from the above-described aromatic hydrocarbon ring is substituted with an alkylene group (a group in which one hydrogen atom is further eliminated from an aryl group in an arylalkyl group, for example, a benzyl group, a phenethyl group, a 1-naphthylmethyl group, a 2-naphthylmethyl group, a 1-naphthylethyl group, or a 2-naphthylethyl group). The carbon number of the alkylene group (the alkyl chain in the arylalkyl group) is preferably 1 to 4, more preferably 1 to 2, and especially preferably 1.

In the foregoing formula (a0-1), $n_1$ is 0 to 2, preferably 0 or 1, and especially preferably 0.

$n_2$ is 0 to 3, preferably 0 or 1, and especially preferably 0.

In the foregoing formula (a0-1), each of $R^2$ and $R^3$ independently represents a hydrogen atom or an alkyl group having 1 to 5 carbon atoms.

It is preferable that at least one of $R^2$ and $R^3$ is a hydrogen atom, and it is more preferable that both of $R^2$ and $R^3$ are a hydrogen atom.

In the case where $R^2$ and $R^3$ are an alkyl group, a linear or branched alkyl group is preferable. More specifically, examples thereof include a methyl group, an ethyl group, a propyl group, an isopropyl group, an n-butyl group, an isobutyl group, a tert-butyl group, a pentyl group, an isopentyl group, and a neopentyl group. Of these, a methyl group or an ethyl group is more preferable, with a methyl group being especially preferable.

In the foregoing formula (a0-1), $R^1$ represents a lactone-containing cyclic group, an —$SO_2$—-containing cyclic group, or a carbonate-containing cyclic group.

The term "lactone-containing cyclic group" refers to a cyclic group containing a ring (lactone ring) containing —O—C(=O)— in a ring skeleton thereof. When the lactone ring is counted as the first ring, a lactone-containing cyclic group in which the only ring structure is the lactone ring is called a monocyclic group, whereas a lactone-containing cyclic group containing other ring structure is called a polycyclic group regardless of the structure of the other rings. The lactone-containing cyclic group may be either a monocyclic group or a polycyclic group.

The lactone-containing cyclic group in the constituent unit (a0) is not particularly limited, and any optional lactone-containing cyclic group can be used. Specifically, examples thereof include groups represented by the following general formulae (a2-r-1) to (a2-r-7).

(Chemical formula 3)

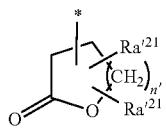
(a2-r-1)

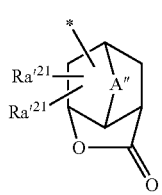
(a2-r-2)

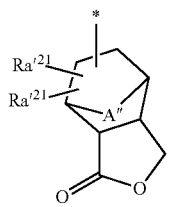
(a2-r-3)

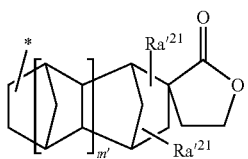
(a2-r-4)

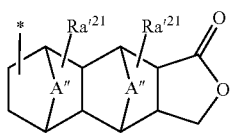
(a2-r-5)

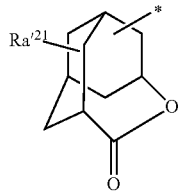
(a2-r-6)

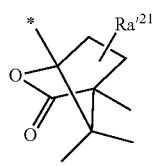
(a2-r-7)

In the formulae, each $Ra'^{21}$ independently represents a hydrogen atom, an alkyl group, an alkoxy group, a halogen atom, a halogenated alkyl group, a hydroxyl group, —COOR", —OC(=O)R", a hydroxyalkyl group, or a cyano group; R" represents a hydrogen atom or an alkyl group; A" represents an alkylene group having 1 to 5 carbon atoms, which may contain an oxygen atom (—O—) or a sulfur atom (—S—), an oxygen atom, or a sulfur atom; n' is an integer of 0 to 2; and m' is 0 or 1.

In the foregoing general formulae (a2-r-1) to (a2-r-7), the alkyl group in $Ra'^{21}$ is preferably an alkyl group having 1 to 6 carbon atoms. The alkyl group is preferably linear or branched. Specifically, examples thereof include a methyl group, an ethyl group, a propyl group, an isopropyl group, an n-butyl group, an isobutyl group, a tert-butyl group, a pentyl group, an isopentyl group, a neopentyl group, and a hexyl group. Of these, a methyl group or an ethyl group is preferable, with a methyl group being especially preferable.

The alkoxy group in $Ra'^{21}$ is preferably an alkoxy group having 1 to 6 carbon atoms. The alkoxy group is preferably linear or branched. Specifically, examples thereof include a group in which the alkyl group exemplified above as the alkyl group in $Ra'^{21}$ and an oxygen atom (—O—) are connected to each other.

Examples of the halogen atom in $Ra'^{21}$ include a fluorine atom, a chlorine atom, a bromine atom, and an iodine atom, with a fluorine atom being preferable.

Examples of the halogenated alkyl group in $Ra'^{21}$ include a group in which a part or all of hydrogen atoms of the alkyl group in $Ra'^{21}$ are substituted with a halogen atom. The halogenated alkyl group is preferably a fluorinated alkyl group, and especially preferably a perfluoroalkyl group.

In —COOR" and —OC(=O)R" in $Ra'^{21}$, each R" is a hydrogen atom or an alkyl group.

The alkyl group in R" may be linear, branched, or cyclic, and the carbon number thereof is preferably 1 to 15.

In the case where R" is a linear or branched alkyl group, the carbon number thereof is preferably 1 to 10, and more preferably 1 to 5. Above all, R" is especially preferably a methyl group or an ethyl group.

In the case where R" is a cyclic alkyl group, the carbon number thereof is preferably 3 to 15, more preferably 4 to 12, and most preferably 5 to 10. Specifically, examples thereof include a group in which one or more hydrogen atoms are eliminated from a monocycloalkane or a polycycloalkane such as a bicycloalkane, a tricycloalkane, and a tetracycloalkane, each of which may or may not be substituted with a fluorine atom or a fluorinated alkyl group. More specifically, examples thereof include a group in which one or more hydrogen atoms are eliminated from a monocycloalkane such as cyclopentane and cyclohexane, or a polycycloalkane such as adamantane, norbornane, isobornane, tricyclodecane, and tetracyclododecane.

The hydroxyalkyl group in $Ra'^{21}$ is preferably one having 1 to 6 carbon atoms. Specifically, examples thereof include a group in which at least one of the hydrogen atoms of the alkyl group exemplified above for $Ra'^{21}$ is substituted with a hydroxyl group.

In the foregoing general formulae (a2-r-2), (a2-r-3), and (a2-r-5), the alkylene group having 1 to 5 carbon atoms in A" is preferably a linear or branched alkylene group, and examples thereof include a methylene group, an ethylene group, an n-propylene group, and an isopropylene group. In the case where the alkylene group contains an oxygen atom or a sulfur atom, specific examples thereof include a group in which —O— or —S— intervenes at an end or between the carbon atoms of the above-described alkylene group. Examples thereof include —O—CH$_2$—, —CH$_2$—O—CH$_2$, —S—CH$_2$—, and —CH$_2$—S—CH$_2$—. A" is preferably an alkylene group having 1 to 5 carbon atoms or —O—, more preferably an alkylene group having 1 to 5 carbon atoms, and most preferably a methylene group.

Specific examples of each of the groups represented by the general formulae (a2-r-1) to (a2-r-7) are given below.

(Chemical formula 4)

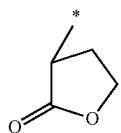
(r-lc-1-1)

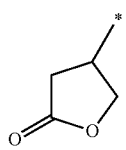
(r-lc-1-2)

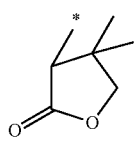
(r-lc-1-3)

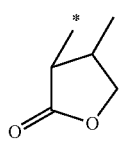
(r-lc-1-4)

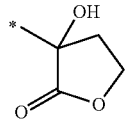
(r-lc-1-5)

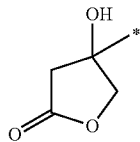
(r-lc-1-6)

-continued

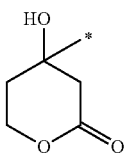
(r-lc-1-7)

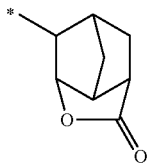
(r-lc-2-1)

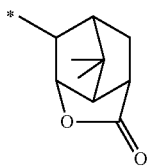
(r-lc-2-2)

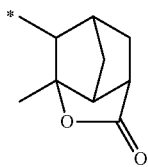
(r-lc-2-3)

(r-lc-2-4)

(r-lc-2-5)

(r-lc-2-6)

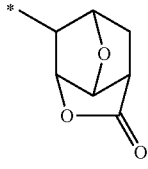
(r-lc-2-7)

21
-continued
(r-lc-2-8)
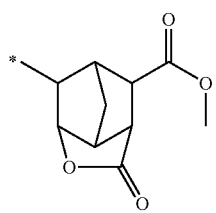
(r-lc-2-9)
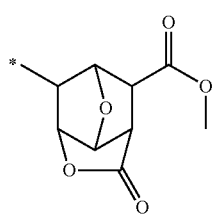
(r-lc-2-10)
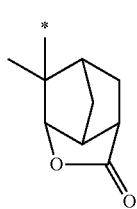
(r-lc-2-11)
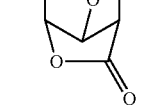
(r-lc-2-12)
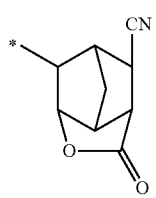
(r-lc-2-13)
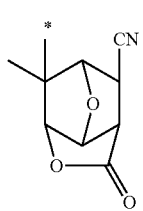
(r-lc-3-1)
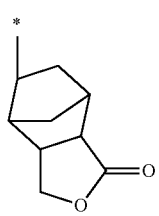
22
-continued
(r-lc-3-2)
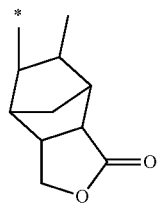
(r-lc-3-3)
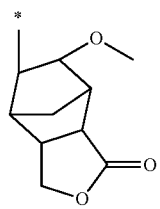
(r-lc-3-4)
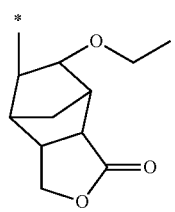
(r-lc-3-5)
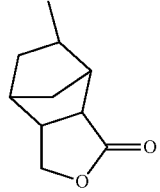
(Chemical formula 5)
(r-lc-4-1)
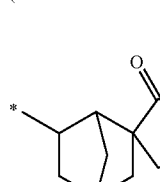
(r-lc-4-2)
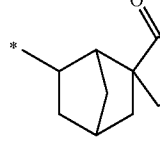
(r-lc-4-3)
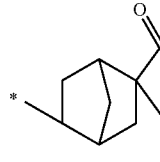
(r-lc-4-4)
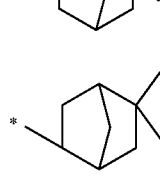

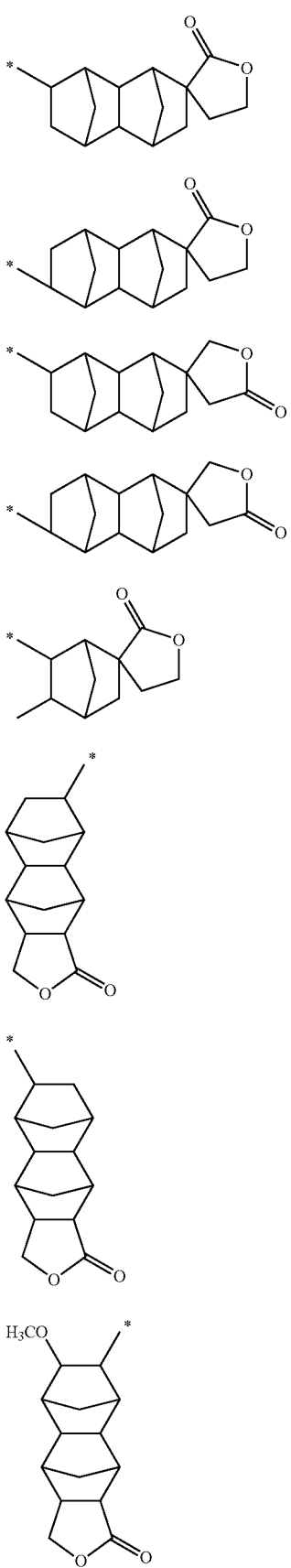

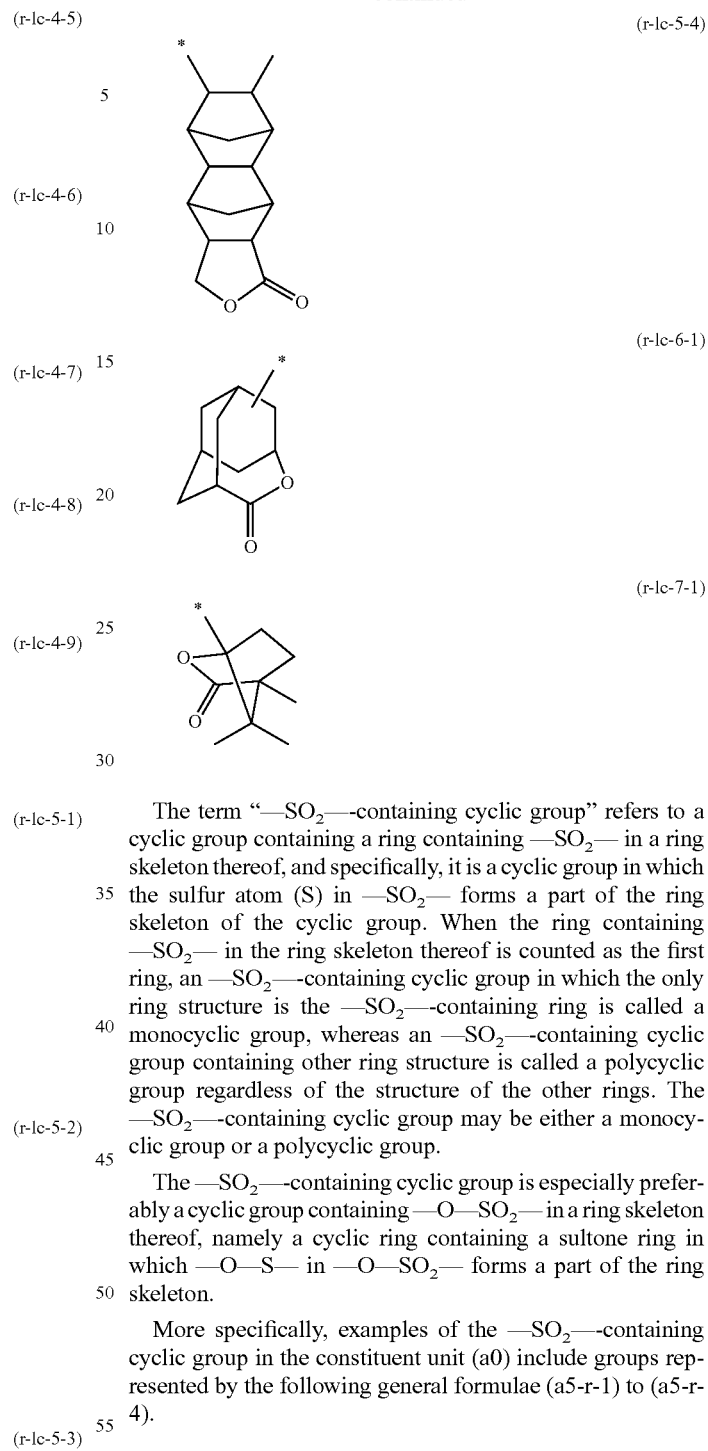

The term "—SO$_2$—-containing cyclic group" refers to a cyclic group containing a ring containing —SO$_2$— in a ring skeleton thereof, and specifically, it is a cyclic group in which the sulfur atom (S) in —SO$_2$— forms a part of the ring skeleton of the cyclic group. When the ring containing —SO$_2$— in the ring skeleton thereof is counted as the first ring, an —SO$_2$—-containing cyclic group in which the only ring structure is the —SO$_2$—-containing ring is called a monocyclic group, whereas an —SO$_2$—-containing cyclic group containing other ring structure is called a polycyclic group regardless of the structure of the other rings. The —SO$_2$—-containing cyclic group may be either a monocyclic group or a polycyclic group.

The —SO$_2$—-containing cyclic group is especially preferably a cyclic group containing —O—SO$_2$— in a ring skeleton thereof, namely a cyclic ring containing a sultone ring in which —O—S— in —O—SO$_2$— forms a part of the ring skeleton.

More specifically, examples of the —SO$_2$—-containing cyclic group in the constituent unit (a0) include groups represented by the following general formulae (a5-r-1) to (a5-r-4).

(Chemical formula 6)

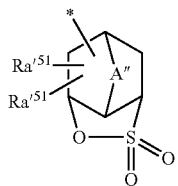

(a5-r-1)

(a5-r-2)

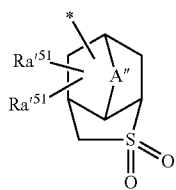

(a5-r-3)

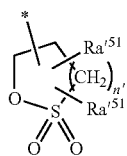

(a5-r-4)

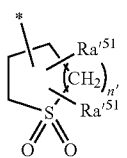

In the formulae, each Ra'$^{51}$ independently represents a hydrogen atom, an alkyl group, an alkoxy group, a halogen atom, a halogenated alkyl group, a hydroxyl group, —COOR'', —OC(=O)R'', a hydroxyalkyl group, or a cyano group; R'' represents a hydrogen atom or an alkyl group; A'' represents an alkylene group having 1 to 5 carbon atoms, which may contain an oxygen atom or a sulfur atom, an oxygen atom, or a sulfur atom; and n' is an integer of 0 to 2.

In the foregoing general formulae (a5-r-1) to (a5-r-4), A'' is the same as A'' in the foregoing general formulae (a2-r-2), (a2-r-3), and (a2-r-5).

The alkyl group, the alkoxy group, the halogen atom, the halogenated alkyl group, —COOR'', —OC(=O)R'', and the hydroxyalkyl group in Ra'$^{51}$ are the same as those in Ra'$^{21}$ in the foregoing general formulae (a2-r-1) to (a2-r-7).

Specific examples of each of the groups represented by the general formulae (a5-r-1) to (a5-r-4) are given below. In the following formulae, "Ac" represents an acetyl group.

(Chemical formula 7)

(r-sl-1-1)

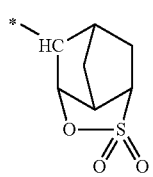

(r-sl-1-2)

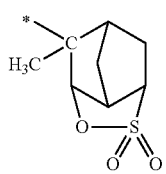

(r-sl-1-3)

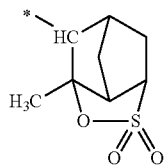

(r-sl-1-4)

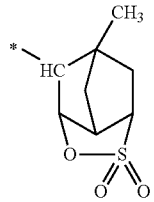

(r-sl-1-5)

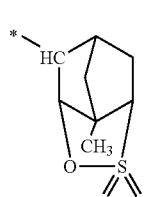

(r-sl-1-6)

(r-sl-1-7)

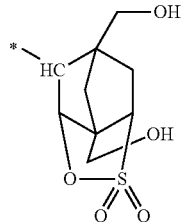

(r-sl-1-8)

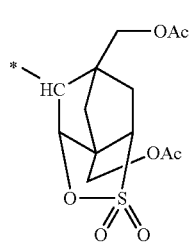

(r-sl-1-9)

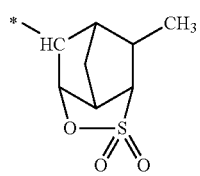

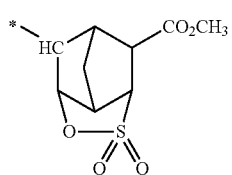 (r-sl-1-10)
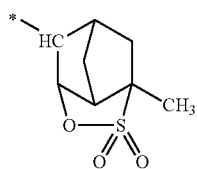 (r-sl-1-11)
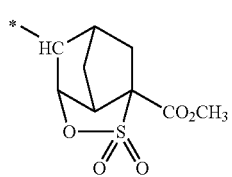 (r-sl-1-12)
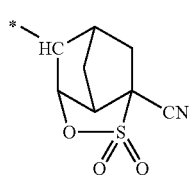 (r-sl-1-13)
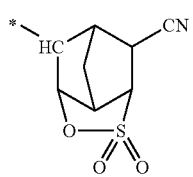 (r-sl-1-14)
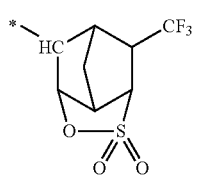 (r-sl-1-15)
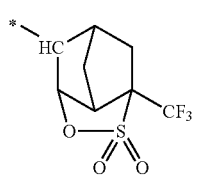 (r-sl-1-16)
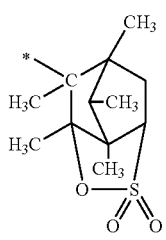 (r-sl-1-17)
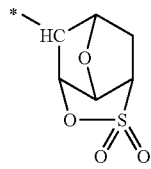 (r-sl-1-18)
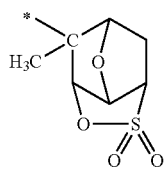 (r-sl-1-19)
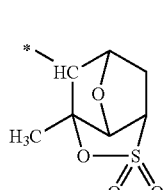 (r-sl-1-20)
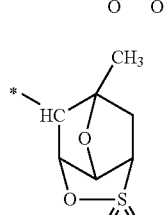 (r-sl-1-21)
(Chemical formula 8)
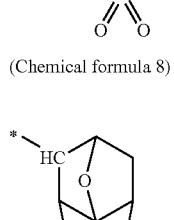 (r-sl-1-22)
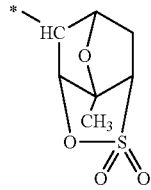 (r-sl-1-23)
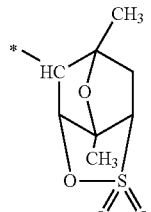 (r-sl-1-23)
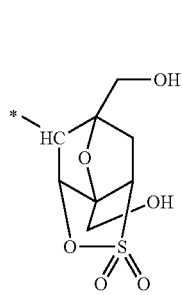 (r-sl-1-24)

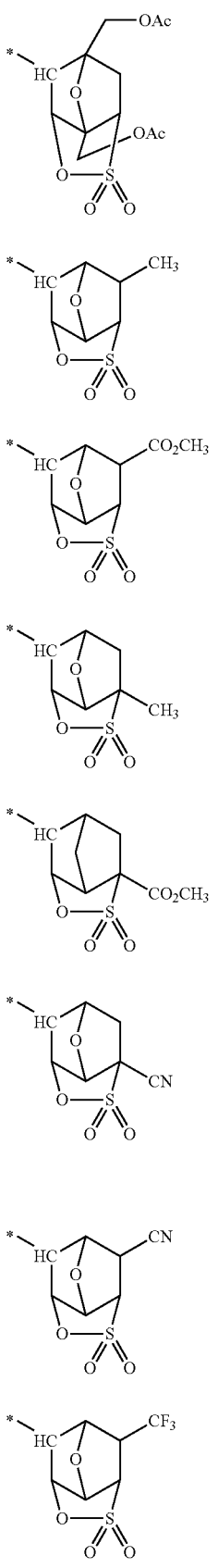

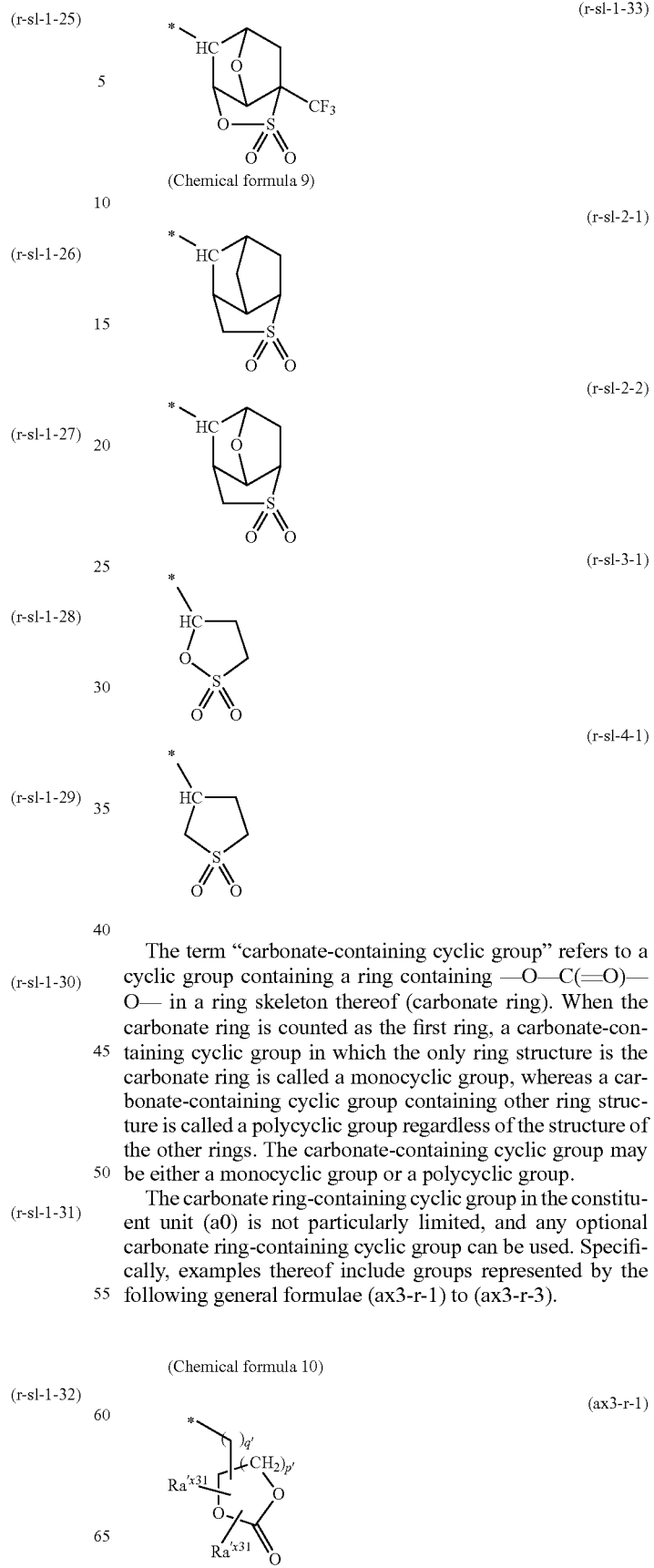

The term "carbonate-containing cyclic group" refers to a cyclic group containing a ring containing —O—C(=O)—O— in a ring skeleton thereof (carbonate ring). When the carbonate ring is counted as the first ring, a carbonate-containing cyclic group in which the only ring structure is the carbonate ring is called a monocyclic group, whereas a carbonate-containing cyclic group containing other ring structure is called a polycyclic group regardless of the structure of the other rings. The carbonate-containing cyclic group may be either a monocyclic group or a polycyclic group.

The carbonate ring-containing cyclic group in the constituent unit (a0) is not particularly limited, and any optional carbonate ring-containing cyclic group can be used. Specifically, examples thereof include groups represented by the following general formulae (ax3-r-1) to (ax3-r-3).

-continued

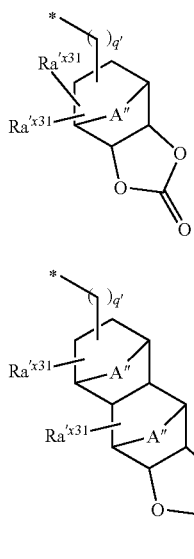

(ax3-r-2)

(ax3-r-3)

In the formulae, each $Ra'^{x31}$ independently represents a hydrogen atom, an alkyl group, an alkoxy group, a halogen atom, a halogenated alkyl group, a hydroxyl group, —COOR″, —OC(=O)R″, a hydroxyalkyl group, or a cyano group; R″ represents a hydrogen atom or an alkyl group; A″ represents an alkylene group having 1 to 5 carbon atoms, which may contain an oxygen atom or a sulfur atom, an oxygen atom, or a sulfur atom; and q' is 0 or 1.

A″ in the foregoing general formulae (ax3-r-1) to (ax3-r-3) is the same as A″ in the foregoing general formulae (a2-r-2), (a2-r-3), and (a2-r-5).

The alkyl group, the alkoxy group, the halogen atom, the halogenated alkyl group, —COOR″, —OC(=O)R″, and the hydroxyalkyl group in $Ra'^{x31}$, are the same as those in $Ra'^{21}$ in the foregoing general formulae (a2-r-1) to (a2-r-7), respectively.

Specific examples of each of the groups represented by the general formulae (ax3-r-1) to (ax3-r-3) are given below.

(Chemical formula 11)

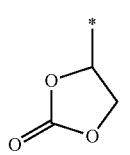

(r-cr-1-1)

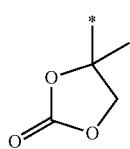

(r-cr-1-2)

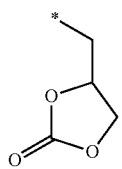

(r-cr-1-3)

-continued

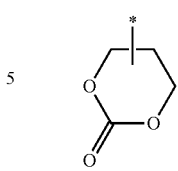

(r-cr-1-4)

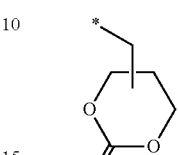

(r-cr-1-5)

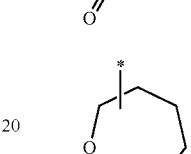

(r-cr-1-6)

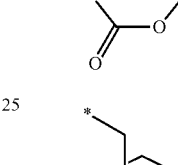

(r-cr-1-7)

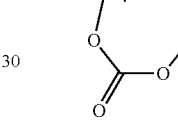

(r-cr-2-1)

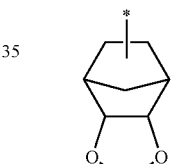

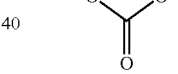

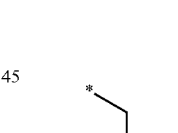

(r-cr-2-2)

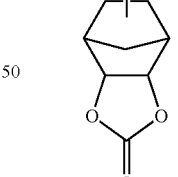

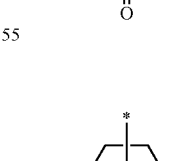

(r-cr-2-3)

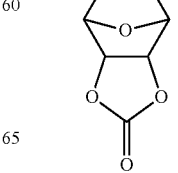

(r-cr-2-4)
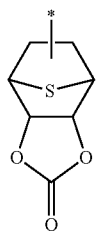
(r-cr-3-1)
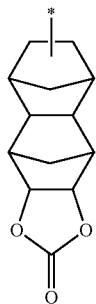
(r-cr-3-2)
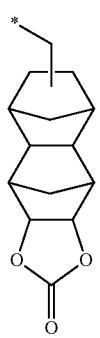
(r-cr-3-3)
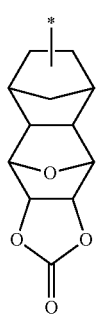
(r-cr-3-4)
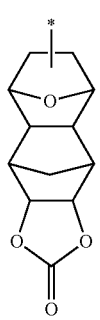
(r-cr-3-5)
Specific examples of the constituent unit represented by the foregoing formula (a0-1) are given below. In each of the following formulae, $R^\alpha$ represents a hydrogen atom, a methyl group, or a trifluoromethyl group.
(Chemical formula 12)
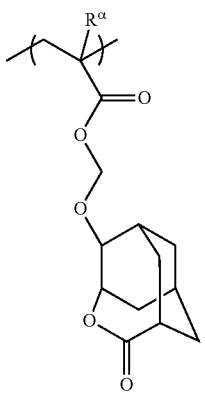 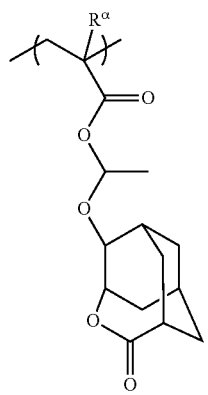
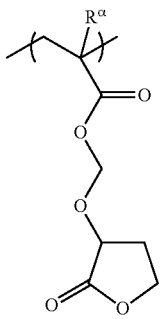 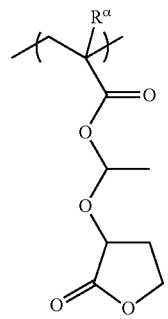
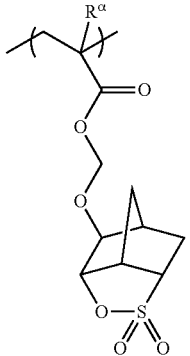 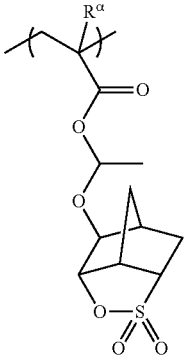

-continued

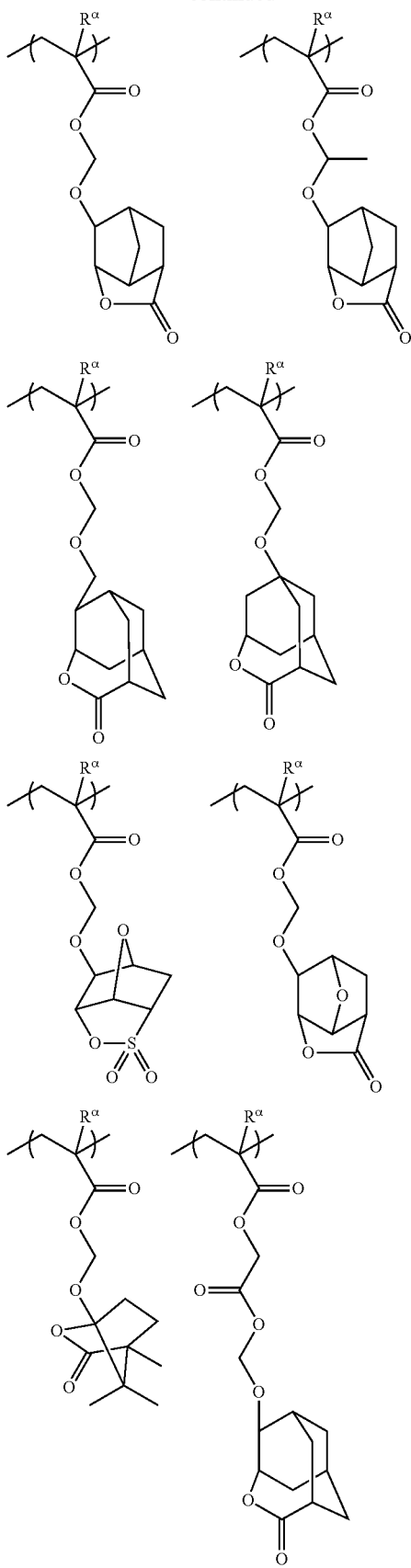

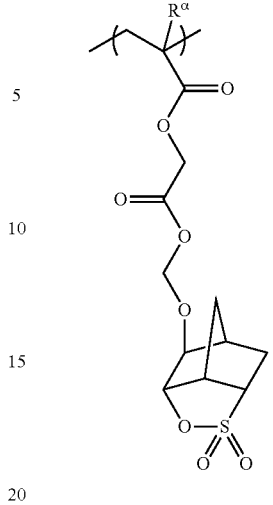

The constituent unit (a0) which the component (A1) has may be either one kind or two or more kinds.

A proportion of the constituent unit (a0) in the component (A1) is preferably 5 to 40 mol %, more preferably 10 to 30 mol %, and still more preferably 10 to 20 mol % relative to all of the constituent units constituting the component (A1).

When the proportion of the constituent unit (a0) in the component (A1) is the lower limit value or more, the residual film rate of exposed areas of the resist film more increases in the resist pattern formation to which the negative type development process is applied. On the other hand, when the proportion of the constituent unit (a0) in the component (A1) is not more than the upper limit value, the resolution increases, and the mask reproducibility is more enhanced.

(Constituent Unit (a1))

The constituent unit (a1) is a constituent unit containing an acid decomposable group whose polarity increases by the action of an acid and is a constituent unit other than the constituent unit (a0).

The term "acid decomposable group" is a group having acid decomposability, in which at least a part of the bond in the structure of the acid decomposable group may be cleaved by the action of an acid.

Examples of the acid decomposable group whose polarity increases by the action of an acid include a group which is decomposed by the action of an acid to form a polar group.

Examples of the polar group include a carboxy group, a hydroxyl group, an amino group, and a sulfo group (—$SO_3H$). Of these, a polar group containing —OH in a structure thereof (hereinafter sometimes referred to as "OH-containing polar group") is preferable, a carboxy group or a hydroxyl group is more preferable, and a carboxy group is especially preferable.

More specifically, examples of the acid decomposable group include a group in which the above-described polar group is protected by an acid dissociable group (for example, a group in which the hydrogen atom of the OH-containing polar group is protected by an acid dissociable group).

Here, the term. "acid dissociable group" refers to either one or both of the following groups.

(i) A group having such acid dissociation properties that the bond between the acid dissociable group and the atom adjacent to the acid dissociable group may be cleaved by the action of an acid.

(ii) A group in which after a part of the bond is cleaved by the action of an acid, a decarboxylation reaction is further caused, whereby the bond between the acid dissociable group and the atom adjacent to the acid dissociable group may be cleaved.

It is necessary that the acid dissociable group constituting the acid decomposable group is a group with lower polarity than a polar group formed upon dissociation of the acid dissociable group. According to this, on the occasion of dissociation of the acid dissociable group by the action of an acid, a polar group having higher polarity than the acid dissociable group is formed, whereby the polarity increases. As a result, the polarity of the whole of the component (A1) increases. When the polarity increases, the solubility in a developing solution relatively changes, and in the case where the developing solution is an organic developing solution, the solubility in the organic developing solution decreases.

The acid dissociable group is not particularly limited, and those which have been so far proposed as the acid dissociable group of a base resin for a chemically amplified resist can be used.

Among the above-described polar groups, examples of the acid dissociable group which protects a carboxy group or a hydroxyl group include an acid dissociable group represented by the following general formula (a1-r-1) (hereinafter sometimes referred to as "acetal type acid dissociable group").

(Chemical formula 13)

(a1-r-1)

In the formula, each of $Ra'^1$ and $Ra'^2$ represents a hydrogen atom or an alkyl group; $Ra'^3$ represents a hydrocarbon group; and $Ra'^3$ may be bonded to any one of $Ra'^3$ and $Ra'^2$ to form a ring.

In the foregoing formula (a1-r-1), it is preferable that at least one of $Ra'^1$ and $Ra'^2$ is a hydrogen atom, and it is more preferable that both of $Ra'^1$ and $Ra'^2$ are a hydrogen atom.

In the case where $Ra'^1$ or $Ra'^2$ is an alkyl group, examples of the alkyl group include the same alkyl groups as those exemplified as the substituent which may be bonded to the carbon atom at the α-position with respect to the above-described α-substituted acrylic ester, and an alkyl group having 1 to 5 carbon atoms is preferable. Specifically, there is preferably exemplified a linear or branched alkyl group. More specifically, examples thereof include a methyl group, an ethyl group, a propyl group, an isopropyl group, an n-butyl group, an isobutyl group, a tert-butyl group, a pentyl group, an isopentyl group, and a neopentyl group. Of these, a methyl group or an ethyl group is more preferable, and a methyl group is especially preferable.

In the formula (a1-r-1), examples of the hydrocarbon group represented by $Ra'^3$ include a linear or branched alkyl group and a cyclic hydrocarbon group.

The carbon number of the linear alkyl group is preferably 1 to 5, more preferably 1 to 4, and still more preferably 1 or 2. Specifically, examples thereof include a methyl group, an ethyl group, an n-propyl group, an n-butyl group, and an n-pentyl group. Of these, a methyl group, an ethyl group, or an n-butyl group is preferable, and a methyl group or an ethyl group is more preferable.

The carbon number of the branched alkyl group is preferably 3 to 10, and more preferably 3 to 5. Specifically, examples thereof include an isopropyl group, an isobutyl group, a tert-butyl group, an isopentyl group, a neopentyl group, a 1,1-diethylpropyl group, and a 2,2-dimethylbutyl group, with an isopropyl group being preferable.

In the case where $Ra'^3$ is a cyclic hydrocarbon group, the hydrocarbon group may be either aliphatic or aromatic, and it may be either a polycyclic group or a monocyclic group.

The monocyclic aliphatic hydrocarbon group is preferably a group in which one hydrogen atom is eliminated from a monocycloalkane. The monocycloalkane is preferably one having 3 to 6 carbon atoms, and specifically, examples thereof include cyclopentane and cyclohexane, with cyclopentane being especially preferable.

The polycyclic aliphatic hydrocarbon group is preferably a group in which one hydrogen atom is eliminated from a polycycloalkane. The polycycloalkane is preferably one having 7 to 12 carbon atoms, and specifically, examples thereof include adamantane, norbornane, isobornane, tricyclodecane, and tetracyclododecane.

In the case where the cyclic hydrocarbon group represented by $Ra'^3$ is an aromatic hydrocarbon group, specifically, examples of the aromatic ring to be contained include an aromatic hydrocarbon ring such as benzene, biphenyl, fluorene, naphthalene, anthracene, and phenanthrene; and an aromatic heterocyclic ring in which a part of the carbon atoms constituting the above-described aromatic hydrocarbon ring is substituted with a hetero atom. Examples of the hetero atom in the aromatic heterocyclic ring include an oxygen atom, a sulfur atom, and a nitrogen atom.

Specifically, examples of the aromatic hydrocarbon group include a group in which one hydrogen atom is eliminated from the above-described aromatic hydrocarbon ring (aryl group); and a group in which one hydrogen atom of the above-described aryl group is substituted with an alkylene group (an arylalkyl group, for example, a benzyl group, a phenethyl group, a 1-naphthylmethyl group, a 2-naphthylmethyl group, a 1-naphthylethyl group, or a 2-naphthylethyl group). The carbon number of the alkylene group (the alkyl chain in the arylalkyl group) is preferably 1 to 4, more preferably 1 to 2, and especially preferably 1.

In the case where $Ra'^3$ is bonded to any one of $Ra'^1$ and $Ra'^2$ to form a ring, the cyclic group is preferably a 4-membered to 7-membered ring, and more preferably a 4-membered to 6-membered ring. Specific examples of the cyclic group include a tetrahydropyranyl group and a tetrahydrofuranyl group.

Examples of the acid dissociable group that protects a carboxyl group among the polar groups include an acid dissociable group represented by the following general formula (a1-r-2). It is to be noted that among the acid dissociable groups represented by the following formula (a1-r-2), a group constituted of an alkyl group is hereinafter sometimes referred to as a "tertiary alkyl ester type acid dissociable group" for the sake of convenience.

(Chemical formula 14)

(a1-r-2)

In the formula, each of $Ra'^4$ to $Ra'^6$ represents a hydrocarbon group, and $Ra'^5$ and $Ra'^6$ may be bonded to each other to form a ring.

Examples of the hydrocarbon group represented by $Ra'^4$ to $Ra'^6$ include the same hydrocarbon groups as those exemplified above for $Ra'^3$.

$Ra'^4$ is preferably an alkyl group having 1 to 5 carbon atoms. In the case where $Ra'^5$ and $Ra'^6$ are bonded to each other to form a ring, a group represented by the following general formula (a1-r2-1) is exemplified. On the other hand, in the case where $Ra'^4$ to $Ra'^6$ are not bonded to each other and are each an independent hydrocarbon group, a group represented by the following general formula (a1-r2-2) is exemplified.

(Chemical formula 15)

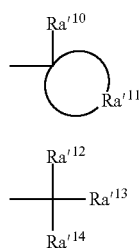

(a1-r2-1)

(a1-r2-2)

In the formulae, $Ra'^{10}$ represents an alkyl group having 1 to 10 carbon atoms; $Ra'^{11}$ represents a group for forming an aliphatic cyclic group together with the carbon atom to which $Ra'^{10}$ is bonded; and each of $Ra'^{12}$ to $Ra'^{14}$ independently represents a hydrocarbon group.

In the formula (a1-r2-1), the alkyl group having 1 to 10 carbon atoms represented by $Ra'^{10}$ is preferably the group exemplified as the linear or branched alkyl group represented by $Ra'^3$ in the formula (a1-r-1). In the foregoing formula (a1-r2-1), as the aliphatic cyclic group which $Ra'^{11}$ forms together with the carbon atom to which $Ra'^{10}$ is bonded, the groups exemplified for the cyclic aliphatic hydrocarbon group represented by $Ra'^3$ in the formula (a1-r-1) are preferable, and a group in which one hydrogen atom is eliminated from a monocycloalkane is more preferable. Of these, a group in which the carbon number of the monocycloalkane is 3 to 6 is still more preferable, a cyclopentyl group or a cyclohexyl group is especially preferable, and a cyclopentyl group is the most preferable.

In the formula (a1-r2-2), each of $Ra'^{12}$ and $Ra'^{14}$ is preferably independently an alkyl group having 1 to 10 carbon atoms. The alkyl group is more preferably the group exemplified as the linear or branched alkyl group represented by $Ra'^3$ in the formula (a1-r-1), still more preferably a linear alkyl group having 1 to 5 carbon atoms, and especially preferably a methyl group or an ethyl group.

In the formula (a1-r2-2), $Ra'^{13}$ is preferably the linear or branched alkyl group or cyclic hydrocarbon group exemplified as the hydrocarbon group represented by $Ra'^3$ in the formula (1-r-1). Of these, $Ra'^{13}$ is more preferably the group exemplified as the cyclic aliphatic hydrocarbon group represented by $Ra'^3$, still more preferably a group in which one hydrogen atom is eliminated from a polycycloalkane, and especially preferably an adamantyl group.

Specific examples of the foregoing formula (1-r2-1) are given below. It is to be noted that in the present specification, * in the formulae represents a bond.

(Chemical formula 16)

(r-pr-m1)

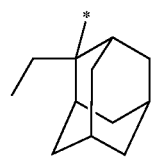
(r-pr-m2)

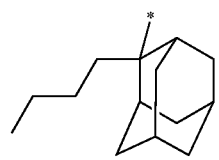
(r-pr-m3)

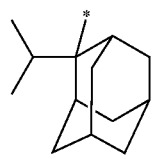
(r-pr-m4)

(r-pr-m5)

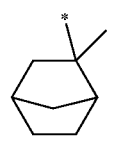
(r-pr-m6)

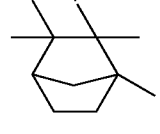
(r-pr-m7)

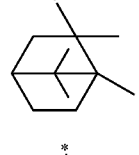
(r-pr-m8)

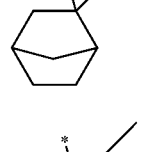
(r-pr-m9)

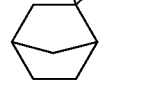
(r-pr-m10)

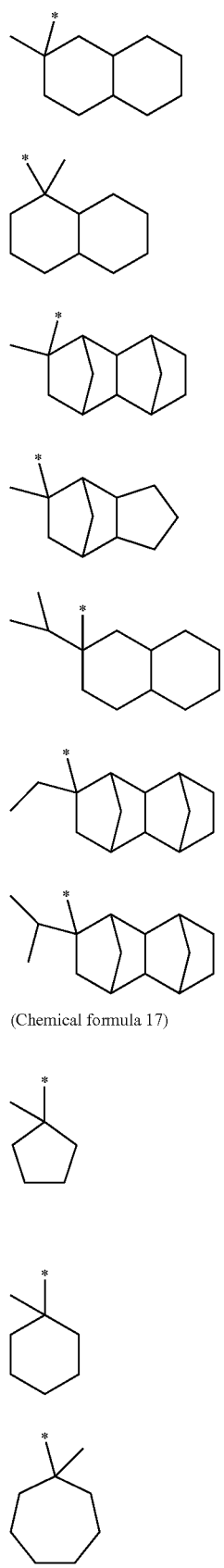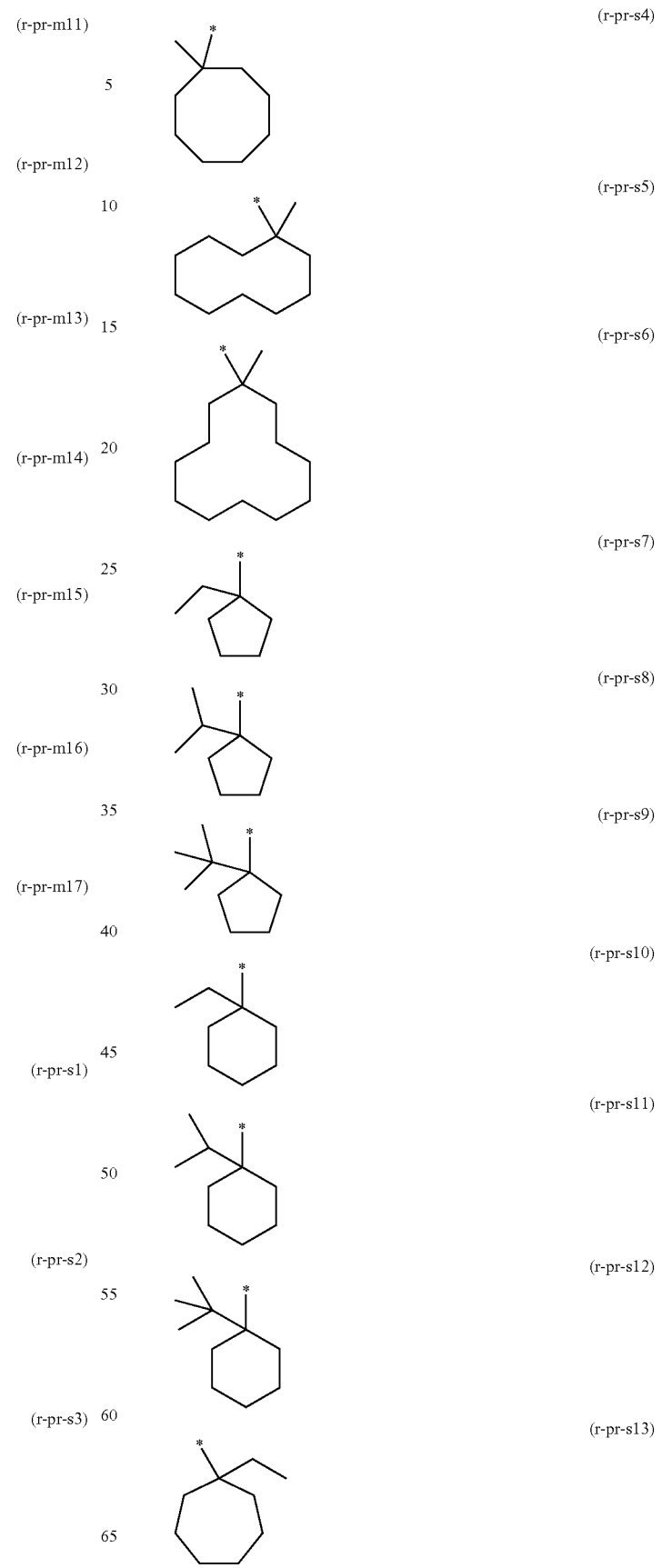

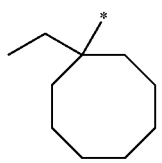 (r-pr-s14)
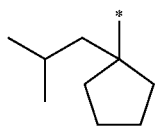 (r-pr-s15)
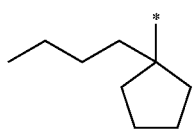 (r-pr-s16)
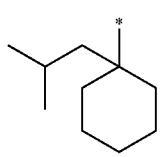 (r-pr-s17)
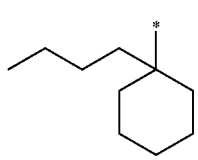 (r-pr-s18)
Specific examples of each of the groups represented by the foregoing formula (a1-r2-2) are given below.
(Chemical formula 18)
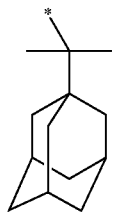 (r-pr-cm1)
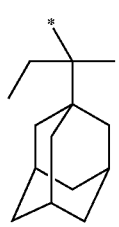 (r-pr-cm2)
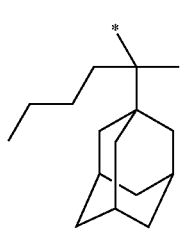 (r-pr-cm3)
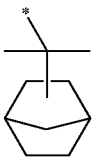 (r-pr-cm4)
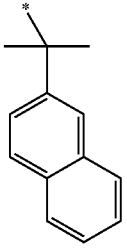 (r-pr-cm5)
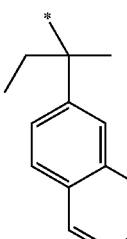 (r-pr-cm6)
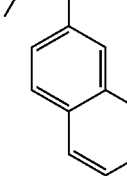 (r-pr-cm7)
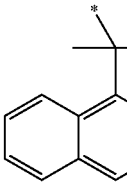 (r-pr-cm8)
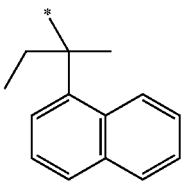 (r-pr-cs1)
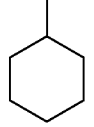 (r-pr-cs2)
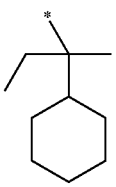 (r-pr-cs3)
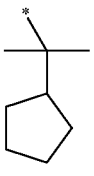

-continued

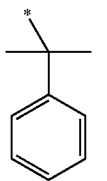 (r-pr-cs4)

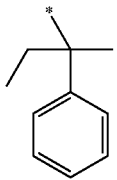 (r-pr-cs5)

 (r-pr-c1)

 (r-pr-c2)

 (r-pr-c3)

Of the above-described polar groups, examples of the acid dissociable group which protects a hydroxyl group include an acid dissociable group represented by the following general formula (1-r-3) (hereinafter sometimes referred to as "tertiary alkyloxycarbonyl acid dissociable group" for the sake of convenience).

(Chemical formula 19)

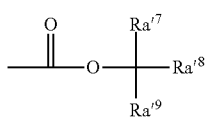 (a1-r-3)

In the formula, each of $Ra'^7$ to $Ra'^9$ represents an alkyl group.

In the formula (a1-r-3), each of $Ra'^7$ to $Ra'^9$ is preferably an alkyl group having 1 to 5 carbon atoms, and more preferably an alkyl group having 1 to 3 carbon atoms.

In addition, the carbon number of a total sum of the respective alkyl groups is preferably 3 to 7, more preferably 3 to 5, and most preferably 3 to 4.

Examples of the constituent unit (a1) include a constituent unit derived from an acrylic ester in which the hydrogen atom bonded to the carbon atom at the α-position may be substituted with a substituent, the constituent unit containing an acid decomposable group whose polarity increases by the action of an acid; a constituent unit derived from acrylamide, the constituent unit containing an acid decomposable group whose polarity increases by the action of an acid; a constituent unit in which at least a part of the hydrogen atom of the hydroxyl group of a constituent unit derived from hydroxystyrene or a hydroxystyrene derivative is protected by a substituent containing the above-described acid decomposable group; and a constituent unit in which at least a part of the hydrogen atom in —C(=O)—OH of the constituent unit derived from vinylbenzoic acid or a vinylbenzoic acid derivative is protected by a substituent containing the above-described acid decomposable group.

Of the foregoing, the constituent unit (a1) is preferably a constituent unit derived from an acrylic ester in which the hydrogen atom bonded to the carbon atom at the α-position may be substituted with a substituent.

Preferred specific examples of the constituent unit (a1) include a constituent unit represented by the following general formula (a1-1) or (a1-2).

(Chemical formula 20)

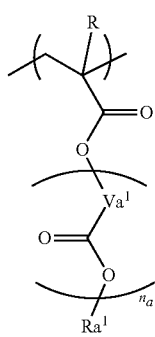 (a1-1)

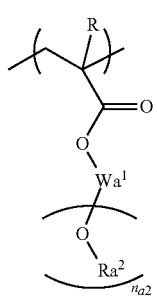 (a1-2)

In the formulae, R represents a hydrogen atom, an alkyl group having 1 to 5 carbon atoms, or a halogenated alkyl group having 1 to 5 carbon atoms; $Va^1$ represents a divalent hydrocarbon group which may have an ether bond; $n_{a1}$ is 0 to 2; $Ra^1$ represents the acid dissociable group represented by the foregoing formula (a1-r-1) or (a1-r-2); $Wa^1$ represents an $(n_{a2}+1)$-valent hydrocarbon group; $n_{a2}$ is 1 to 3; and $Ra^2$ represents the acid dissociable group represented by the foregoing formula (a1-r-1) or (a1-r-3).

In the foregoing formula (a1-1), R is the same as R in the foregoing formula (a0-1) as described above.

Examples of $Va^1$ include those exemplified above as the divalent hydrocarbon group which may have an ether bond for $V^1$ in the foregoing formula (a0-1).

In the foregoing formula (a1-2), the $(n_{a2}+1)$-valent hydrocarbon group in $Wa^1$ may be either an aliphatic hydrocarbon group or an aromatic hydrocarbon group. The aliphatic hydrocarbon group means a hydrocarbon group having no aromaticity. The aliphatic hydrocarbon group may be either saturated or unsaturated, and in general, it is preferably saturated. Examples of the aliphatic hydrocarbon group include a linear or branched aliphatic hydrocarbon group, an aliphatic hydrocarbon group containing a ring in a structure thereof, and a group in which a linear or branched aliphatic hydrocarbon group and an aliphatic hydrocarbon group containing a ring in a structure thereof are combined.

The valence of $(n_{a2}+1)$ is preferably divalent to tetravalent, and more preferably divalent or trivalent.

Specific examples of the constituent unit represented by the foregoing formula (a1-1) are given below. In each of the following formulae, $R^\alpha$ represents a hydrogen atom, a methyl group, or a trifluoromethyl group.

(Chemical formula 21)

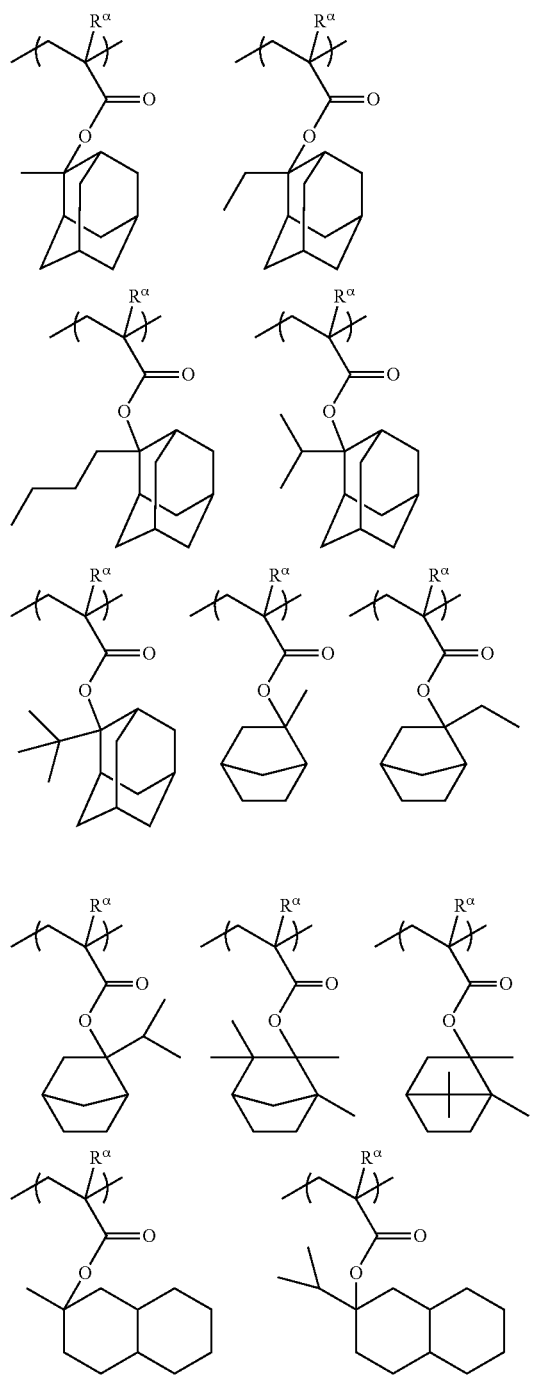

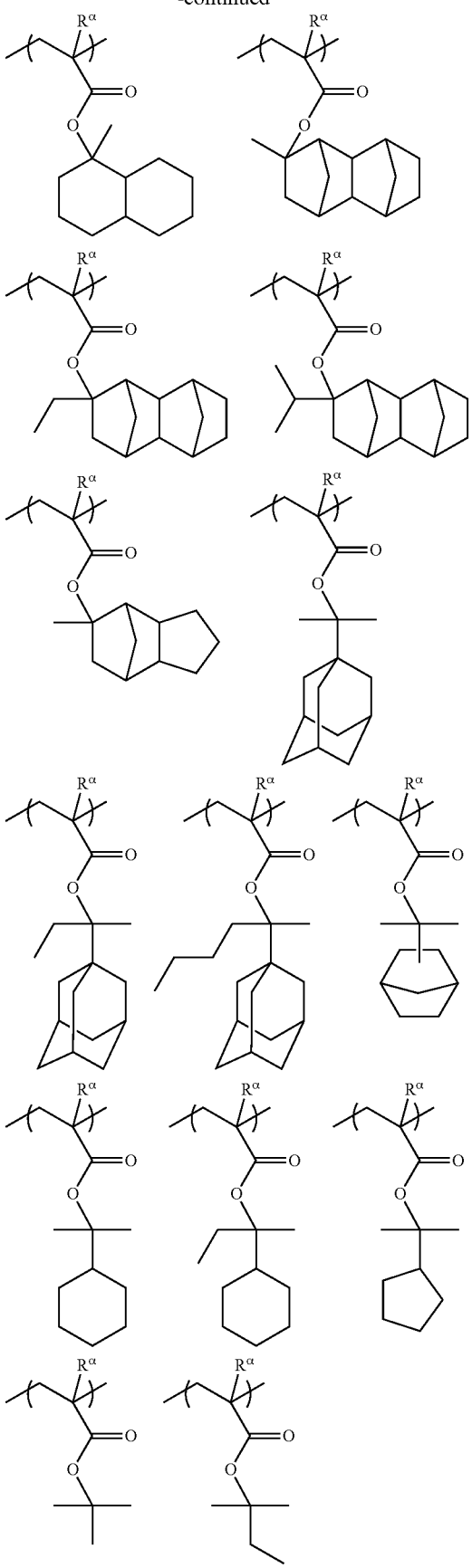

(Chemical formula 22)
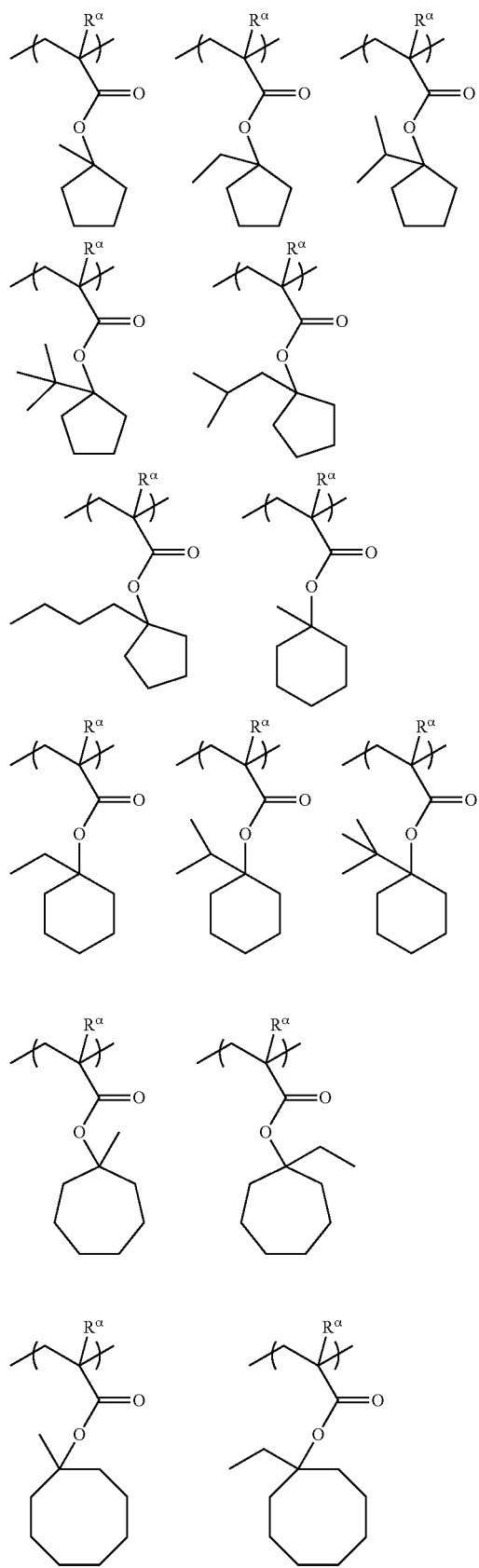
(Chemical formula 23)
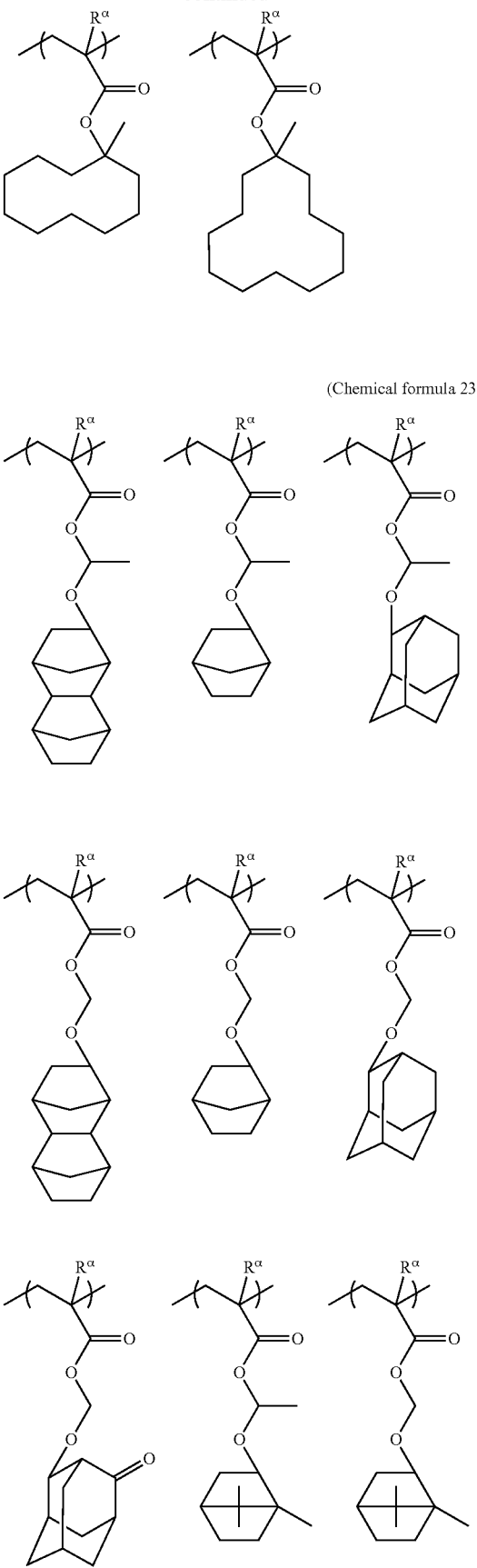

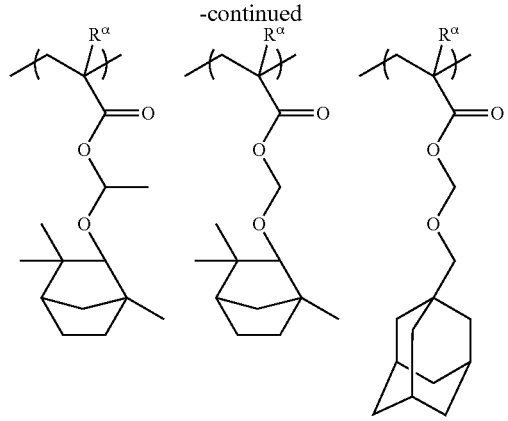
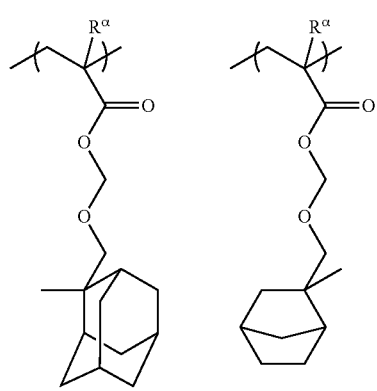
(Chemical formula 24)
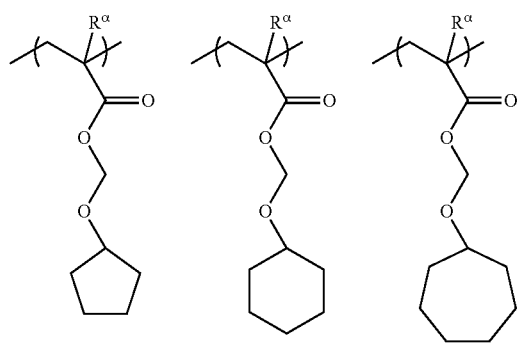
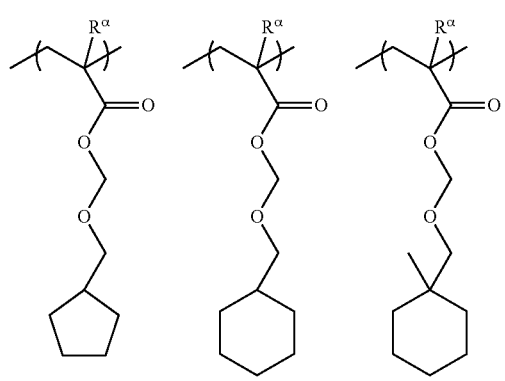
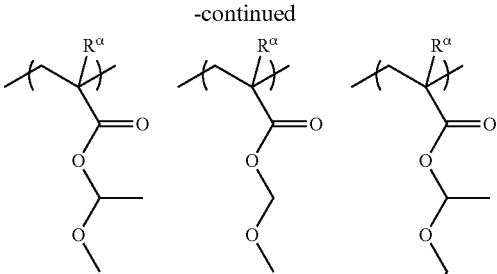
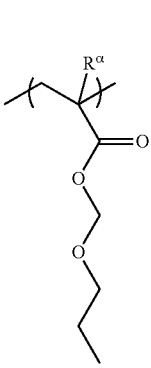
(Chemical formula 25)
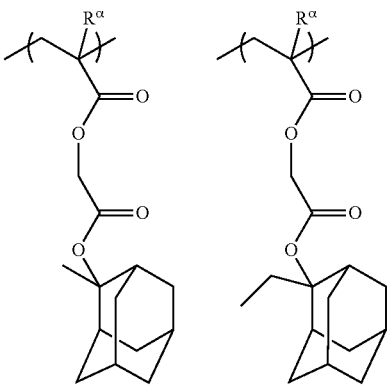
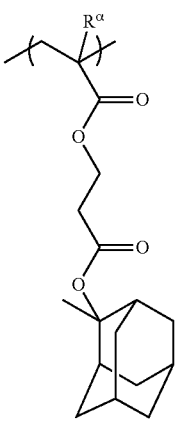

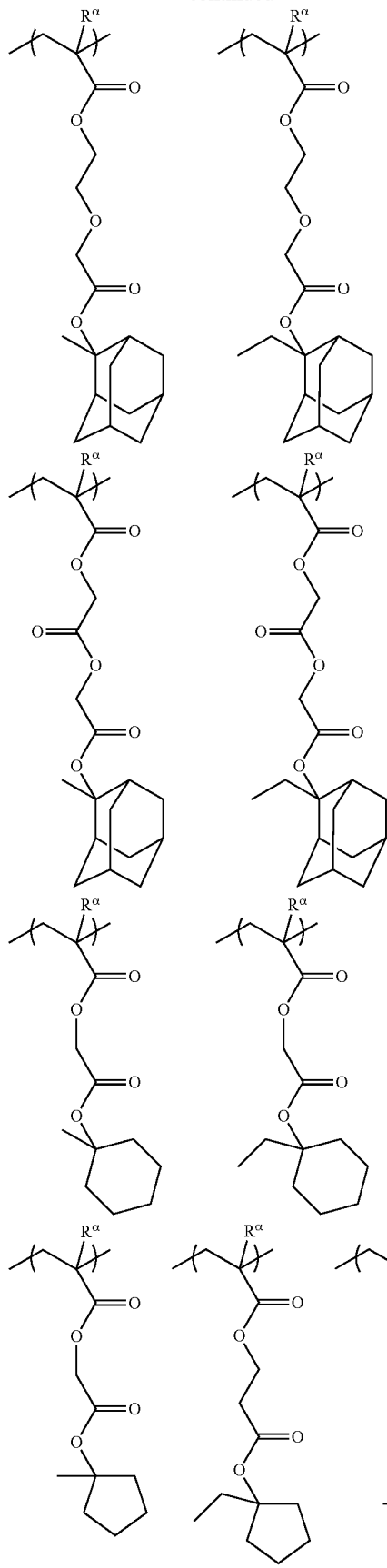
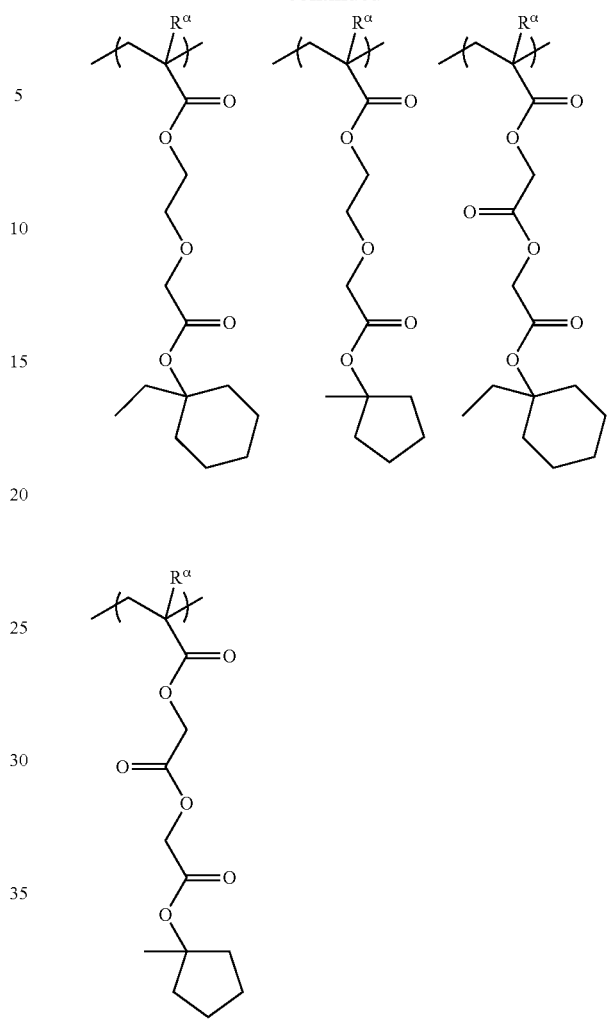
Specific examples of the constituent unit represented by the foregoing formula (a1-2) are given below.
(Chemical formula 26)
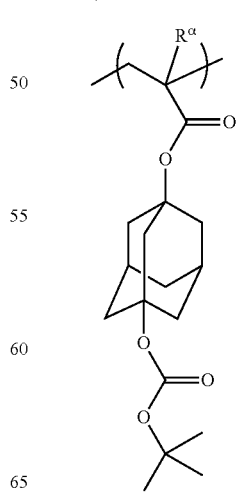

55
-continued
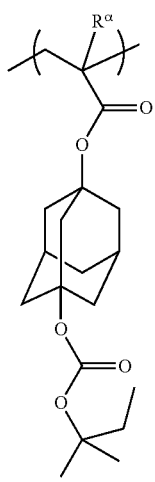
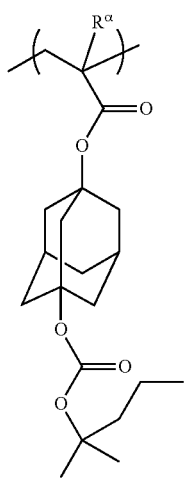
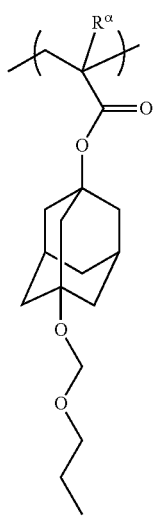
56
-continued
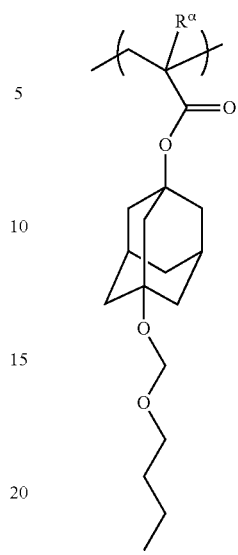
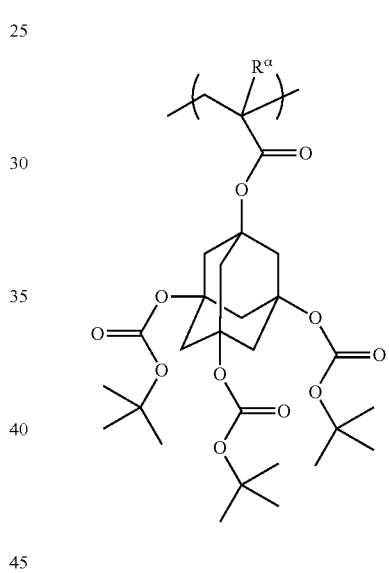
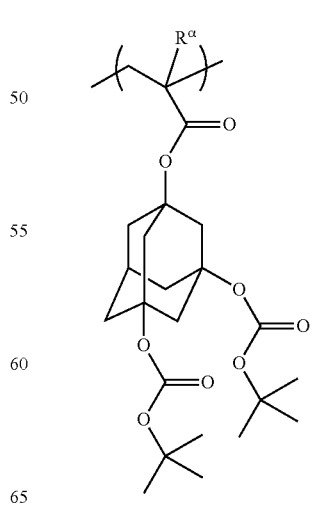

-continued

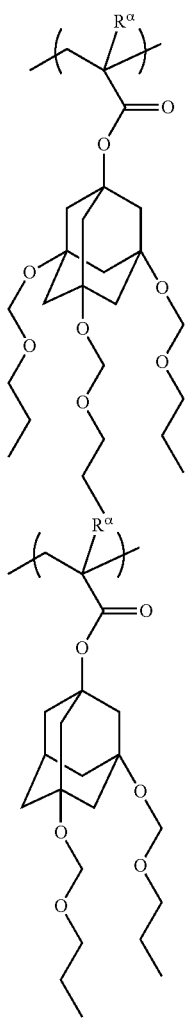

The constituent unit (a1) which the component (A1) has may be either one kind or two or more kinds.

In the case where the component (A1) has two or more kinds of the constituent unit (a1), it is preferable that the constituent unit (a1) contains two or more kinds of constituent units selected from the group consisting of constituent units represented by the foregoing general formula (a1-1), and it is more preferable that the two or more kinds of constituent units are those in which $Ra^1$ in the foregoing general formula (a1-1) is different from each other. The combination of $Ra^1$'s is preferably a combination of acid dissociable groups represented by the foregoing formula (a1-r-2), and more preferably a combination of the group represented by the foregoing formula (a1-r-2-1) with the group represented by the foregoing formula (a1-r2-2).

In the case where the component (A1) has the constituent unit (a1), a proportion of the constituent unit (a1) in the component (A1) is preferably 10 to 80 mol %, more preferably 15 to 75 mol %, and still more preferably 20 to 70 mol % relative to all of the constituent units constituting the component (A1).

When the proportion of the constituent unit (a1) in the component (A1) is the lower limit value or more, a resist pattern can be easily obtained, and lithography properties such as sensitivity, resolution, and LWR are also enhanced. In addition, when the proportion of the constituent unit (a1) in the component (A1) is not more than the upper limit value, a balance with other constituent units is easily taken.

(Constituent Unit (a2))

The constituent unit (a2) is a constituent unit containing a lactone-containing cyclic group, an —$SO_2$—-containing cyclic group, or a carbonate-containing cyclic group and is a constituent unit other than the constituent unit (a0).

It is to be noted that in the case where the constituent unit (a1) is a constituent unit containing a lactone-containing cyclic group, an —$SO_2$—-containing cyclic group, or a carbonate-containing cyclic group in a structure thereof, though this constituent unit also falls under the definition of the constituent unit (a2), it should be construed that such a constituent unit falls under the definition of the constituent unit (a1) but does not fall within the definition of the constituent unit (a2).

In the case of using the component (A1) for the formation of a resist film, the lactone-containing cyclic group, the —$SO_2$—-containing cyclic group, or the carbonate-containing cyclic group of the constituent unit (a2) is effective for increasing the adhesion of the resist film to a substrate.

The lactone-containing cyclic group, the —$SO_2$—-containing cyclic group, or the carbonate-containing cyclic group in the constituent unit (a2) is the same as the lactone-containing cyclic group, the —$SO_2$—-containing cyclic group, or the carbonate-containing cyclic group in the above-described constituent unit (a0), respectively.

Above all, the constituent unit (a2) is preferably a constituent unit derived from an acrylic ester in which the hydrogen atom bonded to the carbon atom at the α-position may be substituted with a substituent.

The constituent unit (a2) is preferably a constituent unit represented by the following general formula (a2-1).

(Chemical formula 27)

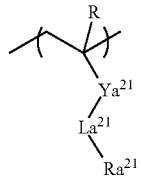

(a2-1)

In the formula, R represents a hydrogen atom, an alkyl group having 1 to 5 carbon atoms, or a halogenated alkyl group having 1 to 5 carbon atoms; $Ya^{21}$ represents a single bond or a divalent linking group; $La^{21}$ represents —O—, —COO—, —CON(R')—, —OCO—, —CONHCO—, or —CONHCS—; R' represents a hydrogen atom or a methyl group, provided that in the case where $La^{21}$ is —O—, then $Ya^{21}$ is not —CO—; and $Ra^{21}$ represents a lactone-containing cyclic group, a carbonate-containing cyclic group, or an —$SO_2$—-containing cyclic group.

In the foregoing formula (a2-1), R is the same as R in the foregoing formula (a0-1) as described above.

$Ya^{21}$ represents a single bond or a divalent linking group.

Though the divalent linking group represented by $Ya^{21}$ is not particularly limited, suitable examples thereof include an optionally substituted divalent hydrocarbon group; and a divalent linking group containing a hetero atom.

Optionally substituted divalent hydrocarbon group:

The divalent hydrocarbon group in $Ya^{21}$ may be either an aliphatic hydrocarbon group or an aromatic hydrocarbon group.

The aliphatic hydrocarbon group as the divalent hydrocarbon group in $Ya^{21}$ means a hydrocarbon group having no aromaticity. The aliphatic hydrocarbon group may be either saturated or unsaturated, and in general, it is preferably saturated.

Examples of the aliphatic hydrocarbon group include a linear or branched aliphatic hydrocarbon group and an aliphatic hydrocarbon group containing a ring in a structure thereof.

The linear or branched aliphatic hydrocarbon group is preferably one having 1 to 10 carbon atoms, more preferably one having 1 to 6 carbon atoms, still more preferably one having 1 to 4 carbon atoms, and most preferably one having 1 to 3 carbon atoms.

The linear aliphatic hydrocarbon group is preferably a linear alkylene group. Specifically, examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group is preferably a branched alkylene group. Specifically, examples thereof include an alkylalkylene group such as an alkylmethylene group, for example, —$CH(CH_3)$—, —$CH(CH_2CH_3)$—, —$C(CH_3)_2$—, —$C(CH_3)(CH_2CH_3)$—, and —$C(CH_2CH_3)_2$—; an alkylethylene group, for example, —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; an alkyltrimethylene group, for example, —$CH(CH_3)CH_2CH_2$— and —$CH_2CH(CH_3)CH_2$—; and an alkyltetramethylene group, for example, —$CH(CH_3)CH_2CH_2CH_2$— and —$CH_2CH(CH_3)CH_2CH_2$—. The alkyl group in the alkylalkylene group is preferably a linear alkyl group having 1 to 5 carbon atoms.

The linear or branched aliphatic hydrocarbon group may or may not have a substituent. Examples of the substituent include a fluorine atom, a fluorinated alkyl group having 1 to 5 carbon atoms, which is substituted with a fluorine atom, and a carbonyl group.

Examples of the aliphatic hydrocarbon group containing a ring in a structure thereof include an optionally substituted cyclic aliphatic hydrocarbon group containing a hetero atom in a ring structure thereof (a group in which two hydrogen atoms are eliminated from an aliphatic hydrocarbon ring); a group in which the above-described cyclic aliphatic hydrocarbon group is bonded to an end of a linear or branched aliphatic hydrocarbon group; and a group in which the above-described cyclic aliphatic hydrocarbon group intervenes on the way of a linear or branched aliphatic hydrocarbon group. Examples of the linear or branched aliphatic hydrocarbon group include the same groups as those described above.

The cyclic aliphatic hydrocarbon group has preferably 3 to 20 carbon atoms, and more preferably 3 to 12 carbon atoms.

The cyclic aliphatic hydrocarbon group may be either a polycyclic group or a monocyclic group. The monocyclic alicyclic hydrocarbon group is preferably a group in which two hydrogen atoms are eliminated from a monocycloalkane. The monocycloalkane is preferably one having 3 to 6 carbon atoms. Specifically, examples thereof include cyclopentane and cyclohexane. The polycyclic alicyclic hydrocarbon group is preferably a group in which two hydrogen atoms are eliminated from a polycycloalkane. The polycycloalkane is preferably one having 7 to 12 carbon atoms. Specifically, examples thereof include adamantane, norbornane, isobornane, tricyclodecane, and tetracyclododecane.

The cyclic aliphatic hydrocarbon group may or may not have a substituent. Examples of the substituent include an alkyl group, an alkoxy group, a halogen atom, a halogenated alkyl group, a hydroxyl group, and a carbonyl group.

The alkyl group as the substituent is preferably an alkyl group having 1 to 5 carbon atoms, and especially preferably a methyl group, an ethyl group, a propyl group, an n-butyl group, or a tert-butyl group.

The alkoxy group as the substituent is preferably an alkoxy group having 1 to 5 carbon atoms, more preferably a methoxy group, an ethoxy group, an n-propoxy group, an isopropoxy group, an n-butoxy group, or a tert-butoxy group, and most preferably a methoxy group or an ethoxy group.

Examples of the halogen atom as the substituent include a fluorine atom, a chlorine atom, a bromine atom, and an iodine atom, with a fluorine atom being preferable.

Examples of the halogenated alkyl group as the substituent include a group in which a part or all of the hydrogen atoms of the above-described alkyl group are substituted with the above-described halogen atom.

In the cyclic aliphatic hydrocarbon group, a part of the carbon atoms constituting the ring structure thereof may be substituted with a substituent containing a hetero atom. The substituent containing a hetero atom is preferably —O—, —C(=O)—O—, —S—, —S(=O)$_2$—, or —S(=O)$_2$—O—.

The aromatic hydrocarbon group as the divalent hydrocarbon group in $Ya^{21}$ is a hydrocarbon group having at least one aromatic ring.

This aromatic ring is not particularly limited so long as it is a cyclic conjugated system having (4n+2) π electrons, and it may be either monocyclic or polycyclic. The carbon number of the aromatic ring is preferably 5 to 30, more preferably 5 to 20, still more preferably 6 to 15, and especially preferably 6 to 12. However, the subject carbon number does not include the carbon number in the substituent. Specifically, examples of the aromatic ring include an aromatic hydrocarbon ring such as benzene, naphthalene, anthracene, and phenanthrene; and an aromatic heterocyclic ring in which a part of the carbon atoms constituting the above-described aromatic hydrocarbon ring is substituted with a hetero atom. Examples of the hetero atom in the aromatic heterocyclic ring include an oxygen atom, a sulfur atom, and a nitrogen atom. Specifically, examples of the aromatic heterocyclic ring include a pyridine ring and a thiophene ring.

Specifically, examples of the aromatic hydrocarbon group include a group in which two hydrogen atoms are eliminated from the above-described aromatic hydrocarbon ring or aromatic heterocyclic ring (an arylene group or a heteroarylene group); a group in which two hydrogen atoms are eliminated from an aromatic compound containing two or more aromatic rings (for example, biphenyl or fluorene); and a group in which one of hydrogen atoms of a group in which one hydrogen atom is eliminated from the above-described aromatic hydrocarbon ring or aromatic heterocyclic ring (an aryl group or a heteroaryl group) is substituted with an alkylene group (for example, a group in which one hydrogen atom is further eliminated from an aryl group in an arylalkyl group such as a benzyl group, a phenethyl group, a 1-naphthylmethyl group, a 2-naphthylmethyl group, a 1-naphthylethyl group, and a 2-naphthylethyl group). The carbon number of the alkylene group bonded to the above-described aryl group or heteroaryl group is preferably 1 to 4, more preferably 1 to 2, and especially preferably 1.

In the above-described aromatic hydrocarbon group, the hydrogen atom(s) which the aromatic hydrocarbon group has may be substituted with a substituent. For example, the hydrogen atom(s) bonded to the aromatic ring in the aromatic hydrocarbon group may be substituted with a substituent.

Examples of the substituent include an alkyl group, an alkoxy group, a halogen atom, a halogenated alkyl group, and a hydroxyl group.

The alkyl group as the substituent is preferably an alkyl group having 1 to 5 carbon atoms. The alkyl group is most preferably a methyl group, an ethyl group, a propyl group, an n-butyl group, or a tert-butyl group.

Examples of the alkoxy group, the halogen atom, and the halogenated alkyl group as the substituent include those exemplified above for the substituent with which the hydrogen atom(s) which the cyclic aliphatic hydrocarbon group has is substituted.

Hetero atom-containing divalent linking group:

In the case where $Ya^{21}$ is a hetero atom-containing divalent linking group, preferred examples of the linking group include —O—, —C(=O)—O—, —C(=O)—, —O—C(=O)—O—, —C(=O)—NH—, —C(=O)—NH—C(=O)—, —NH—, —NH—C(=NH)— (H may be substituted with a substituent such as an alkyl group and an acyl group), —S—, —S(=O)$_2$—, —S(=O)$_2$—O—, and a group represented by the general formula: —$Y^{21}$—O—$Y^{22}$—, —$Y^{21}$—O—, —$Y^{21}$—C(=O)—O—, —[$Y^{21}$—C(=O)—O]$_{m''}$—$Y^{22}$—, —$Y^{21}$—O—C(=O)—$Y^{22}$—, or —$Y^{21}$—S(=O)$_2$—O—$Y^{22}$— [in the formulae, each of $Y^{21}$ and $Y^{22}$ independently represents an optionally substituted divalent hydrocarbon group; O represents an oxygen atom; and m" is an integer of 0 to 3].

In the case where the hetero atom-containing divalent linking group is —C(=O)—NH—, —C(=O)—NH—C(=O)—, —NH—, or —NH—C(=NH)—, the H may be substituted with a substituent such as an alkyl group and an acyl group. The carbon number of the substituent (such as an alkyl group and an acyl group) is preferably 1 to 10, more preferably 1 to 8, and especially preferably 1 to 5.

In the general formula: —$Y^{21}$—O—$Y^{22}$—, —$Y^{21}$—O—, —$Y^{21}$—C(=O)—O—, —[$Y^{21}$—C(=O)—O]$_{m''}$—$Y^{22}$—, —$Y^{21}$—O—C(=O)—$Y^{22}$—, or —$Y^{21}$—S(=O)$_2$—O—$Y^{22}$—, each of $Y^{21}$ and $Y^{22}$ independently represents an optionally substituted divalent hydrocarbon group. Examples of the divalent hydrocarbon group include the same divalent hydrocarbon groups as those exemplified above for the divalent linking group (optionally substituted divalent hydrocarbon group).

$Y^{21}$ is preferably a linear aliphatic hydrocarbon group, more preferably a linear alkylene group, still more preferably a linear alkylene group having 1 to 5 carbon atoms, and especially preferably a methylene group or an ethylene group.

$Y^{22}$ is preferably a linear or branched aliphatic hydrocarbon group, and more preferably a methylene group, an ethylene group, or an alkylmethylene group. The alkyl group in the alkylmethylene group is preferably a linear alkyl group having 1 to 5 carbon atoms, more preferably a linear alkyl group having 1 to 3 carbon atoms, and most preferably a methyl group.

In the group represented by the formula: —[$Y^{21}$—C(=O)—O]$_{m''}$—$Y^{22}$—, m" is an integer of 0 to 3, preferably an integer of 0 to 2, more preferably 0 or 1, and especially preferably 1. Namely, the group represented by the formula: —[$Y^{21}$—C(=O)—O]$_{m''}$—$Y^{22}$— is especially preferably a group represented by the formula: —$Y^{20}$—C(=O)—O—$Y^{22}$—. Above all, a group represented by the formula: —(CH$_2$)$_{a'}$—C(=O)—O—(CH$_2$)$_{b'}$— is preferable. In the foregoing formula, a' is an integer of 1 to 10, preferably an integer of 1 to 8, more preferably 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

$Ya^{21}$ is preferably a single bond, an ester bond [—C(=O)—O—], an ether bond (—O—), a linear or branched alkylene group, or a combination thereof.

In the foregoing formula (a2-1), $Ra^{21}$ is the same as the lactone-containing cyclic group, the carbonate-containing cyclic group, or the —SO$_2$—-containing cyclic group in $R^1$ in the foregoing formula (a0-1) as described above.

Suitable examples of the lactone-containing cyclic group, the carbonate-containing cyclic group, and the —SO$_2$—-containing cyclic group in $Ra^{21}$ include the groups represented by the general formulae (a2-r-1) to (a2-r-7), the groups represented by the general formulae (a5-r-1) to (a5-r-4), and the groups represented by the general formulae (ax3-r-1) to (ax3-r-3), respectively.

Above all, the lactone-containing cyclic group or the —SO$_2$—-containing cyclic group is preferable, and the groups represented by each of the foregoing general formulae (a2-r-1), (a2-r-2), and (a5-r-1) are more preferable. Specifically, any one of the groups represented by the foregoing chemical formulae (r-1c-1-1) to (r-1c-1-7), (r-1c-2-1) to (r-1c-2-13), (r-s1-1-1), and (r-s1-1-18) is more preferable.

The constituent unit (a2) which the component (A1) has may be either one kind or two or more kinds.

In the case where the component (A1) has two or more kinds of the constituent unit (a2), it is preferable that the constituent unit (a2) contains two or more kinds of constituent units selected from the group consisting of constituent units represented by the foregoing general formula (a2-1), and it is more preferable that the two or more kinds of constituent units are those in which $Ra^{21}$ in the foregoing general formula (a2-1) is different from each other.

For example, it is still more preferable that the component (A1) contains two or more kinds of constituent units selected from the group consisting of a constituent unit represented by the following general formula (a2-1-1) and a constituent unit represented by the following general formula (a2-1-2).

(Chemical formula 28)

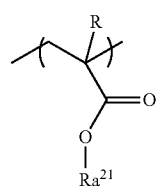

(a2-1-1)

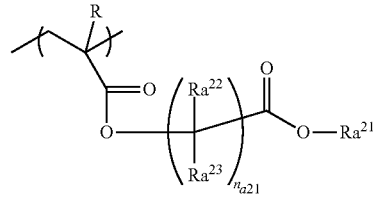

(a2-1-2)

In the formulae, R and $Ra^{21}$ are the same as R and $Ra^{21}$, respectively in the foregoing formula (a2-1); each of $Ra^{22}$ and $Ra^{23}$ independently represents a hydrogen atom or an alkyl group having 1 to 5 carbon atoms; and $n_{a21}$ is an integer of 1 to 3.

In the formulae (a2-1-1) to (a2-1-2), the alkyl group represented by $Ra^{22}$ and $Ra^{23}$ is the same as the alkyl group in R as described above. The case where both $Ra^{22}$ and $Ra^{23}$ are a hydrogen atom, or the case where only one of $Ra^{22}$ and $Ra^{23}$ is an alkyl group (especially preferably a methyl group) is preferable.

$n_{a21}$ is preferably 1.

In the case where the component (A1) contains two or more kinds of the constituent unit (a2), the combination of $Ra^{21}$'s is preferably a combination of a lactone-containing cyclic group with an —$SO_2$-containing cyclic group.

In this lactone-containing cyclic group, the group represented by the foregoing general formula (a2-r-1) or (a2-r-2) is preferable.

In this —$SO_2$-containing cyclic group, the group represented by the foregoing general formula (a5-r-1) is preferable.

Specific examples of the groups represented by the general formulae (a2-r-1), (a2-r-2), and (a5-r-1), respectively are the same as those exemplified above.

In the case where the component (A1) contains two or more kinds of the constituent unit (a2), the constituent unit (a2) is especially preferably a combination of the constituent unit represented by the general formula (a2-1-1) with the constituent unit represented by the general formula (a2-1-2), and most preferably a combination of the constituent unit represented by the general formula (a2-1-1), wherein $Ra^{21}$ is a lactone-containing cyclic group with the constituent unit represented by the general formula (a2-1-2), wherein $Ra^{21}$ is —$SO_2$-containing cyclic group.

In the case where the component (A1) has the constituent unit (a2), a proportion of the constituent unit (a2) is preferably 1 to 80 mol %, more preferably 10 to 70 mol %, still more preferably 10 to 65 mol %, and especially preferably 10 to 60 mol % relative to a total sum of all of the constituent units constituting the component (A1).

When the proportion of the constituent unit (a2) in the component (A1) is the lower limit value or more, the effects to be brought due to the fact that the constituent unit (a2) is contained are sufficiently obtained. When the proportion of the constituent unit (a2) in the component (A1) is not more than the upper limit value, a balance with other constituent units is easily taken, and various lithography properties or the pattern shape becomes satisfactory.

(Other Constituent Units)

The component (A1) may further have, in addition to the constituent unit (a0), other constituent units which do not fall within the definition of the constituent unit (a0), (a1), or (a2).

The foregoing other constituent units are not particularly limited so long as they are a constituent unit which is not classified into the above-described constituent units. A large number of constituent units which have been conventionally known to be used for resins for resist such as those for ArF excimer lasers and KrF excimer lasers (preferably those for ArF excimer lasers), and the like can be used. Examples thereof include a constituent unit (a3) and a constituent unit (a4) as described below.

Constituent Unit (a3):

The constituent unit (a3) is a constituent unit containing a polar group-containing aliphatic hydrocarbon group (exclusive of those which fall within the definition of the constituent unit (a0), (a1), or (a2)).

In view of the fact that the component (A1) has the constituent unit (a3), the hydrophilicity of the component (A) increases, resulting in contribution to an enhancement of resolution.

Examples of the polar group in the constituent unit (a3) include a hydroxyl group, a cyano group, a carboxy group, and a hydroxyalkyl group in which a part of hydrogen atoms of an alkyl group is substituted with a fluorine atom, with a hydroxyl group being especially preferable.

Examples of the aliphatic hydrocarbon group include a linear or branched hydrocarbon group having 1 to 10 carbon atoms (preferably an alkylene group) and a cyclic aliphatic hydrocarbon group (cyclic group). The cyclic group may be either a monocyclic group or a polycyclic group, and for example, it can be properly selected and used among a large number of groups proposed in resins for resist compositions for ArF excimer lasers. The cyclic group is preferably a polycyclic group, and more preferably a polycyclic group having 7 to 30 carbon atoms.

Above all, a constituent unit derived from an acrylic ester containing an aliphatic polycyclic group containing a hydroxyl group, a cyano group, a carboxy group, or a hydroxyalkyl group in which a part of hydrogen atoms of an alkyl group is substituted with a fluorine atom is more preferable. Examples of the polycyclic group include a group in which two or more hydrogen atoms are eliminated from a bicycloalkane, a tricycloalkane, a tetracycloalkane, or the like. Specifically, examples thereof include a group in which two or more hydrogen atoms are eliminated from a polycycloalkane such as adamantane, norbornane, isobornane, tricyclodecane, and tetracyclododecane. Among these polycyclic groups, a group in which two or more hydrogen atoms are eliminated from adamantane, a group in which two or more hydrogen atoms are eliminated from norbornane, or a group in which two or more hydrogen atoms are eliminated from tetracyclododecane is preferable from the industrial standpoint.

As the constituent unit (a3), an arbitrary constituent unit can be used without particular limitations so long as it contains a polar group-containing aliphatic hydrocarbon group.

The constituent unit (a3) is preferably a constituent unit derived from an acrylic ester in which the hydrogen atom bonded to the carbon atom at the α-position may be substituted with a substituent, the constituent unit containing a polar group-containing aliphatic hydrocarbon group.

When the hydrocarbon group in the polar group-containing aliphatic hydrocarbon group is a linear or branched hydrocarbon group having 1 to 10 carbon atoms, the constituent unit (a3) is preferably a constituent unit derived from a hydroxyethyl ester of acrylic acid, and when the subject hydrocarbon group is a polycyclic group, the constituent unit (a3) is preferably a constituent unit represented by the following formula (a3-1), a constituent unit represented by the following formula (a3-2), or a constituent unit represented by the following formula (a3-3).

(Chemical formula 29)

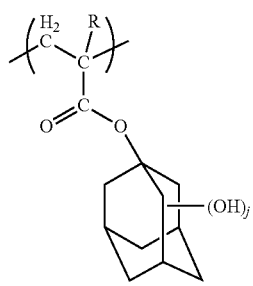

(a3-1)

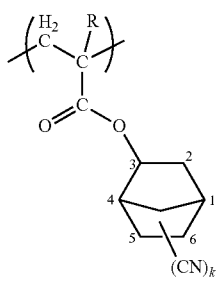

(a3-2)

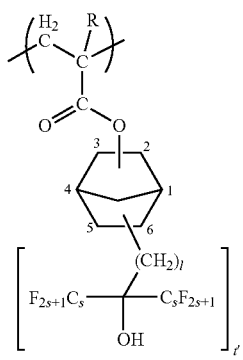

(a3-3)

In the formulae, R is the same as that described above; j is an integer of 1 to 3; k is an integer of 1 to 3; t' is an integer of 1 to 3; l is an integer of 1 to 5; and s is an integer of 1 to 3.

In the formula (a3-1), j is preferably 1 or 2, and more preferably 1. In the case where j is 2, a constituent unit in which the hydroxyl group is bonded to the 3-position and 5-position of the adamantyl group is preferable. In the case where j is 1, a constituent unit in which the hydroxyl group is bonded to the 3-position of the adamantyl group is preferable.

j is preferably 1, and a constituent unit in which the hydroxyl group is bonded to the 3-position of the adamantyl group is especially preferable.

In the formula (a3-2), k is preferably 1; and the cyano group is preferably bonded to the 5-position or 6-position of the norbornyl group.

In the formula (a3-3), t' is preferably 1; l is preferably 1; and s is preferably 1. In these, it is preferable that the 2-norbonyl group or the 3-norbornyl group is bonded to an end of the carboxy group of acrylic acid. The fluorinated alkyl alcohol is preferably bonded to the 5- or 6-position of the norbornyl group.

The constituent unit (a3) which the component (A1) has may be either one kind or two or more kinds.

In the case where the component (A1) has the constituent unit (a3), a proportion of the constituent unit (a3) in the component (A1) is preferably 5 to 50 mol %, more preferably 5 to 40 mol %, and still more preferably 5 to 30 mol % relative to a total sum of all of the constituent units constituting the component (A1).

When the proportion of the constituent unit (a3) in the component (A1) is the lower limit value or more, the effects to be brought by the fact that the constituent unit (a3) is contained are sufficiently obtained. When the proportion of the constituent unit (a3) in the component (A1) is not more than the upper limit value, a balance with other constituent units is easily taken.

Constituent Unit (a4):

The constituent unit (a4) is a constituent unit containing an acid nondissociable aliphatic cyclic group.

In view of the fact that the component (A1) has the constituent unit (a4), dry etching resistance of the formed resist pattern is enhanced. In addition, hydrophobicity of the component (A) increases. In particular, in the case of negative type development with an organic developing solution, the enhancement of hydrophobicity contributes to enhancements in resolution, resist pattern shape, and the like.

The "acid-nondissociable cyclic group" in the constituent unit (a4) is a cyclic group which on the occasion of generation of an acid in the resist composition upon exposure, even when the acid acts, remains in the constituent unit as it is without being dissociated.

The constituent unit (a4) is, for example, preferably a constituent unit derived from an acrylic ester containing an acid nondissociable aliphatic cyclic group, or the like. Examples of the cyclic group include the same cyclic groups as those exemplified for the case of the above-described constituent unit (a1). A large number of constituent units which have been conventionally known to be used for resin components for resist composition such as those for ArF excimer lasers and KrF excimer lasers (preferably those for ArF excimer lasers), and the like can be used.

In particular, from the standpoint of easiness of industrial availability or the like, the constituent unit (a4) is preferably at least one member selected from the group consisting of a tricyclodecyl group, an adamantyl group, a tetracyclododecyl group, an isobornyl group, and a norbornyl group. Such a polycyclic group may have a linear or branched alkyl group having 1 to 5 carbon atoms as a substituent.

Specifically, examples of the constituent unit (a4) include constituent units represented by the following general formulae (a4-1) to (a4-7), respectively.

(Chemical formula 30)

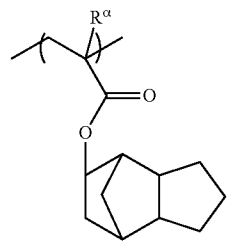

(a4-1)

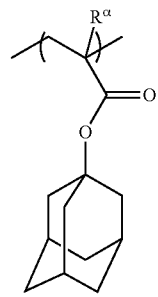

(a4-2)

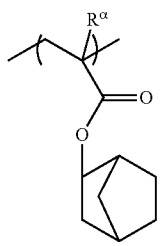
(a4-3)

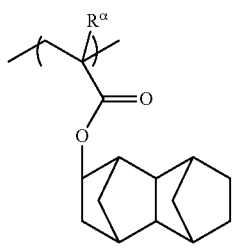
(a4-4)

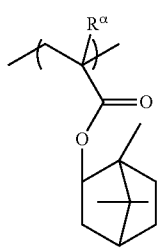
(a4-5)

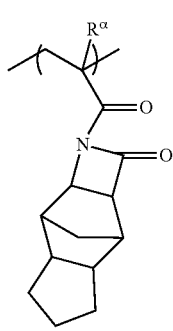
(a4-6)

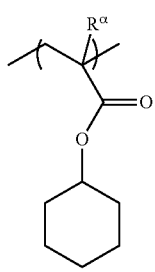
(a4-7)

In the formulae, $R^\alpha$ is the same as that described above.

The constituent unit (a4) which the component (A1) has may be either one kind or two or more kinds.

In the case where the component (A1) has the constituent unit (a4), a proportion of the constituent unit (a4) in the component (A1) is preferably 1 to 30 mol %, and more preferably 3 to 20 mol % by mole relative to a total sum of all of the constituent units constituting the component (A1).

When the proportion of the constituent unit (a4) in the component (A1) is the lower limit value or more, the effects to be brought by the fact that the constituent unit (a4) is contained are sufficiently obtained, and when the proportion of the constituent unit (a4) in the component (A1) is not more than the upper limit value, a balance with other constituent units is easily taken.

In the resist composition which is used in the method for forming a resist pattern according to the present invention, the component (A1) is a polymer having at least the constituent unit (a0).

The component (A1) is preferably a copolymer having, in addition to the constituent unit (a0), one or more constituent units selected from the constituent unit (a1) and the constituent unit (a2).

Examples of such a copolymer include a copolymer composed of a repeating structure of the constituent units (a0) and (a1); a copolymer composed of a repeating structure of the constituent units (a0) and (a2); a copolymer composed of a repeating structure of the constituent units (a0), (a1), and (a2); and a copolymer composed of a repeating structure of the constituent units (a0), (a1), (a2), and (a3).

A mass average molecular weight (Mw) (as converted into polystyrene by means of gel permeation chromatography (GPC)) of the component (A1) is not particularly limited, but it is preferably 1,000 to 50,000, more preferably 1,500 to 30,000, and most preferably 2,000 to 20,000.

When the mass average molecular weight of the component (A1) is not more than the upper limit value of the foregoing range, sufficient solubility in a resist solvent for the use as a resist is revealed, and when it is the lower limit value of the foregoing range or more, satisfactory dry etching resistance and resist pattern cross-sectional shape are revealed.

A degree of dispersion (Mw/Mn) of the component (A1) is not particularly limited and preferably 1.0 to 5.0, more preferably 1.0 to 3.0, and most preferably 1.0 to 2.5. It is to be noted that Mn represents a number average molecular weight.

The component (A1) can be obtained by polymerizing monomers from which the respective constituent units are derived by means of known radical polymerization using a radical polymerization initiator, for example, azobisisobutyronitrile (AIBN) or dimethyl azobisisobutyrate, or the like.

In addition, with respect to the component (A1), on the occasion of the above-described polymerization, by jointly using a chain transfer agent, for example, HS—$CH_2$—$CH_2$—$CH_2$—$C(CF_3)_2$—OH, a —$C(CF_3)_2$—OH group may be introduced into an end thereof. In this way, a copolymer into which a hydroxyalkyl group in which a part of hydrogen atoms of an alkyl group is substituted with a fluorine atom is introduced is effective for decreasing a development defect or decreasing LER (line edge roughness: non-uniform roughness on the line side wall).

As the monomers from which the respective constituent units are derived, commercially available monomers may be used, or monomers synthesized utilizing a known method may also be used.

The component (A1) may be used solely, or may be used in combination of two or more kinds thereof.

A proportion of the component (A1) in the component (A) is preferably 25 mass % or more, more preferably 50 mass % or more, and still more preferably 75 mass % or more relative to a total mass of the component (A), and it may be even 100 mass %. When the proportion of the component (A1) in the component (A) is 25 mass % or more, lithography properties such as mask error enhancement factor (MEEF), circularity, critical dimension uniformity (CDU), a decrease of roughness, and depth of focus (DOF) are more enhanced.

In the resist composition which is used in the method for forming a resist pattern according to the present invention, the component (A) may be used solely, or may be used in combination of two or more kinds thereof.

In the resist composition, the content of the component (A) may be adjusted in conformity with the thickness of the resist film to be formed, or the like.

[Other Components]

The resist composition which is used in the method for forming a resist pattern according to the present invention may further contain, in addition to the component (A), other components. Examples of other components include a component (B), a component (D), a component (E), a component (F), and a component (S) as described below.

(Component (B): acid generator component)

The resist composition which is used in the method for forming a resist pattern according to the present invention may further contain, in addition to the component (A), an acid generator component (hereinafter referred to as "component (B)").

The component (B) is not particularly limited, and those which have been so far proposed as the acid generator for a chemically amplified resist can be used.

Examples of such an acid generator include a variety of acid generators such as an onium salt-based acid generator, for example, an iodonium salt and a sulfonium salt; an oxime sulfonate-based acid generator; a diazomethane-based acid generator, for example, a bisalkyl or bisaryl sulfonyl diazomethane and a poly (bissulfonyl)diazomethane; a nitrobenzylsulfonate-based acid generator; an iminosulfonate-based acid generator; and a disulfone-based acid generator. Above all, it is preferable to use an onium salt-based acid generator.

As the onium salt-based acid generator, for example, a compound represented by the following general formula (b-1) (hereinafter also referred to as "component (b-1)"), a compound represented by the following general formula (b-2) (hereinafter also referred to as "component (b-2)"), or a compound represented by the following general formula (b-3) (hereinafter also referred to as "component (b-3)") can be used.

(Chemical formula 31)

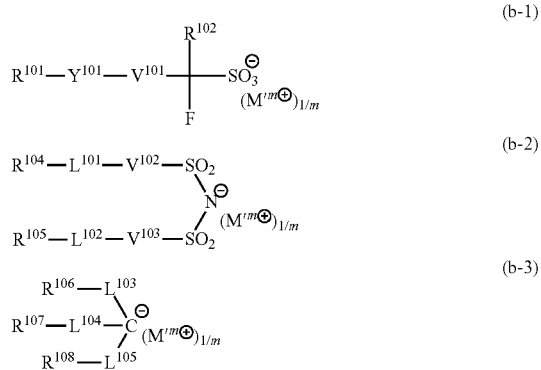

In the formulae, each of $R^{101}$ and $R^{104}$ to $R^{108}$ independently represents an optionally substituted cyclic group, an optionally substituted chain alkyl group, or an optionally substituted chain alkenyl group; $R^{104}$ and $R^{105}$ may be bonded to each other to form a ring; $R^{102}$ represents a fluorine atom or a fluorinated alkyl group having 1 to 5 carbon atoms; $Y^{101}$ represents a single bond or a divalent linking group containing an oxygen atom; each of $V^{101}$ to $V^{103}$ independently represents a single bond, an alkylene group, or a fluorinated alkylene group; each of $L^{101}$ to $L^{102}$ independently represents a single bond or an oxygen atom; each of $L^{103}$ to $L^{105}$ independently represents a single bond, —CO—, or —SO$_2$—; and $M'^{m+}$ represents an m-valent onium cation.

{Anion Moiety}

Anion Moiety of the Component (b-1):

In the formula (b-1), $R^{101}$ represents an optionally substituted cyclic group, an optionally substituted chain alkyl group, or an optionally substituted chain alkenyl group.

Optionally Substituted Cyclic Group:

The cyclic group is preferably a cyclic hydrocarbon group, and the cyclic hydrocarbon group may be either an aromatic hydrocarbon group or an aliphatic hydrocarbon group. The aliphatic hydrocarbon group means a hydrocarbon group having no aromaticity. In addition, the aliphatic hydrocarbon group may be either saturated or unsaturated, and in general, it is preferably saturated.

The aromatic hydrocarbon group in $R^{101}$ is a hydrocarbon group having an aromatic ring. The carbon number of the aromatic hydrocarbon group is preferably 3 to 30, more preferably 5 to 30, still more preferably 5 to 20, especially preferably 6 to 15, and most preferably 6 to 10. However, the carbon number does not include the carbon number in the substituent.

Specifically, examples of the aromatic ring which the aromatic hydrocarbon group in $R^{101}$ has include benzene, fluorene, naphthalene, anthracene, phenanthrene, and biphenyl; and an aromatic heterocyclic ring in which a part of the carbon atoms constituting the above-described aromatic ring is substituted with a hetero atom. Examples of the hetero atom in the aromatic heterocyclic ring include an oxygen atom, a sulfur atom, and a nitrogen atom.

Specifically, examples of the aromatic hydrocarbon group in $R^{101}$ include a group in which one hydrogen atom is eliminated from the above-described aromatic ring (an aryl group, for example, a phenyl group or a naphthyl group); and a group in which one of the hydrogen atoms of the above-described aromatic ring is substituted with an alkylene group (an arylalkyl group, for example, a benzyl group, a phenethyl group, a 1-naphthylmethyl group, a 2-naphthylmethyl group, a 1-naphthylethyl group, or a 2-naphthylethyl group). The carbon number of the above-described alkylene group (alkyl chain in the arylalkyl group) is preferably 1 to 4, more preferably 1 to 2, and especially preferably 1.

Examples of the cyclic aliphatic hydrocarbon group in $R^{101}$ include an aliphatic hydrocarbon group containing a ring in a structure thereof.

Examples of the aliphatic hydrocarbon group containing a ring in a structure thereof include an alicyclic hydrocarbon group (a group in which one hydrogen atom is eliminated from an aliphatic hydrocarbon ring); a group in which an alicyclic hydrocarbon group is bonded to an end of a linear or branched aliphatic hydrocarbon group; and a group in which an alicyclic hydrocarbon group intervenes on the way of a linear or branched aliphatic hydrocarbon group.

The carbon number of the above-described alicyclic hydrocarbon group is preferably 3 to 20, and more preferably 3 to 12.

The above-described alicyclic hydrocarbon group may be either a polycyclic group or a monocyclic group. The monocyclic alicyclic hydrocarbon group is preferably a group in which one or more hydrogen atoms are eliminated from a monocycloalkane. The monocycloalkane is preferably one having 3 to 6 carbon atoms, and specifically, examples thereof include cyclopentane and cyclohexane. The polycyclic alicyclic hydrocarbon group is preferably a group in which one or more hydrogen atoms are eliminated from a polycycloalkane. The polycycloalkane is preferably one having 7 to 12 carbon atoms, and specifically, examples thereof include adamantane, norbornane, isobornane, tricyclodecane, and tetracyclododecane.

Above all, the cyclic aliphatic hydrocarbon group in $R^{101}$ is preferably a group in which one or more hydrogen atoms are eliminated from a monocycloalkane or a polycycloalkane, more preferably a group in which one hydrogen atom is eliminated from a polycycloalkane, especially preferably an adamantyl group or a norbornyl group, and most preferably an adamantyl group.

The carbon number of the linear or branched aliphatic hydrocarbon group which may be bonded to an alicyclic hydrocarbon group is preferably 1 to 10, more preferably 1 to 6, still more preferably 1 to 4, and most preferably 1 to 3.

The linear aliphatic hydrocarbon group is preferably a linear alkylene group. Specifically, examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group is preferably a branched alkylene group. Specifically, examples thereof include an alkylalkylene group such as an alkylmethylene group, for example, —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, or —$C(CH_2CH_3)_2$—; an alkylethylene group, for example, —$CH(CH_3)CH_2$—, —$CH(CH_3)CH(CH_3)$—, —$C(CH_3)_2CH_2$—, —$CH(CH_2CH_3)CH_2$—, or —$C(CH_2CH_3)_2$—$CH_2$—; an alkyltrimethylene group, for example, —$CH(CH_3)CH_2CH_2$— or —$CH_2CH(CH_3)CH_2$—; and an alkyltetramethylene group, for example, —$CH(CH_3)CH_2CH_2CH_2$— or —$CH_2CH(CH_3)CH_2CH_2$—. The alkyl group in the alkylalkylene group is preferably a linear alkyl group having 1 to 5 carbon atoms.

In addition, the cyclic hydrocarbon group in $R^{101}$ may contain a hetero atom as in a heterocyclic ring or the like. Specifically, examples thereof include the lactone-containing cyclic groups represented by the foregoing general formulae (a2-r-1) to (a2-r-7), respectively and the —$SO_2$—-containing polycyclic groups represented by the foregoing general formulae (a5-r-1) to (a5-r-4), respectively, and besides, heterocyclic groups as exemplified below.

(Chemical formula 32)

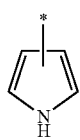
(r-hr-1)

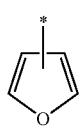
(r-hr-2)

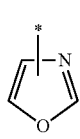
(r-hr-3)

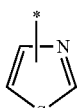
(r-hr-4)

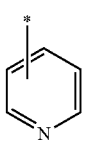
(r-hr-5)

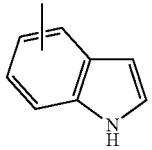
(r-hr-6)

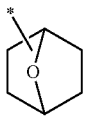
(r-hr-7)

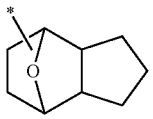
(r-hr-8)

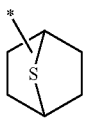
(r-hr-9)

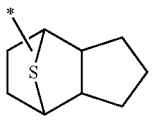
(r-hr-10)

(r-hr-11)

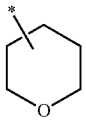
(r-hr-12)

(r-hr-13)

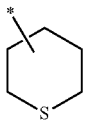
(r-hr-14)

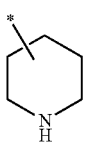
(r-hr-15)

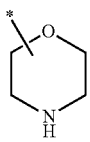
(r-hr-16)

Examples of the substituent in the cyclic hydrocarbon group represented by $R^{101}$ include an alkyl group, an alkoxy group, a halogen atom, a halogenated alkyl group, a hydroxyl group, a carbonyl group, and a nitro group.

The alkyl group as the substituent is preferably an alkyl group having 1 to 5 carbon atoms, and most preferably a methyl group, an ethyl group, a propyl group, an n-butyl group, or a tert-butyl group.

The alkoxy group as the substituent is preferably an alkoxy group having 1 to 5 carbon atoms, more preferably a methoxy group, an ethoxy group, an n-propoxy group, an isopropoxy group, an n-butoxy group, or a tert-butoxy group, and most preferably a methoxy group or an ethoxy group.

Examples of the halogen atom as the substituent include a fluorine atom, a chlorine atom, a bromine atom, and an iodine atom, with a fluorine atom being preferable.

Examples of the halogenated alkyl group as the substituent include a group in which a part or all of the hydrogen atoms of an alkyl group having 1 to 5 carbon atoms, for example, a methyl group, an ethyl group, a propyl group, an n-butyl group, or a tert-butyl group, are substituted with the above-described halogen atom.

The carbonyl group as the substituent is a group with which a methylene group (—$CH_2$—) constituting the cyclic hydrocarbon group is substituted.

Optionally Substituted Chain Alkyl Group:

The chain alkyl group represented by $R^{101}$ may be either linear or branched.

The carbon number of the linear alkyl group is preferably 1 to 20, more preferably 1 to 15, and most preferably 1 to 10. Specifically, examples thereof include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an eicosyl group, a heneicosyl group, and a docosyl group.

The carbon number of the branched alkyl group is preferably 3 to 20, more preferably 3 to 15, and most preferably 3 to 10. Specifically, examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Optionally Substituted Chain Alkenyl Group:

The chain alkenyl group represented by $R^{101}$ may be either linear or branched. The carbon number of the chain alkenyl group is preferably 2 to 10, more preferably 2 to 5, still more preferably 2 to 4, and especially preferably 3. Examples of the linear alkenyl group include a vinyl group, a propenyl group (allyl group), and a butynyl group. Examples of the branched alkenyl group include a 1-methylvinyl group, a 2-methylvinyl group, a 1-methylpropenyl group, and a 2-methylpropenyl group.

Above all, the chain alkenyl group is more preferably a vinyl group or a propenyl group, and especially preferably a vinyl group.

Examples of the substituent in the chain alkyl group or alkenyl group represented by $R^{101}$ include an alkoxy group, a halogen atom, a halogenated alkyl group, a hydroxyl group, a carbonyl group, a nitro group, an amino group, and the cyclic groups in the above-described $R^{101}$.

Above all, $R^{101}$ is preferably an optionally substituted cyclic group, and more preferably an optionally substituted cyclic hydrocarbon group. More specifically, a group in which one or more hydrogen atoms are eliminated from a phenyl group, a naphthyl group, or a polycycloalkane; the lactone-containing cyclic groups represented by the foregoing general formulae (a2-r-1) to (a2-r-7), respectively; and the —$SO_2$—-containing cyclic groups represented by the foregoing general formulae (a5-r-1) to (a5-r-4), respectively are preferable.

In the formula (b-1), $Y^{101}$ represents a single bond or an oxygen atom-containing divalent linking group.

In the case where $Y^{101}$ is an oxygen atom-containing divalent linking group, $Y^{101}$ may contain an atom other than an oxygen atom. Examples of the atom other than an oxygen atom include a carbon atom, a hydrogen atom, a sulfur atom, and a nitrogen atom.

Examples of the oxygen atom-containing divalent linking group include a non-hydrocarbon-based oxygen atom-containing linking group such as an oxygen atom (ether bond: —O—), an ester bond (—C(═O)—O—), an oxycarbonyl group (—O—C(═O)—), an amide bond (—C(═O)—NH—), a carbonyl group (—C(═O)—), and a carbonate bond (—O—C(═O)—O—); and a combination of the subject non-hydrocarbon-based oxygen atom-containing linking group with an alkylene group. A sulfonyl group (—$SO_2$—) may be further connected to the subject combination. Examples of the combination include linking groups represented by the following formulae (y-a1-1) to (y-a1-7), respectively.

(Chemical formula 33)

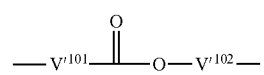 (y-a1-1)

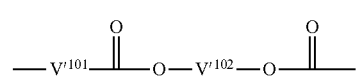 (y-a1-2)

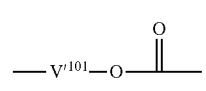 (y-a1-3)

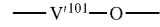 (y-a1-4)

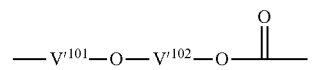 (y-a1-5)

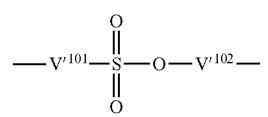 (y-a1-6)

(y-al-7)

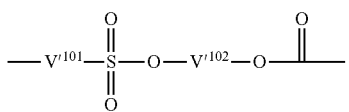

In the formulae, $V'^{101}$ represents a single bond or an alkylene group having 1 to 5 carbon atoms; and $V'^{102}$ represents a divalent saturated hydrocarbon group having 1 to 30 carbon atoms.

The divalent saturated hydrocarbon group in $V'^{102}$ is preferably an alkylene group having 1 to 30 carbon atoms.

The alkylene group in $V'^{101}$ and $V'^{102}$ may be a linear alkylene group, or may be a branched alkylene group, and it is preferably a linear alkylene group.

Specifically, examples of the alkylene group in $V'^{101}$ and $V'^{102}$ include a methylene group [—$CH_2$—]; an alkylmethylene group such as —$CH(CH_3)$—, —$CH(CH_2CH_3)$—, —$C(CH_3)_2$—, —$C(CH_3)$ $(CH_2CH_3)$—, —$C(CH_3)$ $(CH_2CH_2CH_3)$—, and —$C(CH_2CH_3)_2$—; an ethylene group [—$CH_2$—$CH_2$—]; an alkylethylene group such as —$CH(CH_3)$ $CH_2$—, —$CH(CH_3)$ $CH(CH_3)$—, —$C(CH_3)_2CH_2$—, and —$CH(CH_2CH_3)$ $CH_2$—; a trimethylene group (n-propylene group) [—$CH_2CH_2CH_2$—]; an alkyltrimethylene group such as —$CH(CH_3)$ $CH_2CH_2$— and —$CH_2CH(CH_3)$ $CH_2$—; a tetramethylene group [—$CH_2CH_2CH_2CH_2$—]; an alkyltetramethylene group such as —$CH(CH_3)$ $CH_2CH_2CH_2$— and —$CH_2CH(CH_3)$ $CH_2CH_2$—; and a pentamethylene group [—$CH_2CH_2CH_2CH_2CH_2$—].

In addition, a part of the methylene groups in the above-described alkylene group in $V'^{101}$ or $V'^{102}$ may be substituted with a divalent aliphatic cyclic group having 5 to 10 carbon atoms. The subject aliphatic cyclic group is preferably a divalent group in which one hydrogen atom is further eliminated from the cyclic aliphatic hydrocarbon group represented by $Ra'^3$ in the foregoing formula (a1-r-1), and more preferably a cyclohexylene group, a 1,5-adamantylene group, or a 2,6-adamantylene group.

$Y^{101}$ is preferably a divalent linking group containing an ester bond or an ether bond, and the linking groups represented by the foregoing formulae (y-a1-1) to (y-a1-5), respectively are preferable.

In the formula (b-1), $V^{101}$ represents a single bond, an alkylene group, or a fluorinated alkylene group. The carbon number of each of the alkylene group and the fluorinated alkylene group in $V^{101}$ is preferably 1 to 4. Examples of the fluorinated alkylene group in $V^{101}$ include a group in which a part or all of the hydrogen atoms of the alkylene group in $V^{101}$ are substituted with a fluorine atom. Above all, $V^{101}$ is preferably a single bond or a fluorinated alkylene group having 1 to 4 carbon atoms.

In the formula (b-1), $R^{102}$ represents a fluorine atom or a fluorinated alkyl group having 1 to 5 carbon atoms. $R^{102}$ is preferably a fluorine atom or a perfluoroalkyl group having 1 to 5 carbon atoms, and more preferably a fluorine atom.

As for specific examples of the anion moiety of the component (b-1), in the case where $Y^{102}$ is a single bond, examples thereof include a fluorinated alkyl sulfonate anion such as a trifluoromethane sulfonate anion and a perfluorobutane sulfonate anion; and in the case where $Y^{101}$ is an oxygen atom-containing divalent linking group, examples thereof include any of anions represented by the following formulae (an-1) to (an-3), respectively.

(Chemical formula 34)

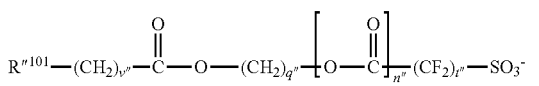
(an-1)

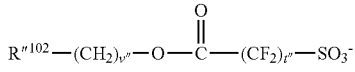
(an-2)

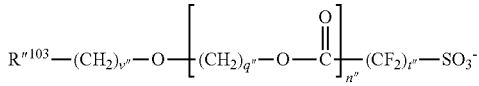
(an-3)

In the formulae, $R'''^{101}$ represents an optionally substituted aliphatic cyclic group, a group represented by each of the foregoing formulae (r-hr-1) to (r-hr-6), or an optionally substituted chain alkyl group; $R'''^{102}$ represents an optionally substituted aliphatic cyclic group, a lactone-containing cyclic group represented by each of the foregoing general formulae (a2-r-1) to (a2-r-7), or an —$SO_2$—-containing cyclic group represented by each of the foregoing formulae (a5-r-1) to (a5-r-4); $R'''^{103}$ represents an optionally substituted aromatic cyclic group, an optionally substituted aliphatic cyclic group, or an optionally substituted chain alkenyl group; each of v"s independently represents an integer of 0 to 3; each of q"s independently represents an integer of 1 to 20; t" represents an integer of 1 to 3; and n" is 0 or 1.

The optionally substituted aliphatic cyclic group represented by each of $R'''^{101}$, $R'''^{102}$, and $R'''^{103}$ is preferably the group exemplified above for the cyclic aliphatic hydrocarbon group in $R^{101}$. Examples of the substituent include the same substituents as those with which the cyclic aliphatic hydrocarbon group in $R^{101}$ may be substituted.

The optionally substituted aromatic cyclic group in $R'''^{103}$ is preferably the group exemplified above for the aromatic hydrocarbon group in the cyclic hydrocarbon group in $R^{101}$. Examples of the substituent include the same substituents as those with which the aromatic hydrocarbon group in $R^{101}$ may be substituted.

The optionally substituted chain alkyl group in $R'''^{101}$ is preferably the group exemplified above for the chain alkyl group in $R^{101}$. The optionally substituted chain alkenyl group in $R'''^{103}$ is preferably the group exemplified above for the chain alkenyl group in $R^{101}$.

Anion Moiety of the Component (b-2):

In the formula (b-2), each of $R^{104}$ and $R^{105}$ independently represents an optionally substituted cyclic group, an optionally substituted chain alkyl group, or an optionally substituted chain alkenyl group, and examples thereof include the same groups as those in $R^{101}$ in the formula (b-1). However, $R^{104}$ and $R^{105}$ may be bonded to each other to form a ring.

Each of $R^{104}$ and $R^{105}$ is preferably an optionally substituted chain alkyl group, and more preferably a linear or branched alkyl group or a linear or branched fluorinated alkyl group.

The carbon number of the chain alkyl group is preferably 1 to 10, more preferably 1 to 7, and still more preferably 1 to 3. The carbon number of the chain alkyl group represented by each of $R^{104}$ and $R^{105}$ is preferably smaller within the above-described range of the carbon number for reasons such as satisfactory solubility in a resist solvent. In addition, in the chain alkyl group represented by each of $R^{104}$ and $R^{105}$, the number of the hydrogen atoms substituted with a fluorine atom is preferably larger because the intensity of the acid becomes strong, and the transparency to a high energy light or electron beams of not more than 200 nm is enhanced. A proportion of the fluorine atom in the chain alkyl group, namely a fluorination rate, is preferably 70 to 100%, and more preferably 90 to 100%. A perfluoroalkyl group in which all of the hydrogen atoms are substituted with a fluorine atom is the most preferable.

In the formula (b-2), each of $V^{102}$ and $V^{103}$ independently represents a single bond, an alkylene group, or a fluorinated alkylene group, and examples thereof include the same groups as those in $V^{101}$ in the formula (b-1).

In the formula (b-2), each of $L^{101}$ to $L^{102}$ independently represents a single bond or an oxygen atom.

Anion Moiety of the Component (b-3):

In the formula (b-3), each of $R^{106}$ to $R^{108}$ independently represents an optionally substituted cyclic group, an optionally substituted chain alkyl group, or an optionally substituted chain alkenyl group, and examples thereof include the same groups as those in $R^{101}$ in the formula (b-1).

Each of $L^{103}$ to $L^{105}$ independently represents a single bond, —CO—, or —SO$_2$—.

{Cation Part}

In the formulae (b-1), (b-2), and (b-3), $M^{m+}$ represents an m-valent onium cation, and suitably, examples thereof include a sulfonium cation and an iodonium cation. Organic cations represented by the following general formulae (ca-1) to (ca-4), respectively are especially preferable.

(Chemical formula 35)

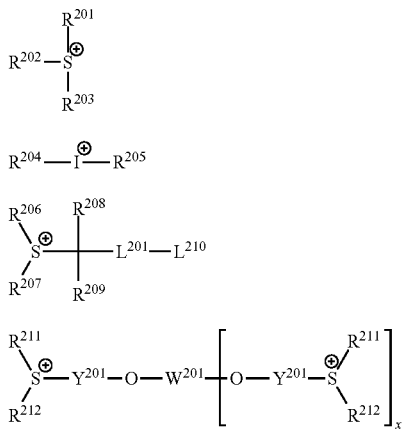

In the formulae, each of $R^{201}$ to $R^{207}$ and $R^{211}$ to $R^{212}$ independently represents an optionally substituted aryl group, alkyl group or alkenyl group, and $R^{201}$ to $R^{203}$, $R^{206}$ to $R^{207}$, or $R^{211}$ to $R^{212}$ may be bonded to each other to form a ring together with a sulfur atom in each formula; each of $R^{208}$ to $R^{209}$ independently represents a hydrogen atom or an alkyl group having 1 to 5 carbon atoms; $R^{210}$ represents an optionally substituted aryl group, alkyl group or alkenyl group, or an —SO$_2$—-containing cyclic group; $L^{201}$ represents —C(=O)— or —C(=O)—O—; each of $Y^{201}$s independently represents an arylene group, an alkylene group, or an alkenylene group; x is 1 or 2; and $W^{201}$ represents an (x+1)-valent linking group.

Examples of the aryl group in $R^{201}$ to $R^{207}$ and $R^{211}$ to $R^{212}$ include an unsubstituted aryl group having 6 to 20 carbon atoms, and the aryl group is preferably a phenyl group or a naphthyl group.

The alkyl group in $R^{201}$ to $R^{207}$ and $R^{211}$ to $R^{212}$ is preferably a chain or cyclic alkyl group having 1 to 30 carbon atoms.

The alkenyl group in $R^{201}$ to $R^{207}$ and $R^{211}$ to $R^{212}$ is preferably an alkenyl group having 2 to 10 carbon atoms.

Examples of the substituent which each of $R^{201}$ to $R^{207}$ and $R^{210}$ to $R^{212}$ may have include an alkyl group, a halogen atom, a halogenated alkyl group, a carbonyl group, a cyano group, an amino group, an aryl group, and groups represented by the following formulae (ca-r-1) to (ca-r-7), respectively.

(Chemical formula 36)

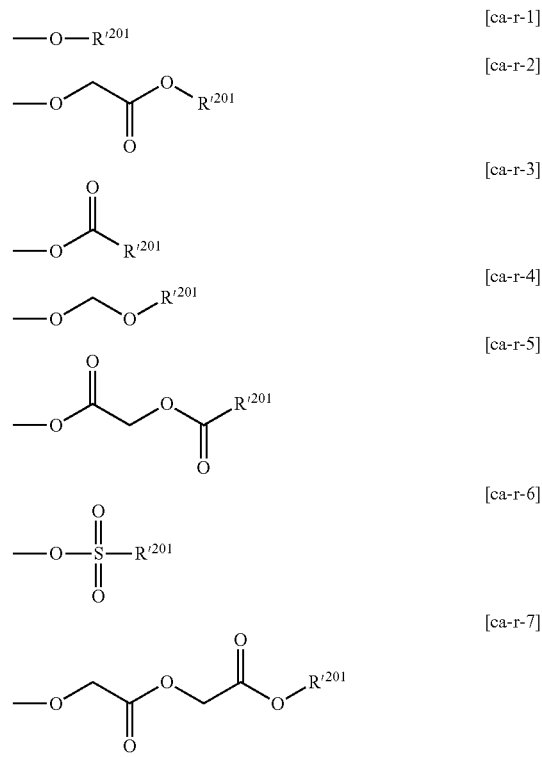

In the formulae, each of $R'^{201}$s independently represents a hydrogen atom or an optionally substituted cyclic group, chain alkyl group or chain alkenyl group.

Examples of the optionally substituted cyclic group, the optionally substituted chain alkyl group, or the optionally substituted chain alkenyl group represented by $R'^{201}$ include the same groups as those for $R^{101}$ in the foregoing formula (b-1). Besides, examples of the optionally substituted cyclic group or the optionally substituted chain alkyl group include the same acid dissociable group represented by the foregoing formula (a1-r-2).

In the case where $R^{201}$ to $R^{203}$, $R^{206}$ to $R^{207}$, or $R^{211}$ to $R^{212}$ may be bonded to each other to form a ring together with a sulfur atom in each formula, they may be bonded to each other via a hetero atom such as a sulfur atom, an oxygen atom, and a nitrogen atom, or a functional group such as a carbonyl group, —SO—, —SO$_2$—, —SO$_3$—, —COO—, —CONH—, and —N(R$_N$)— (R$_N$ represents an alkyl group having 1 to 5 carbon atoms). As for the ring to be formed, one ring containing a sulfur atom in the formula in a ring skeleton thereof is preferably a 3- to 10-membered ring, and especially preferably a 5- to 7-membered ring including the sulfur atom. Specific examples of the ring to be formed include a thiophene ring, a thiazole ring, a benzothiophene ring, a thianthrene ring, a dibenzothiophene ring, a 9H-thioxanthene ring, a thioxanthone ring, a thianthrene ring, a phenoxathiin group, a tetrahydrothiophenium ring, and a tetrahydrothiopyranium ring.

Each of $R^{208}$ to $R^{209}$ independently represents a hydrogen atom or an alkyl group having 1 to 5 carbon atoms. Of these, a hydrogen atom or an alkyl group having 1 to 3 carbon atoms is preferable. In the case where each of $R^{208}$ to $R^{209}$ is an alkyl group, they may be bonded to each other to form a ring.

$R^{210}$ represents an optionally substituted aryl group, an optionally substituted alkyl group, an optionally substituted alkenyl group, or an optionally substituted —$SO_2$—-containing cyclic group.

Examples of the aryl group in $R^{210}$ include an unsubstituted aryl group having 6 to 20 carbon atoms. Above all, a phenyl group or a naphthyl group is preferable.

Examples of the alkyl group in $R^{210}$ include a chain or cyclic alkyl group. Above all, an alkyl group having 1 to 30 carbon atoms is preferable.

The carbon number of the alkenyl group in $R^{210}$ is preferably 2 to 10.

Examples of the optionally substituted —$SO_2$—-containing cyclic group in $R^{210}$ include the same —$SO_2$—-containing cyclic groups as those as exemplified above for the "—$SO_2$—-containing cyclic group". Above all, the group represented by the general formula (a5-r-1) is preferable.

Each of $Y^{201}$s independently represents an arylene group, an alkylene group, or an alkenylene group.

Examples of the arylene group in $Y^{201}$ include a group in which one hydrogen atom is eliminated from an aryl group exemplified for the aromatic hydrocarbon group in $R^{101}$ in the foregoing formula (b-1).

Examples of the alkylene group and the alkenylene group in $Y^{201}$ include the same aliphatic hydrocarbon groups as those in the divalent hydrocarbon group in $V^1$ in the foregoing general formula (a0-1).

In the foregoing formula (ca-4), x is 1 or 2.

$W^{201}$ represents an (x+1)-valent (i.e., divalent or trivalent) linking group.

The divalent linking group in $W^{201}$ is preferably an optionally substituted divalent hydrocarbon group, and examples thereof include the same hydrocarbon groups as those exemplified for $Ya^{21}$ in the foregoing general formula (a2-1). The divalent linking group in $W^{201}$ may be linear, branched, or cyclic, and it is preferably cyclic. Above all, a group in which two carbonyl groups are combined at the both ends of an arylene group is preferable. Examples of the arylene group include a phenylene group and a naphthylene group, with a phenylene group being especially preferable.

Examples of the trivalent linking group in $W^{201}$ include a group in which one hydrogen atom is eliminated from the above-described divalent linking group in $W^{201}$ and a group in which the above-described divalent linking group is further bonded to the above-described divalent linking group. The trivalent linking group in $W^{201}$ is preferably a group in which two carbonyl groups are bonded to an arylene group.

Specifically, suitable examples of the cation represented by the formula (ca-1) include cations represented by the following formulae (ca-1-1) to (ca-1-67), respectively.

(Chemical formula 37)

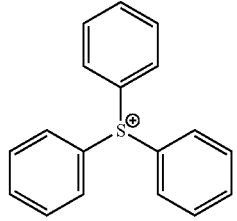
(ca-1-1)

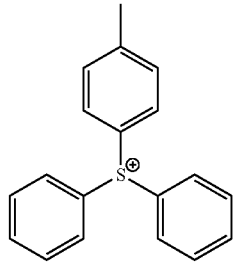
(ca-1-2)

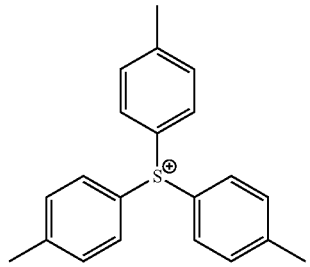
(ca-1-3)

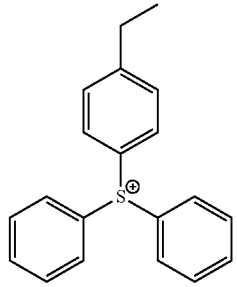
(ca-1-4)

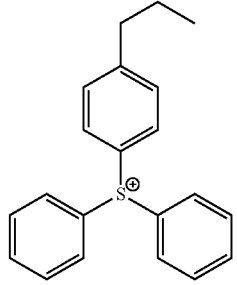
(ca-1-5)

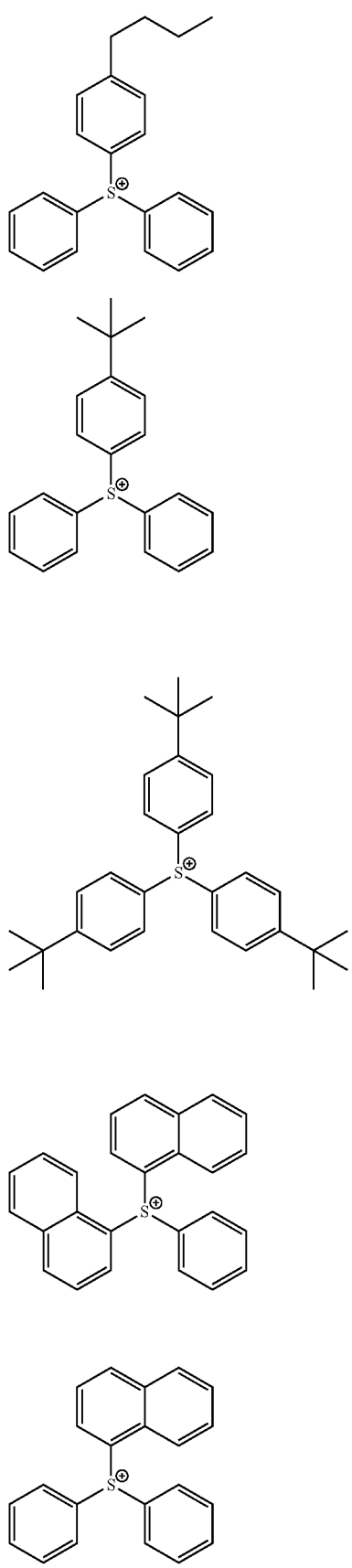
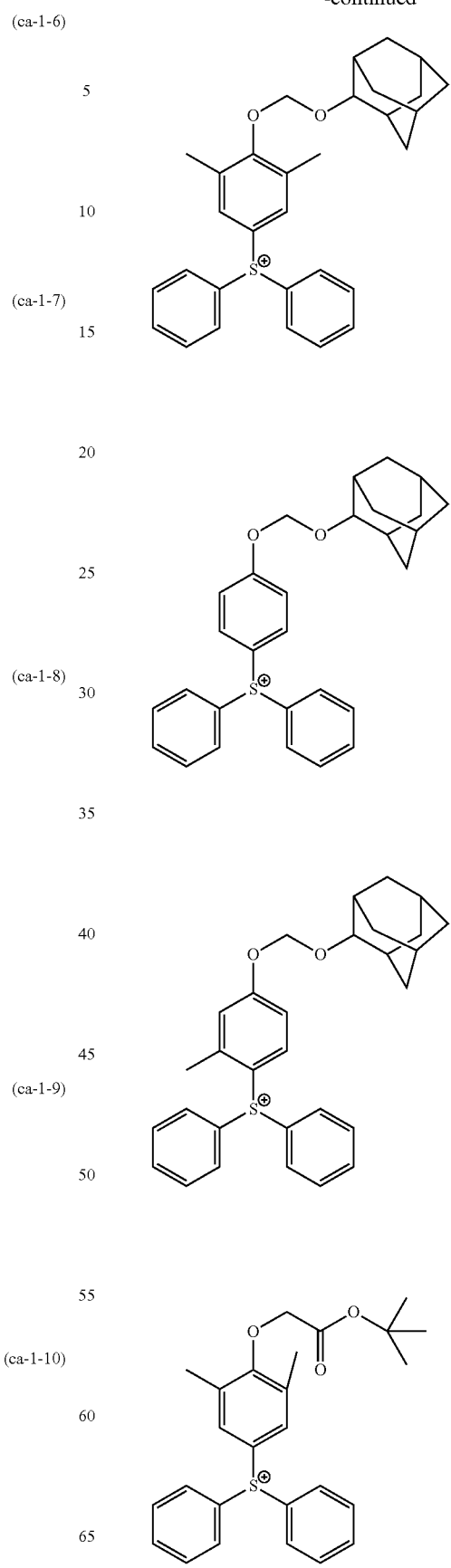

(ca-1-15)
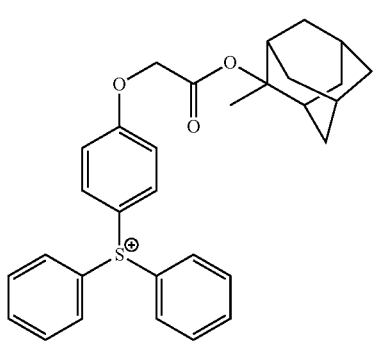
(ca-1-16)
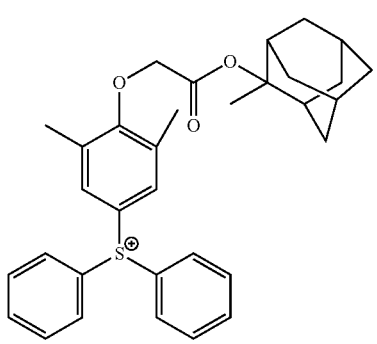
(Chemical formula 38)
(ca-1-17)
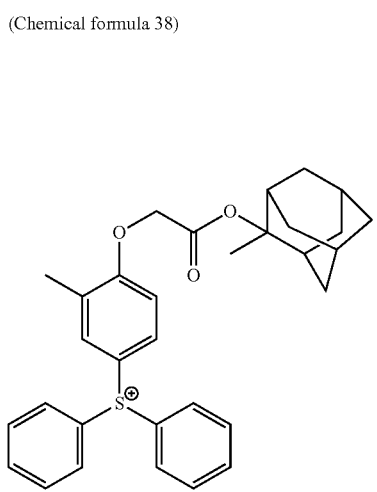
(ca-1-18)
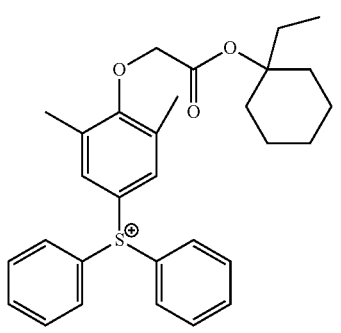
(ca-1-19)
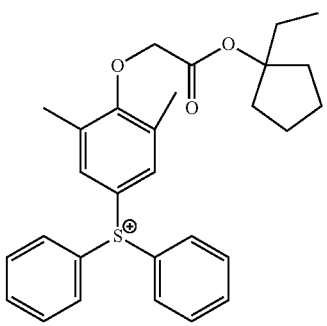
(ca-1-20)
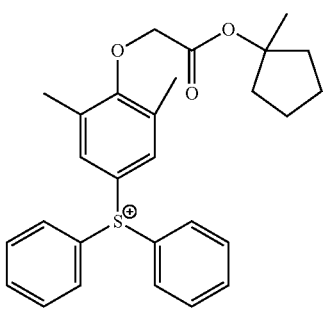
(ca-1-21)
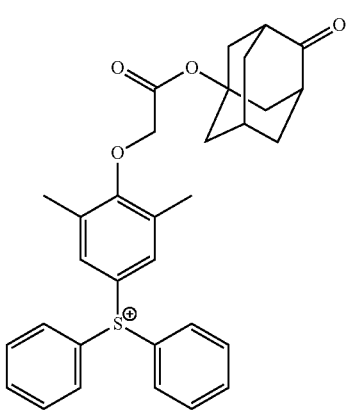
(ca-1-22)
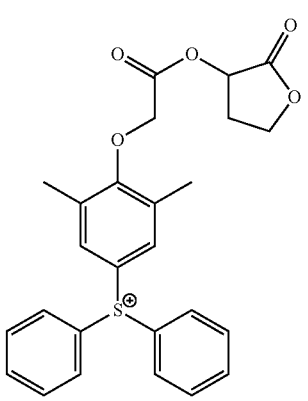

(ca-1-23)
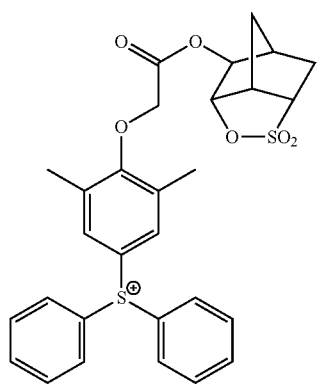
(ca-1-24)
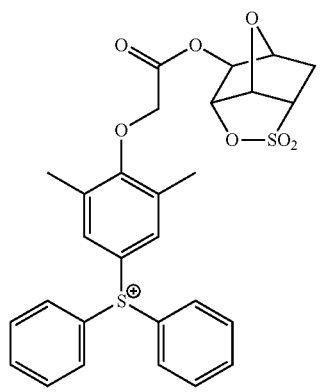
(ca-1-25)
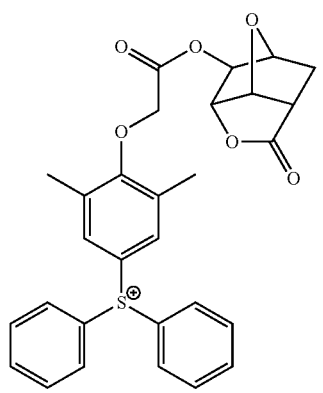
(ca-1-26)
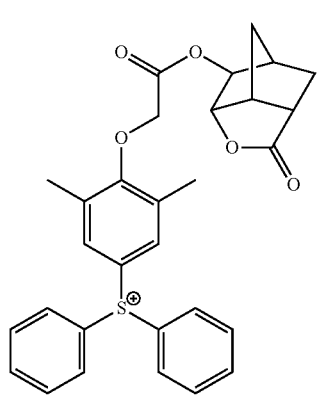
(ca-1-27)
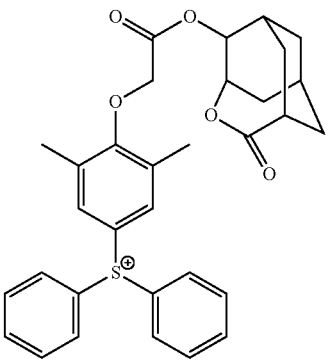
(ca-1-28)
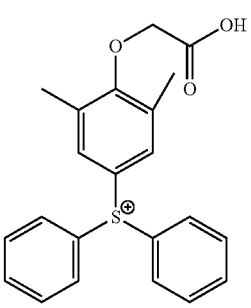
(ca-1-29)
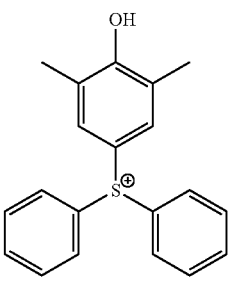
(ca-1-30)
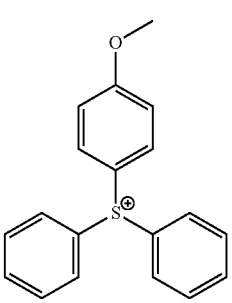
(ca-1-31)
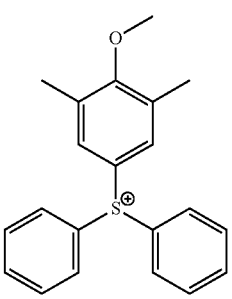

(ca-1-32)
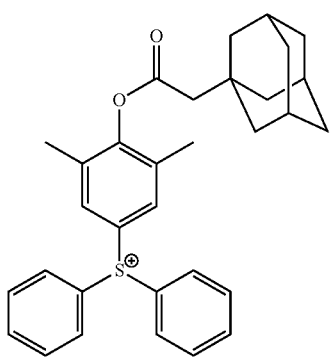
(ca-1-33)
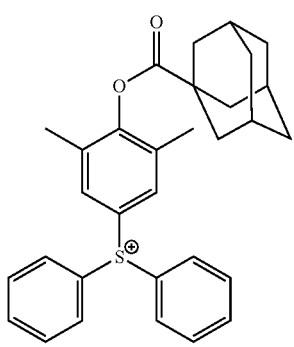
(Chemical formula 39)
(ca-1-34)
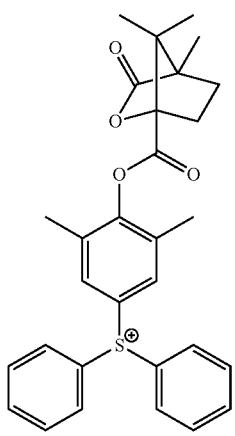
(ca-1-35)
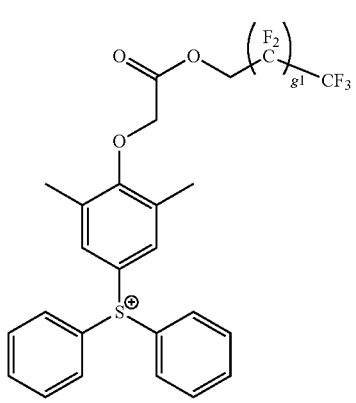
(ca-1-36)
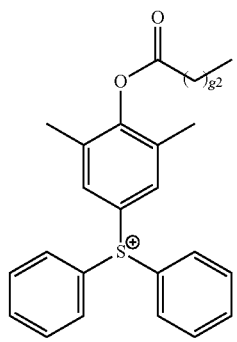
(ca-1-37)
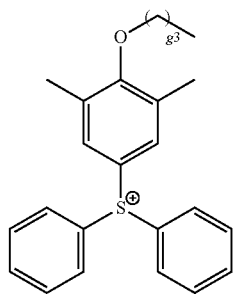
(ca-1-38)
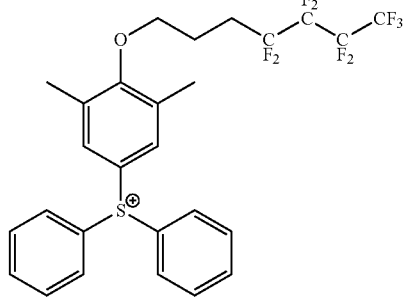
(ca-1-39)

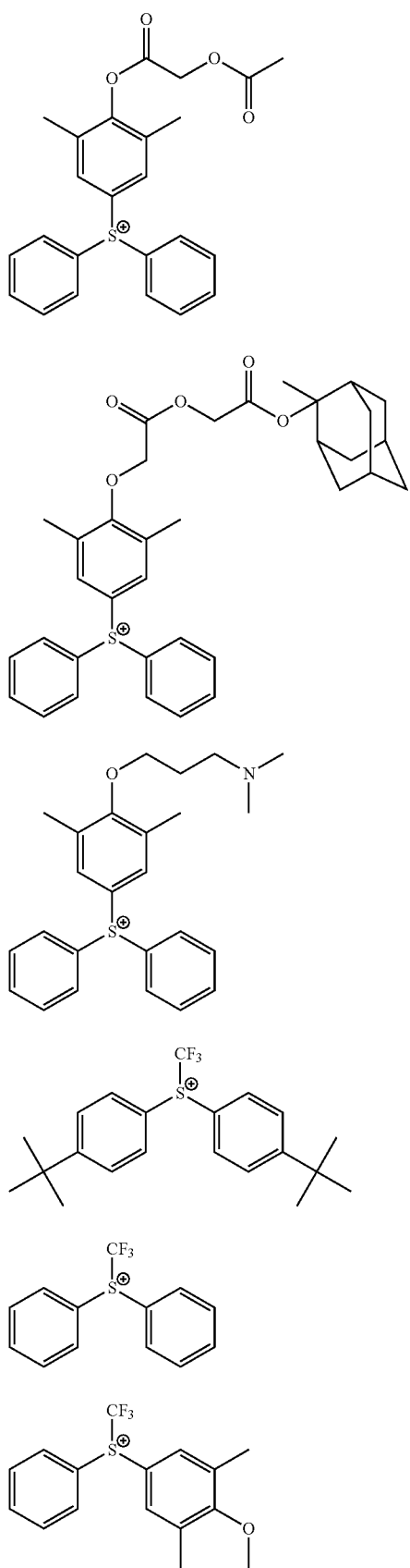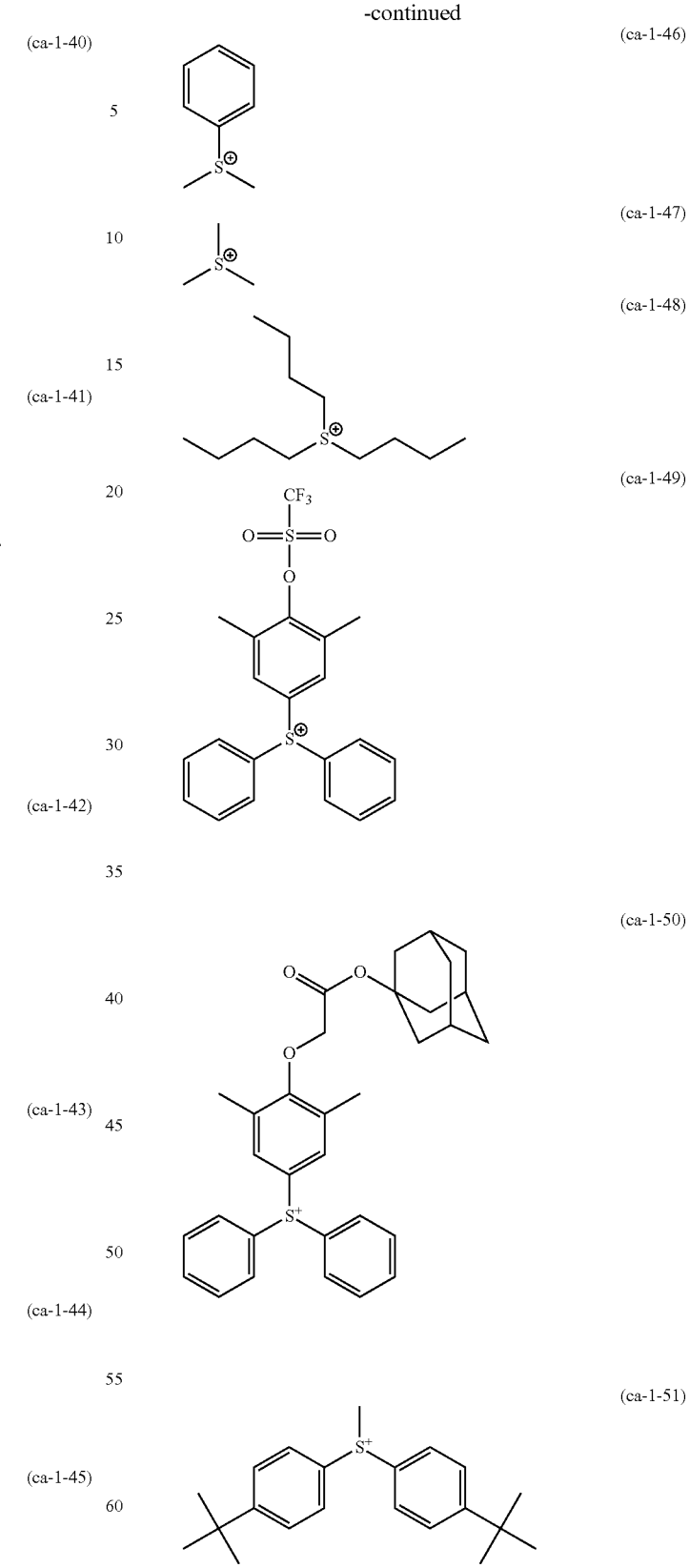
In the formulae, each of g1, g2, and g3 represents a repeating number; g1 is an integer of 1 to 5; g2 is an integer of 0 to 20; and g3 is an integer of 0 to 20.

(Chemical formula 40)
(ca-1-52)
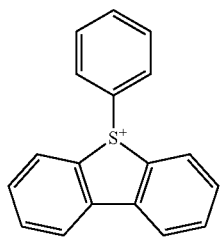
(ca-1-53)
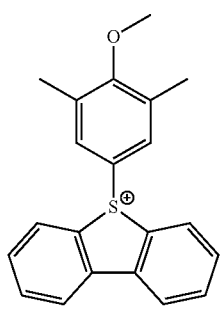
(ca-1-54)
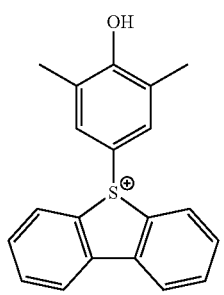
(ca-1-55)
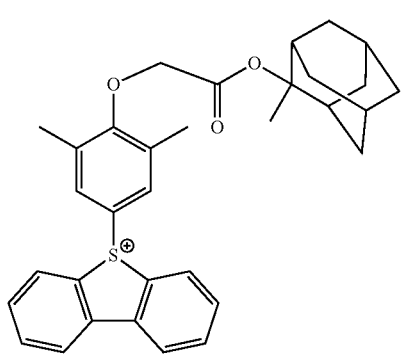
(ca-1-56)
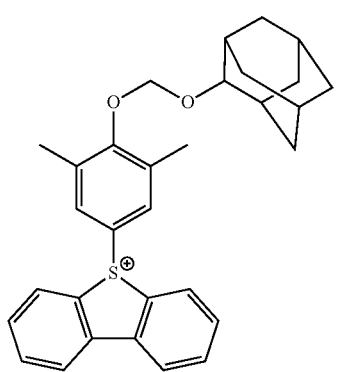
(ca-1-57)
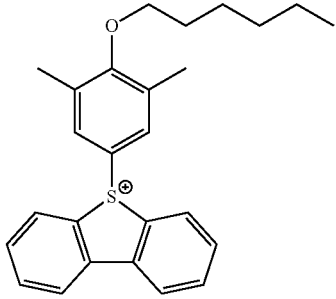
(ca-1-58)
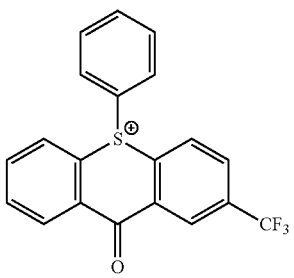
(ca-1-59)
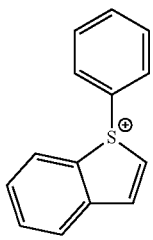
(ca-1-60)
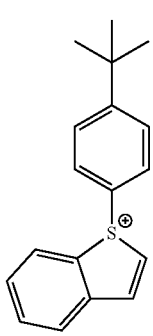
(ca-1-61)
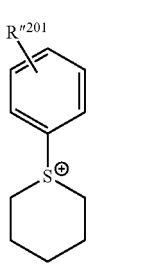

(ca-1-62)

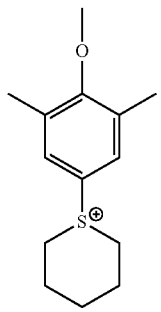

(ca-1-63)

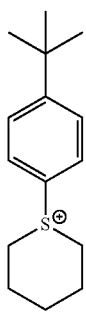

(ca-1-64)

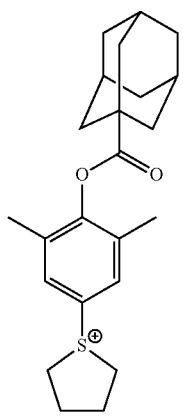

(ca-1-65)

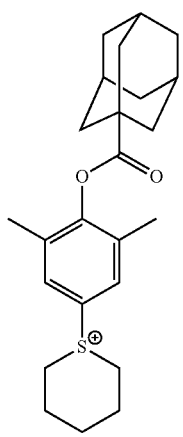

(ca-1-66)

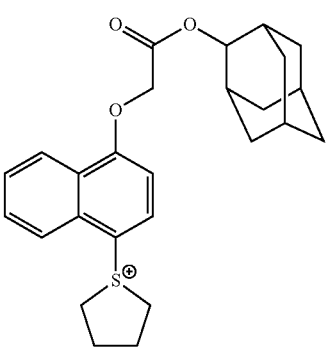

(ca-1-67)

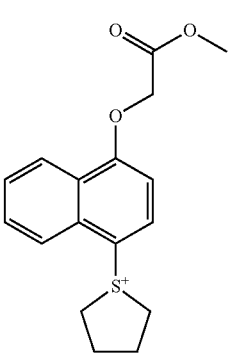

In the formulae, $R''^{201}$ represents a hydrogen atom or a substituent, and examples of the substituent include the same substituents as those exemplified above for the substituent which each of $R^{201}$ to $R^{207}$ and $R^{210}$ to $R^{212}$ may have.

Specifically, suitable examples of the cation represented by the foregoing formula (ca-2) include a diphenyl iodonium cation and a bis(4-tert-butylphenyl) iodonium cation.

Specifically, suitable examples of the cation represented by the foregoing formula (ca-3) include cations represented by the following formulae (ca-3-1) to (ca-3-6), respectively.

(Chemical formula 41)

(ca-3-1)

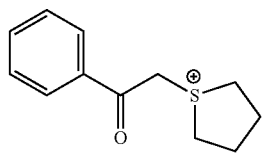

(ca-3-2)

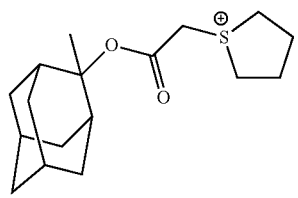

(ca-3-3)

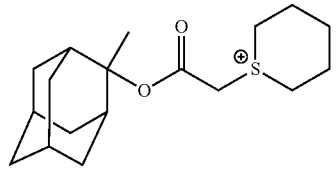

-continued

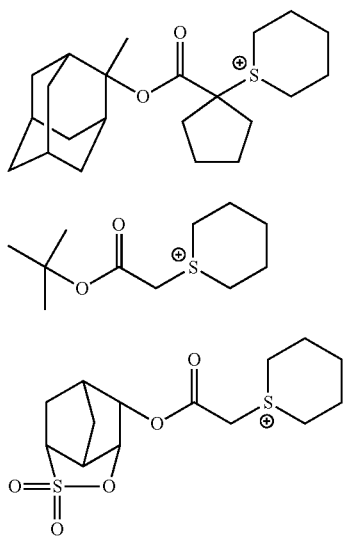

(ca-3-4)

(ca-3-5)

(ca-3-6)

Specifically, suitable examples of the cation represented by the foregoing formula (ca-4) include cations represented by the following formulae (ca-4-1) to (ca-4-2), respectively.

(Chemical formula 42)

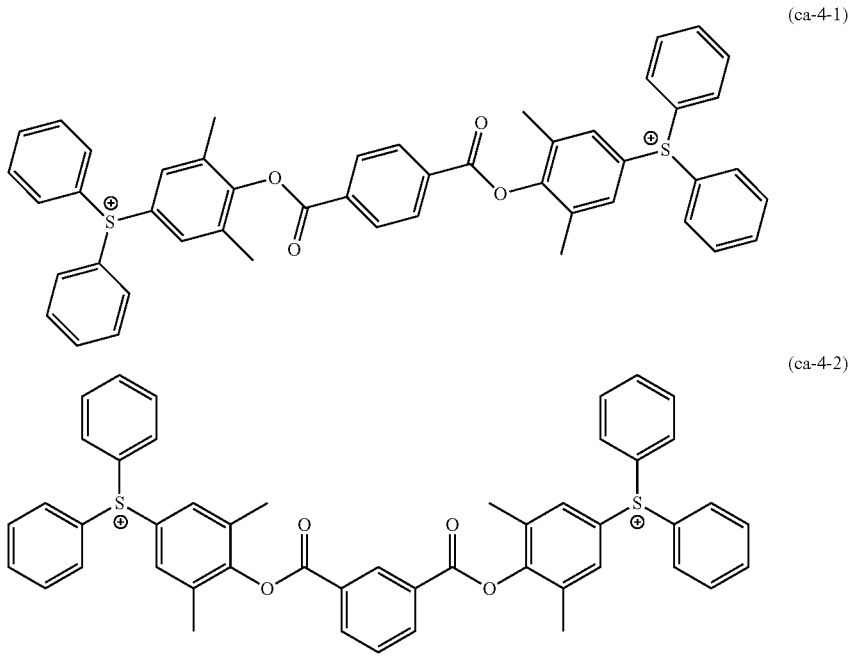

(ca-4-1)

(ca-4-2)

Among the foregoing, the cation moiety $[(M'''^{m+})_{1/m}]$ is preferably the cation represented by the general formula (ca-1), and more preferably the cation represented by each of the formulae (ca-1-1) to (ca-1-67).

As the component (B), the above-described acid generator may be used solely, or may be used in combination of two or more kinds thereof.

In the case where the resist composition contains the component (B), the content of the component (B) is preferably 0.5 to 60 mass parts, more preferably 1 to 50 mass parts, and still more preferably 1 to 40 mass parts based on 100 mass parts of the component (A).

By allowing the content of the component (B) to fall within the foregoing range, the pattern formation is sufficiently conducted. In addition, on the occasion of dissolving the respective components of the resist composition in an organic solvent, a uniform solution is obtained, and the storage stability becomes satisfactory, and hence, such is preferable.

(Component (D): Acid Diffusion Controlling Agent Component)

The resist composition which is used in the method for forming a resist pattern according to the present invention may also further contain, in addition to the component (A), or in addition to the components (A) and (B), an acid diffusion controlling agent component (hereinafter referred to "component (D)").

The component (D) acts as a quencher (acid diffusion controlling agent) which traps an acid generated in the resist composition upon exposure.

The component (D) may be a photodegradable base (D1) (hereinafter referred to as "component (D1)") which is decomposed upon exposure to lose acid diffusion controlling properties, or may be a nitrogen-containing organic compound (D2) (hereinafter referred to as "component (D2)") which does not fall under the definition of the component (D1).

Re: Component (D1)

When a resist composition containing the component (D1) is formed, on the occasion of forming a resist pattern, a contrast between exposed areas and unexposed areas can be enhanced.

Though the component (D1) is not particularly limited so long as it is decomposed upon exposure to lose acid diffusion controlling properties, the component (D1) is preferably at least one compound selected from the group consisting of a compound represented by the following general formula (d1-

1) (hereinafter referred to as "component (d1-1)"), a compound represented by the following general formula (d1-2) (hereinafter referred to as "component (d1-2)"), and a compound represented by the following general formula (d1-3) (hereinafter referred to as "component (d1-3)").

Each of the components (d1-1) to (d1-3) does not act as a quencher in exposed areas of the resist film because it is decomposed to lose acid diffusion controlling properties (basicity) but acts as a quencher in unexposed areas of the resist film.

(Chemical formula 43)

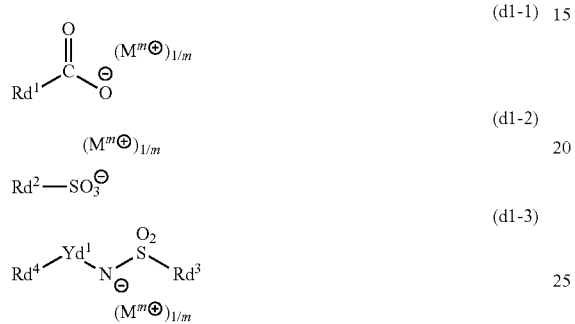

In the formulae, each of $Rd^1$ to $Rd^4$ represents an optionally substituted cyclic group, an optionally substituted chain alkyl group, or an optionally substituted chain alkenyl group, provided that a fluorine atom is not bonded to the carbon atom adjacent to the S atom in $Rd^2$ in the formula (d1-2). $Yd^1$ represents a single bond or a divalent linking group. m is an integer of 1 or more, and each of $M^{m+}$s independently represents an m-valent organic cation.

{Component (d1-1)}

Anion Moiety:

In the formula (d1-1), $Rd^1$ represents an optionally substituted cyclic group, an optionally substituted chain alkyl group, or an optionally substituted chain alkenyl group, and examples thereof include the same groups as those in $R^{101}$ in the foregoing formula (b-1).

Above all, $Rd^1$ is preferably an optionally substituted aromatic hydrocarbon group, an optionally substituted aliphatic cyclic group, or an optionally substituted chain alkyl group. The substituent which each of these groups may have is preferably a hydroxyl group, a fluorine atom, or a fluorinated alkyl group.

The aromatic hydrocarbon group is more preferably a phenyl group or a naphthyl group.

The aliphatic cyclic group is more preferably a group in which one or more hydrogen atoms are eliminated from a polycycloalkane such as adamantane, norbornane, isobornane, tricyclodecane, and tetracyclododecane.

The chain alkyl group is preferably a chain alkyl group having 1 to 10 carbon atoms. Specifically, examples thereof include a linear alkyl group such as a methyl group, an ethyl group, a propyl group, a butyl group, a pentyl group, a hexyl group, a heptyl group, an octyl group, a nonyl group, and a decyl group; and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

In the case where the chain alkyl group is a fluorinated alkyl group having, as a substituent, a fluorine atom or a fluorinated alkyl group, the carbon number of the fluorinated alkyl group is preferably 1 to 11, more preferably 1 to 8, and still more preferably 1 to 4. The fluorinated alkyl group may also contain an atom other than a fluorine atom. Examples of the atom other than a fluorine atom include an oxygen atom, a carbon atom, a hydrogen atom, a sulfur atom, and a nitrogen atom.

$Rd^1$ is preferably a fluorinated alkyl group in which a part or all of hydrogen atoms constituting a linear alkyl group are substituted with a fluorine atom, and more preferably a fluorinated alkyl group (linear perfluoroalkyl group) in which all of hydrogen atoms constituting a linear alkyl group are substituted with a fluorine atom.

Preferred specific examples of the anion moiety of the component (d1-1) are given below.

(Chemical formula 44)

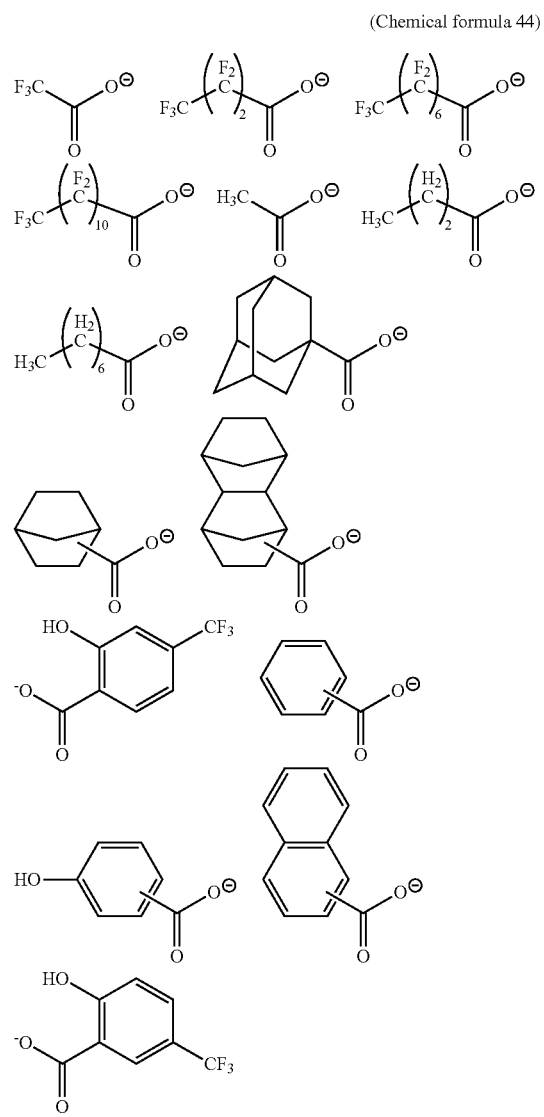

Cation Moiety:

In the formula (d1-1), $M^{m+}$ represents an m-valent organic cation.

Suitable examples of the organic cation represented by $M^{m+}$ include the same cations as those represented by the general formulae (ca-1) to (ca-4), respectively. Of these, cations represented by the foregoing formulae (ca-1-1) to (ca-1-67), respectively are more preferable.

The component (d1-1) may be used solely, or may be used in combination of two or more kinds thereof.

{Component (d1-2)}

Anion Moiety:

In the formula (d1-2), $Rd^2$ represents an optionally substituted cyclic group, an optionally substituted chain alkyl group, or an optionally substituted chain alkenyl group, and examples thereof include the same groups as those in $R^{101}$ in the foregoing formula (b-1).

However, a fluorine atom is not bonded to (not substituted on) the carbon atom adjacent to the S atom in $Rd^2$. According to this, the anion of the component (d1-2) becomes an appropriately weak acid anion, whereby the quenching ability as the component (D) is enhanced.

$Rd^2$ is preferably an optionally substituted chain alkyl group or an optionally substituted aliphatic cyclic group. The chain alkyl group is preferably one having 1 to 10 carbon atoms, and more preferably one having 3 to 10 carbon atoms. The aliphatic cyclic group is more preferably a group in which one or more hydrogen atoms are eliminated from adamantane, norbornane, isobornane, tricyclodecane, tetracyclododecane, or the like (the group may have a substituent), or a group in which one or more hydrogen atoms are eliminated from camphor or the like.

The hydrocarbon group represented by $Rd^2$ may have a substituent. Examples of the substituent include the same groups as those exemplified above for the substituent which the hydrocarbon group (aromatic hydrocarbon group or aliphatic hydrocarbon group) represented by $Rd^1$ in the foregoing formula (d1-1) may have.

Preferred specific examples of the anion moiety of the component (d1-2) are given below.

(Chemical formula 45)

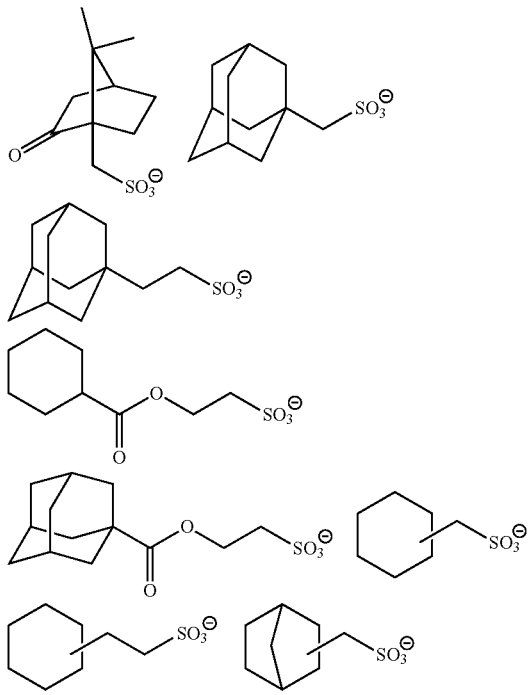
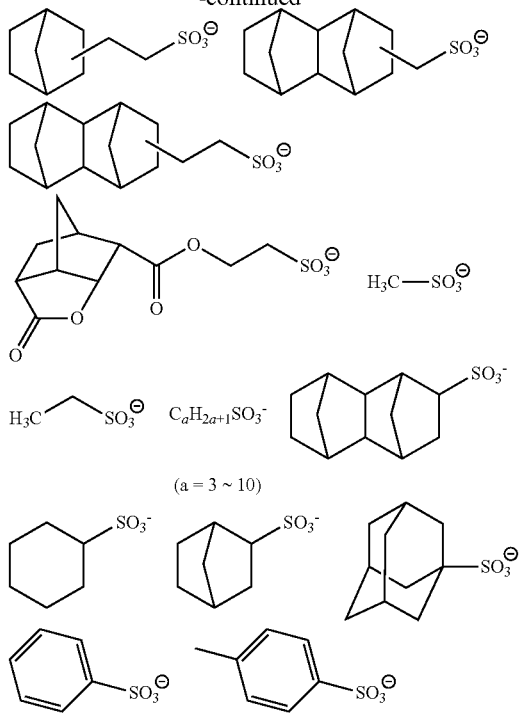

Cation Moiety:

In the formula (d1-2), $M^{m+}$ represents an m-valent organic cation and is the same as $M^{m+}$ in the foregoing formula (d1-1).

The component (d1-2) may be used solely or in combination of two or more kinds thereof.

{Component (d1-3)}

Anion Moiety:

In the formula (d1-3), $Rd^3$ represents an optionally substituted cyclic group, an optionally substituted chain alkyl group, or an optionally substituted chain alkenyl group, and examples thereof include the same groups as those in $R^{101}$ in the foregoing formula (b-1). $Rd^3$ is preferably a cyclic group, a chain alkyl group, or a chain alkenyl group, each of which contains a fluorine atom. Above all, $Rd^3$ is preferably a fluorinated alkyl group, and more preferably the same fluorinated alkyl group as that represented by $Rd^1$ as described above.

In the formula (d1-3), $Rd^4$ represents an optionally substituted cyclic group, an optionally substituted chain alkyl group, or an optionally substituted chain alkenyl group, and examples thereof include the same groups as those in $R^{101}$ in the foregoing formula (b-1).

Above all, $Rd^4$ is preferably an alkyl group, an alkoxy group, an alkenyl group, or a cyclic group, each of which may have a substituent.

The alkyl group in $Rd^4$ is preferably a linear or branched alkyl group having 1 to 5 carbon atoms. Specifically, examples thereof include a methyl group, an ethyl group, a propyl group, an isopropyl group, an n-butyl group, an isobutyl group, a tert-butyl group, a pentyl group, an isopentyl group, and a neopentyl group. A part of the hydrogen atoms of the alkyl group represented by $Rd^4$ may be substituted with a hydroxyl group, a cyano group, or the like.

The alkoxy group in $Rd^4$ is preferably an alkoxy group having 1 to 5 carbon atoms. Specifically, examples of the alkoxy group having 1 to 5 carbon atoms include a methoxy group, an ethoxy group, an n-propoxy group, an isopropoxy group, an n-butoxy group, and a tert-butoxy group. Above all, a methoxy group or an ethoxy group is preferable.

Examples of the alkenyl group in Rd$^4$ include the same groups as those in R$^{101}$ in the foregoing formula (b-1). Above all, a vinyl group, a propenyl group (allyl group), a 1-methylpropenyl group, and a 2-methylpropenyl group are preferable. Each of these groups may further have, as a substituent, an alkyl group having 1 to 5 carbon atoms or a halogenated alkyl group having 1 to 5 carbon atoms.

Examples of the cyclic group in Rd$^4$ include the same groups as those in R$^{101}$ in the foregoing formula (b-1). Above all, an alicyclic group in which one or more hydrogen atoms are eliminated from a cycloalkane such as cyclopentane, cyclohexane, adamantane, norbornane, isobornane, tricyclodecane, and tetracyclododecane, or an aromatic group such as a phenyl group and a naphthyl group is preferable. In the case where Rd$^4$ is an alicyclic group, in view of the fact that the resist composition is well dissolved in an organic solvent, the lithography properties become satisfactory. In addition, in the case where Rd$^4$ is an aromatic group, in the lithography using EUV or the like as an exposure light source, the resist composition exhibits excellent light absorption efficiency, and the sensitivity and lithography properties become satisfactory.

In the formula (d1-3), Yd$^1$ represents a single bond or a divalent linking group.

Though the divalent linking group in Yd$^1$ is not particularly limited, examples thereof include an optionally substituted divalent hydrocarbon group (aliphatic hydrocarbon group or aromatic hydrocarbon group) and a divalent linking group containing a hetero atom. Examples of each of these groups include the same groups as those in the optionally substituted divalent hydrocarbon group and the divalent linking group containing a hetero atom exemplified above in the explanation regarding the divalent linking group represented by Ya$^{21}$ in the foregoing formula (a2-1).

Yd$^1$ is preferably a carbonyl group, an ester bond, an amide bond, an alkylene group, or a combination thereof. The alkylene group is more preferably a linear or branched alkylene group, and still more preferably a methylene group or an ethylene group.

Preferred specific examples of the anion moiety of the component (d1-3) are given below.

(Chemical formula 46)

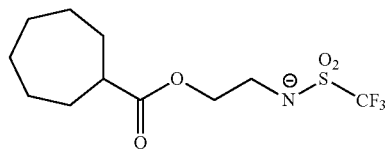

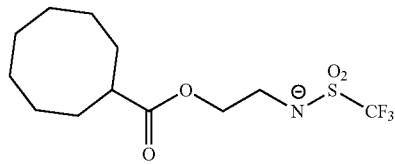

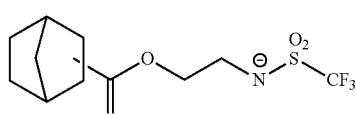

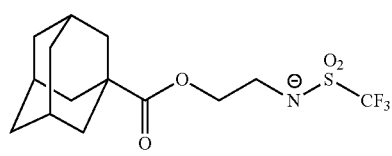

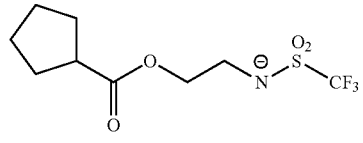

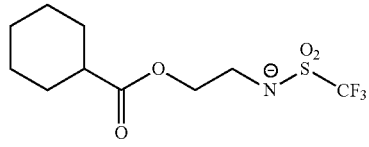

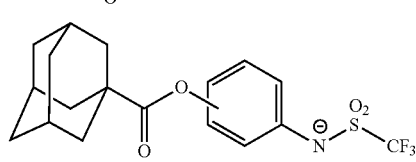

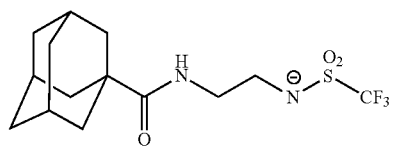

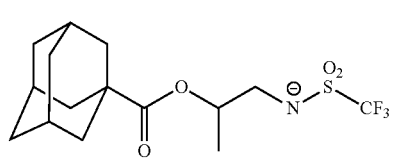

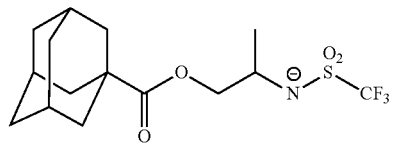

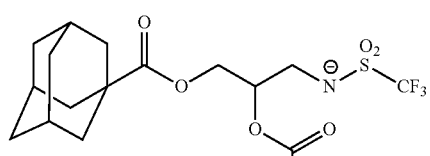

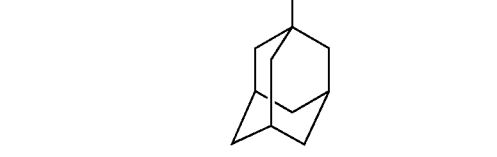

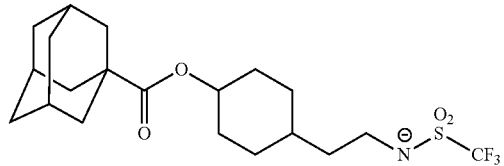

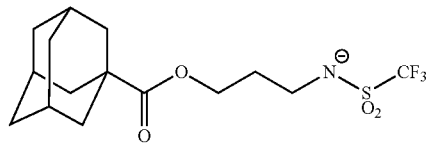

-continued

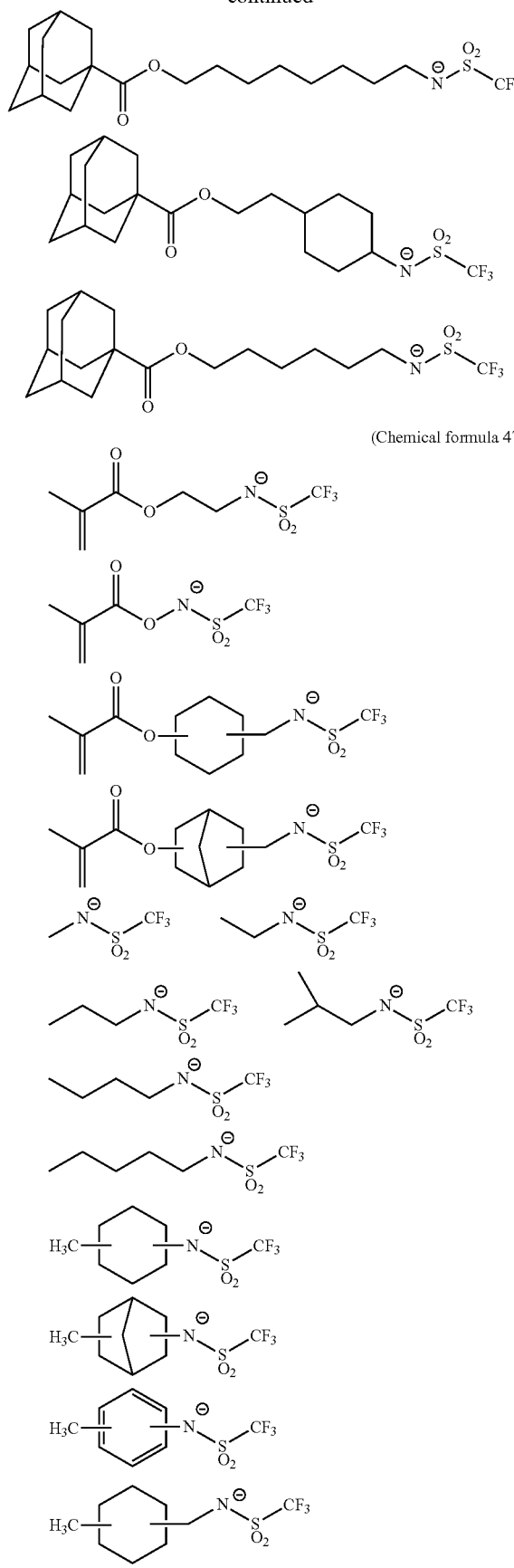

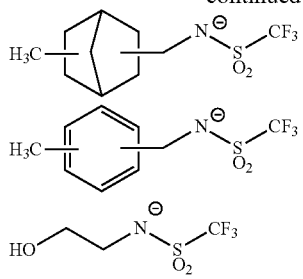

(Chemical formula 47)

Cation Moiety:

In the formula (d1-3), $M^{m+}$ represents an m-valent organic cation and is the same as $M^{m+}$ in the foregoing formula (d1-1).

The component (d1-3) may be used solely, or may be used in combination of two or more kinds thereof.

As the component (D1), only one kind of the components (d1-1) to (d1-3) may be used, or a combination of two or more kinds thereof may also be used.

In the case where the resist composition contains the component (D1), the content of the component (D1) is preferably 0.5 to 10 mass parts, more preferably 0.5 to 8 mass parts, and still more preferably 1 to 8 mass parts based on 100 mass parts of the component (A).

When the content of the component (D1) is the preferred lower limit value or more, especially satisfactory lithography properties and resist pattern shape are obtained. On the other hand, when it is not more than the upper limit value, the sensitivity can be maintained at a satisfactory level, and the throughput becomes excellent.

(Production Method of Component (D1))

A production method of each of the above-described component (d1-1) and component (d1-2) is not particularly limited, and each of the component (d1-1) and the component (d1-2) can be produced by a known method.

In addition, a production method of the component (d1-3) is not particularly limited, and the component (d1-3) is produced in the same method as a method disclosed in, for example, US-A-2012-0149916.

Re: Component (D2)

As the acid diffusion controlling agent component, a nitrogen-containing organic compound component (hereinafter referred to as "component (D2)") which does not fall under the definition of the above-described component (D1) may be contained.

The component (D2) is not particularly limited so long as it acts as an acid diffusion controlling agent and does not fall under the definition of the component (D1), and any known compound may be arbitrarily used. Above all, an aliphatic amine, in particular, a secondary aliphatic amine or a tertiary aliphatic amine, is preferable.

The aliphatic amine refers to an amine having one or more aliphatic groups, and the carbon number of the aliphatic group is preferably 1 to 12.

Examples of the aliphatic amine include an amine in which at least one of hydrogen atoms of ammonia $NH_3$ is substituted with an alkyl group or a hydroxyalkyl group each having not more than 12 carbon atoms (i.e., an alkylamine or an alkyl alcoholamine) and a cyclic amine.

Specific examples of the alkylamine and the alkyl alcoholamine include a monoalkylamine such as n-hexylamine, n-heptylamine, n-octylamine, n-nonylamine, and n-decylamine; a dialkylamine such as diethylamine, di-n-propylamine, di-n-heptylamine, di-n-octylamine, and dicyclohexylamine; a trialkylamine such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, and tri-n-dodecylamine; and an alkyl alcoholamine such as diethanolamine, triethanolamine, diisopropanolamine, triisopropanolamine, di-n-octanolamine, and tri-n-octanolamine. Of these, a trialkylamine having 5 to 10 carbon atoms is more preferable, and tri-n-pentylamine or tri-n-octylamine is especially preferable.

Examples of the cyclic amine include a heterocyclic compound containing a nitrogen atom as a hetero atom. The heterocyclic compound may be a monocyclic compound (aliphatic monocyclic amine), or may be a polycyclic compound (aliphatic polycyclic amine).

Specifically, examples of the aliphatic monocyclic amine include piperidine and piperazine.

The aliphatic polycyclic amine is preferably an aliphatic polycyclic amine having 6 to 10 carbon atoms. Specifically, examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, and triethanolamine triacetate, with triethanolamine triacetate being preferable.

In addition, an aromatic amine may also be used as the component (D2).

Examples of the aromatic amine include 4-dimethylaminopyridine, pyrrole, indole, pyrazole, imidazole, and derivatives thereof, as well as tribenzylamine, 2,6-diisopropylaniline, and N-tert-butoxycarbonylpyrrolidine.

The component (D2) may be used solely, or may be used in combination of two or more kinds thereof.

In the case where the resist composition contains the component (D2), the component (D2) is generally used in an amount in the range of 0.01 to 5 mass parts based on 100 mass parts of the component (A). When the amount of the component (D2) falls within the foregoing range, the resist pattern shape, the post-exposure temporal stability, and the like are enhanced.

(Component (E): at least one compound selected from the group consisting of an organic carboxylic acid and a phosphorus oxo acid or a derivative thereof)

For the purposes of preventing deterioration in sensitivity and enhancing the resist pattern shape, the post-exposure temporal stability, and the like, the resist composition which is used in the method for forming a resist pattern according to the present invention can contain, as an optional component, at least one compound (E) (hereafter referred to as "component (E)") selected from the group consisting of an organic carboxylic acid and a phosphorus oxo acid or a derivative thereof.

Suitable examples of the organic carboxylic acid include acetic acid, malonic acid, citric acid, malic acid, succinic acid, benzoic acid, and salicylic acid.

Examples of the phosphorus oxo acid include phosphoric acid, phosphonic acid, and phosphinic acid, with phosphonic acid being especially preferable.

Examples of the phosphorus oxo acid derivative include an ester in which a hydrogen atom of the above-described oxo acid is substituted with a hydrocarbon group. Examples of the hydrocarbon group include an alkyl group having 1 to 5 carbon atoms and an aryl group having 6 to 15 carbon atoms.

Examples of the phosphoric acid derivative include a phosphoric acid ester such as di-n-butyl phosphate and diphenyl phosphate.

Examples of the phosphonic acid derivative include a phosphonic acid ester such as dimethylphosphonate, di-n-butyl phosphonate, phenylphosphonic acid, diphenyl phosphonate, and dibenzyl phosphonate.

Examples of the phosphinic acid derivative include a phosphinic acid ester and phenylphosphinic acid.

The component (E) may be used solely, or may be used in combination of two or more kinds thereof.

In the case where the resist composition contains the component (E), in general, the component (E) is used in an amount in the range of 0.01 to 5 mass parts based on 100 mass parts of the component (A).

(Component (F): fluorine additive)

For the purpose of imparting water repellency to the resist film, the resist composition which is used in the method for forming a resist pattern according to the present invention may contain a fluorine additive (hereinafter referred to as "component (F)").

As the component (F), fluorine-containing high-molecular weight compounds disclosed in, for example, JP-A-2010-002870, JP-A-2010-032994, JP-A-2010-277043, JP-A-2011-13569, and JP-A-2011-128226 can be used.

More specifically, examples of the compound (F) include a polymer having a constituent unit (f1) represented by the following formula (f1-1). The polymer is preferably a polymer (homopolymer) composed of only the constituent unit (f1) represented by the following formula (f1-1); a copolymer of the constituent unit (f1) and the constituent unit (a1); or a copolymer of the constituent unit (f1), a constituent unit derived from acrylic acid or methacrylic acid, and the constituent unit (a1). Here, the constituent unit (a1) which is copolymerized with the constituent unit (f1) is preferably a constituent unit derived from 1-ethyl-1-cyclooctyl (meth)acrylate.

(Chemical formula 48)

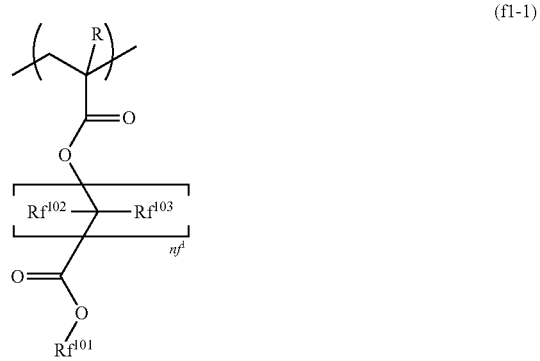

(f1-1)

In the formula, R is the same as that described above; each of $Rf^{102}$ and $Rf^{103}$ independently represents a hydrogen atom, a halogen atom, an alkyl group having 1 to 5 carbon atoms, or a halogenated alkyl group having 1 to 5 carbon atoms, and $Rf^{102}$ and $Rf^{103}$ may be the same as or different from each other; $nf^1$ is an integer of 1 to 5; and $Rf^{101}$ represents an organic group containing a fluorine atom.

In the formula (f1-1), R which is bonded to the carbon atom at the α-position is the same as that described above. R is preferably a hydrogen atom or a methyl group.

In the formula (f1-1), examples of the halogen atom represented by $Rf^{102}$ and $Rf^{103}$ include a fluorine atom, a chlorine atom, a bromine atom, and an iodine atom, with a fluorine atom being especially preferable. Examples of the alkyl group having 1 to 5 carbon atoms, as represented by $Rf^{102}$ and $Rf^{103}$, include the same groups as those exemplified above for the alkyl group having 1 to 5 carbon atoms, as represented by R. Of these, a methyl group or an ethyl group is preferable. Specifically, examples of the halogenated alkyl group having 1 to 5 carbon atoms, as represented by $Rf^{102}$ and $Rf^{103}$, include a group in which a part or all of the hydrogen atoms of the above-described alkyl group having 1 to 5 carbon atoms are substituted with a halogen atom. Examples of the halogen atom include a fluorine atom, a chlorine atom, a bromine atom, and an iodine atom, with a fluorine atom being especially preferable. Above all, as $Rf^{102}$ and $Rf^{103}$, a hydrogen atom, a fluorine atom, or an alkyl group having 1 to 5 carbon atoms is preferable, and a hydrogen atom, a fluorine atom, a methyl group, or an ethyl group is more preferable.

In the formula (f1-1), $nf^1$ is an integer of 1 to 5, preferably an integer of 1 to 3, and more preferably 1 or 2.

In the formula (f1-1), $Rf^{101}$ represents an organic group containing a fluorine atom and is preferably a hydrocarbon group containing a fluorine atom.

The hydrocarbon group containing a fluorine atom may be linear, branched, or cyclic, and the carbon number thereof is preferably 1 to 20, more preferably 1 to 15, and especially preferably from 1 to 10.

In addition, in the hydrocarbon group containing a fluorine atom, it is preferable that 25% or more of the hydrogen atoms in the hydrocarbon group are fluorinated; it is more preferable that 50% or more of the hydrogen atoms in the hydrocarbon group are fluorinated; and in view of the fact that the hydrophobicity of the resist film at the time of immersion exposure is increased, it is especially preferable that 60% or more of the hydrogen atoms in the hydrocarbon group are fluorinated.

Above all, $Rf^{101}$ is more preferably a fluorinated hydrocarbon group having 1 to 5 carbon atoms, and especially preferably a trifluoromethyl group, $-CH_2-CF_3$, $-CH_2-CF_2-CF_3$, $-CH(CF_3)_2$, $-CH_2-CH_2-CF_3$, or $-CH_2-CH_2-CF_2-CF_2-CF_2-CF_3$.

A mass average molecular weight (Mw) (as converted into standard polystyrene by means of gel permeation chromatography) of the component (F) is preferably 1,000 to 50,000, more preferably 5,000 to 40,000, and most preferably 10,000 to 30,000. When the mass average molecular weight of the component (F) is not more than the upper limit value of this range, sufficient solubility in a resist solvent for the use as a resist is exhibited, whereas when it is the lower limit value of this range or more, the dry etching resistance and the cross-sectional shape of a resist pattern are satisfactory.

A degree of dispersion (Mw/Mn) of the component (F) is preferably 1.0 to 5.0, more preferably 1.0 to 3.0, and most preferably 1.2 to 2.5.

The component (F) may be used solely, or may be used in combination of two or more kinds thereof.

In the case where the resist composition contains the component (F), in general, the component (F) is used in a proportion of 0.5 to 10 mass parts based on 100 mass parts of the component (A).

(Component (S): Organic Solvent)

The resist composition which is used in the method for forming a resist pattern according to the present invention can be produced by dissolving the resist materials in an organic solvent (hereafter sometimes referred to as "component (S)").

The component (S) may be any organic solvent so long as it is able to dissolve the respective components to be used to give a uniform solution, and any arbitrary one or two or more kinds of organic solvents can be appropriately selected from those which have been conventionally known as solvents for a chemically amplified resist.

Examples of the component (S) include a lactone such as γ-butyrolactone; a ketone such as acetone, methyl ethyl ketone, cyclohexanone, methyl n-pentyl ketone, methyl isopentyl ketone, and 2-heptanone; a polyhydric alcohol such as ethylene glycol, diethylene glycol, propylene glycol, and dipropylene glycol; a compound having an ester bond, such as ethylene glycol monoacetate, diethylene glycol monoacetate, propylene glycol monoacetate, and dipropylene glycol monoacetate; a polyhydric alcohol derivative including a compound having an ether bond, such as a monoalkyl ether (for example, monomethyl ether, monoethyl ether, monopropyl ether, or monobutyl ether) or monophenyl ether of the above-described polyhydric alcohol or the above-described compound having an ester bond [of these, propylene glycol monomethyl ether acetate (PGMEA) or propylene glycol monomethyl ether (PGME) is preferable]; a cyclic ether such as dioxane; an ester such as methyl lactate, ethyl lactate (EL), methyl acetate, ethyl acetate, butyl acetate, methyl pyruvate, ethyl pyruvate, methyl methoxypropionate, and ethyl ethoxypropionate; an aromatic organic solvent such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene, and mesitylene; and dimethyl sulfoxide (DMSO).

The component (S) may be used solely, or may be used as a mixed solvent of two or more kinds thereof.

Above all, PGMEA, PGME, γ-butyrolactone, EL, or cyclohexanone is preferable.

In addition, a mixed solvent obtained by mixing PGMEA with a polar solvent is also preferable. Though a blending ratio (mass ratio) of the mixed solvent may be appropriately determined while taking into consideration the compatibility of PGMEA with the polar solvent or the like, it is preferable to allow the blending ratio to fall within the range of 1/9 to 9/1, and more preferably 2/8 to 8/2.

More specifically, in the case where EL or cyclohexanone is blended as the polar solvent, a mass ratio of PGMEA to EL or cyclohexanone is preferably 1/9 to 9/1, and more preferably 2/8 to 8/2. In addition, in the case where PGME is blended as the polar solvent, amass ratio of PGMEA to PGME is preferably 1/9 to 9/1, more preferably 2/8 to 8/2, and still more preferably 3/7 to 7/3. Furthermore, a mixed solvent of PGMEA, PGME, and cyclohexanone is also preferable.

In addition, as the component (S), besides, a mixed solvent of at least one member selected from PGMEA and EL with γ-butyrolactone is also preferable. In that case, a mixing proportion is preferably 70/30 to 95/5 in terms of amass ratio of the former to the latter.

The use amount of the component (S) is not particularly limited, and it is properly set in a concentration at which coating on a substrate or the like can be conducted, according to the thickness of the coating film. In general, the component (S) is used such that the solid content of the resist composition falls within the range of 1 to 20 mass %, and preferably 2 to 15 mass %.

In the resist composition which is used in the method for forming a resist pattern according to the present invention, if desired, miscible additives, for example, an additional resin for improving the performance of the resist film, a dissolution inhibitor, a plasticizer, a stabilizer, a coloring agent, a halation inhibitor, a dye, and the like can be properly added and contained.

According to the method for forming a resist pattern as explained above, a negative type resist pattern having a high residual film rate of exposed areas of a resist film can be formed in the resist pattern formation by means of negative type development with an organic developing solution.

On the occasion of applying a negative type development process composed of a combination of a chemically amplified resist composition which is used in a positive type development process which has hitherto been the mainstream with an organic developing solution, thereby forming a negative type resist pattern, there is involved such a problem that a resist film is shrunk due to influences of heating after exposure and development, thereby easily causing film reduction of exposed areas of the resist film.

In the method for forming a resist pattern according to the present invention, a resist composition containing the high-molecular weight compound (A1) having the constituent unit (a0) represented by the general formula (a0-1) is used. The constituent unit (a0) has an acetal type acid dissociable group represented by "—$C(R^2)(R^3)$—O—$(CH_2)_{n2}$—$R^1$"

On the occasion of applying a negative type developing process using such a resist composition, thereby forming a negative type resist pattern, the constituent unit (a0) is decomposed by a post exposure bake (PEB) treatment, thereby forming an alcohol body "HO—$(CH_2)_{n2}$—$R^1$". This alcohol body has a high boiling point, and hence, it is hardly gasified.

In addition to the above, in view of the fact that $R^1$ is a lactone-containing cyclic group, an —$SO_2$—containing cyclic group, or a carbonate-containing cyclic group, a polar group is present in the alcohol body. Namely, on the occasion of negative type development with an organic developing solution, the alcohol body is hardly dissolved in the organic developing solution.

For that reason, in the present invention, on the occasion of forming a negative type resist pattern, the resist film is hardly affected by heating after exposure and development, so that the shrinkage thereof is suppressed. According to this, it is assumed that a negative type resist pattern having a high residual film rate of exposed areas of the resist film is formed.

In addition to the above, according to the method for forming a resist pattern according to the present invention, a negative type resist pattern having excellent mask reproducibility can be formed.

The acid dissociable group represented by "—$C(R^2)(R^3)$—O—$(CH_2)_{n2}$—$R^1$" in the constituent unit (a0) is of an acetal type, it is low in the energy (Ea) required for dissociation by the action of an acid, and in addition to the above, the Ea becomes low because the acid dissociable group contains a polar group. In this way, among acetal type acid dissociable groups, the acid dissociable group which the constituent unit (a0) has is low in Ea and is able to suppress the heating temperature of PEB to a lower level. According to this, on the occasion of forming a resist pattern, for example, the diffusion of an acid within the resist film is suppressed, and therefore, it is possible to contemplate to enhance the mask reproducibility.

EXAMPLES

The present invention is hereunder described in more detail by reference to the following Examples, but it should not be construed that the present invention is limited to these Examples.

Preparation of Resist Composition

Examples 1 to 7 and Comparative Examples 1 to 3

A resist composition of each of the Examples and Comparative Examples was prepared by mixing and dissolving the respective components shown in Table 1.

TABLE 1

|  | Component (A) | Component (B) |  | Component (D) | Component (E) | Component (F) | Component (S) |  |
|---|---|---|---|---|---|---|---|---|
| Example 1 | (A)-1 | (B)-1 | (B)-2 | (D)-1 | (E)-1 | (F)-1 | (S)-1 | (S)-2 |
|  | [100] | [4.7] | [1.0] | [2.5] | [0.1] | [1.5] | [100] | [3200] |
| Example 2 | (A)-2 | (B)-1 | (B)-2 | (D)-1 | (E)-1 | (F)-1 | (S)-1 | (S)-2 |
|  | [100] | [4.7] | [1.0] | [2.5] | [0.1] | [1.5] | [100] | [3200] |
| Example 3 | (A)-3 | (B)-1 | (B)-2 | (D)-1 | (E)-1 | (F)-1 | (S)-1 | (S)-2 |
|  | [100] | [4.7] | [1.0] | [2.5] | [0.1] | [1.5] | [100] | [3200] |
| Example 4 | (A)-4 | (B)-1 | (B)-2 | (D)-1 | (E)-1 | (F)-1 | (S)-1 | (S)-2 |
|  | [100] | [4.7] | [1.0] | [2.5] | [0.1] | [1.5] | [100] | [3200] |
| Example 5 | (A)-5 | (B)-1 | (B)-2 | (D)-1 | (E)-1 | (F)-1 | (S)-1 | (S)-2 |
|  | [100] | [4.7] | [1.0] | [2.5] | [0.1] | [1.5] | [100] | [3200] |
| Example 6 | (A)-6 | (B)-1 | (B)-2 | (D)-1 | (E)-1 | (F)-1 | (S)-1 | (S)-2 |
|  | [100] | [4.7] | [1.0] | [2.5] | [0.1] | [1.5] | [100] | [3200] |
| Example 7 | (A)-7 | (B)-1 | (B)-2 | (D)-1 | (E)-1 | (F)-1 | (S)-1 | (S)-2 |
|  | [100] | [4.7] | [1.0] | [2.5] | [0.1] | [1.5] | [100] | [3200] |
| Comparative Example 1 | (A)-8 | (B)-1 | (B)-2 | (D)-1 | (E)-1 | (F)-1 | (S)-1 | (S)-2 |
|  | [100] | [4.7] | [1.0] | [2.5] | [0.1] | [1.5] | [100] | [3200] |
| Comparative Example 2 | (A)-9 | (B)-1 | (B)-2 | (D)-1 | (E)-1 | (F)-1 | (S)-1 | (S)-2 |
|  | [100] | [4.7] | [1.0] | [2.5] | [0.1] | [1.5] | [100] | [3200] |
| Comparative Example 3 | (A)-10 | (B)-1 | (B)-2 | (D)-1 | (E)-1 | (F)-1 | (S)-1 | (S)-2 |
|  | [100] | [4.7] | [1.0] | [2.5] | [0.1] | [1.5] | [100] | [3200] |

In Table 1, the numerical value in each of square brackets exhibits a blending amount (mass parts), and the respective symbols have the following meanings.

(A)-1 to (A)-10: High-molecular weight compounds represented by the following chemical formulae (A)-1 to (A)-10, respectively With respect to each of the high-molecular weight compounds, its copolymerization composition ratio (proportion (molar ratio) of the respective constituent units in the chemical formula), mass average molecular weight (Mw), and degree of molecular weight dispersion (Mw/Mn) are described below along with the chemical formula.

The mass average molecular weight (Mw) and the degree of molecular weight dispersion (Mw/Mn) of each of the high-molecular weight compounds are values as converted into standard polystyrene determined by means of GPC measurement. The copolymerization composition ratio (proportion (molar ratio) of the respective constituent units in the structural formula) of each of the high-molecular weight compounds was determined by means of the carbon 13 nuclear magnetic resonance spectroscopy (600 MHz $^{13}$C-NMR).

(Chemical formula 49)
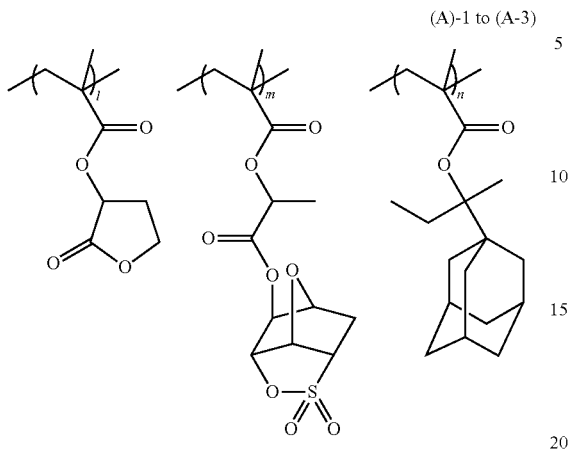
(A)-1 to (A-3)
(Chemical formula 50)
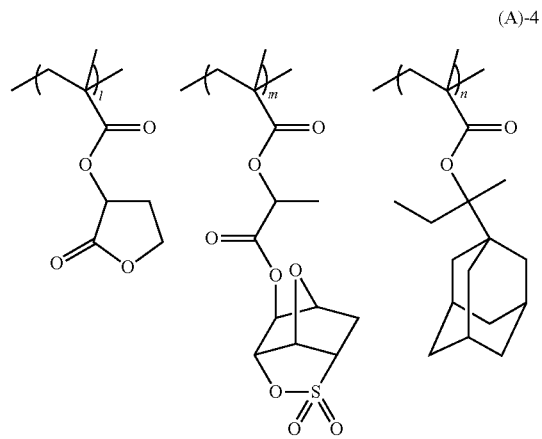
(A)-4
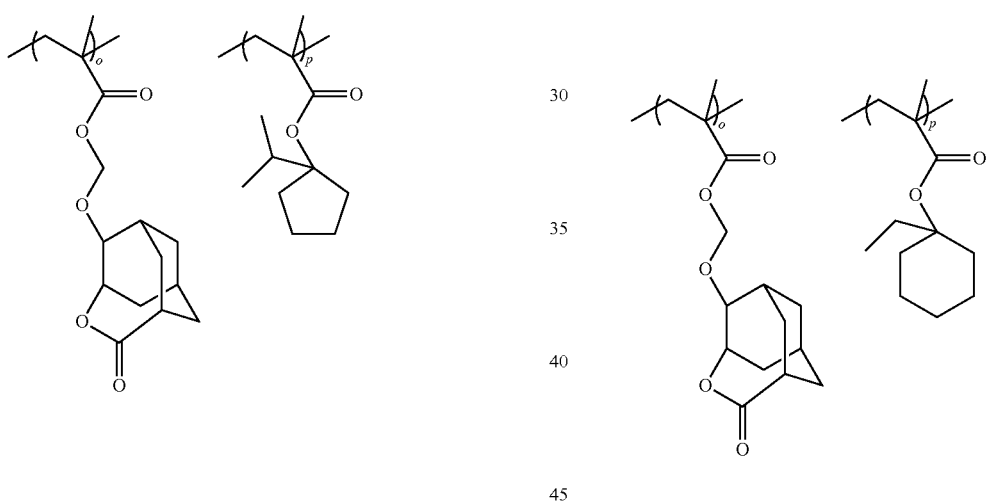
(A)-1: l/m/n/o/p/q=20/20/10/20/20/10, Mw: 8,900, Mw/Mn: 1.85
(A)-2: l/m/n/o/p/q=20/20/10/10/30/10, Mw: 9,400, Mw/Mn: 1.78
(A)-3: l/m/n/o/p/q=20/20/10/10/20/20, Mw: 8,400, Mw/Mn: 1.57
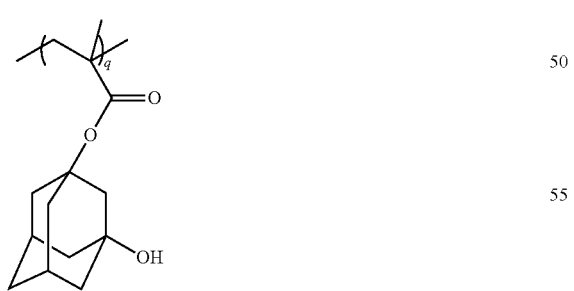
(A)-4: l/m/n/o/p/q=20/20/10/10/20/20, Mw: 8,700, Mw/Mn: 1.60

(Chemical formula 51)
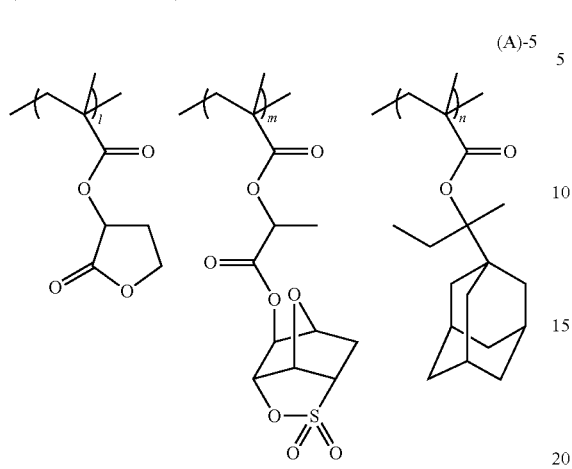
(A)-5: l/m/n/o/p/q=20/20/10/20/20/10, Mw: 8,800, Mw/Mn: 1.52
(Chemical formula 52)
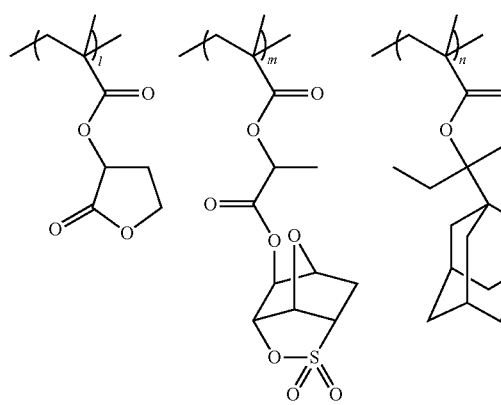
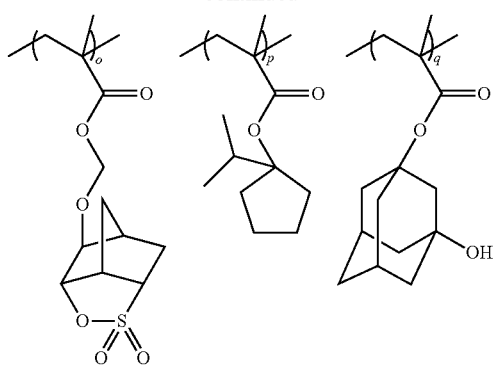
(A)-6: l/m/n/o/p/q=20/20/10/20/20/10, Mw: 8,500, Mw/Mn: 1.63
(Chemical formula 53)
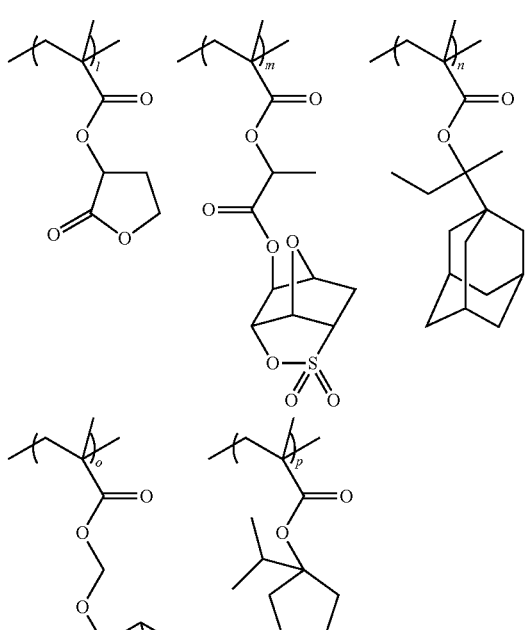
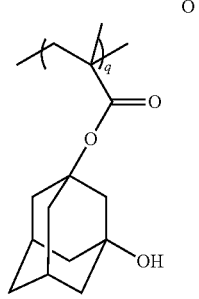
(A)-7: l/m/n/o/p/q=20/20/10/20/20/10, Mw: 8,900, Mw/Mn: 1.58

(Chemical formula 54)

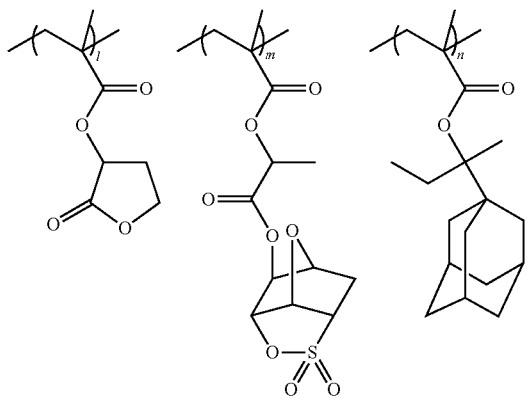

(A)-8

(A)-8: l/m/n/o/p/q=20/20/10/10/20/20, Mw: 8,500, Mw/Mn: 1.62

(Chemical formula 55)

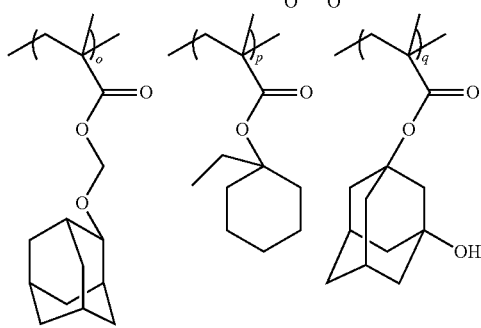

(A)-9

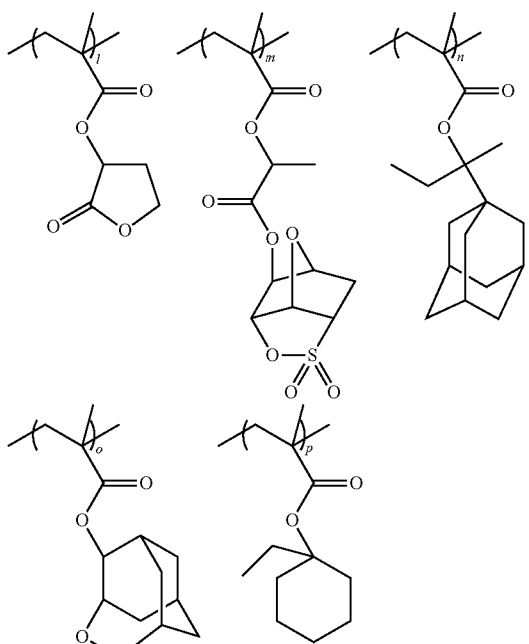

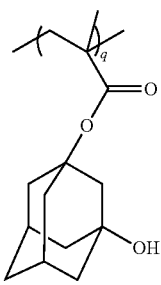

(A)-9: l/m/n/o/p/q=20/20/10/10/20/20, Mw: 8,600, Mw/Mn: 1.65

(Chemical formula 56)

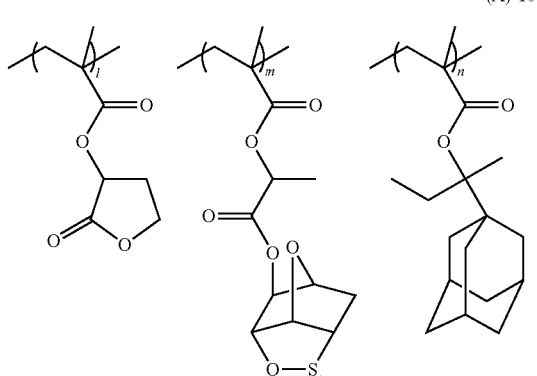

(A)-10

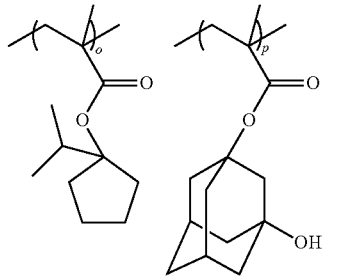

(A)-10: l/m/n/o/p=20/20/30/20/10, Mw: 8,100, Mw/Mn: 1.58

(B)-1: Compound represented by the following chemical formula (B)-1

(B)-2: Compound represented by the following chemical formula (B)-2

(D)-1: Compound represented by the following chemical formula (D)-1

(E)-1: Salicylic acid (F)-1: Fluorine-containing high-molecular weight compound represented by the following chemical formula (F)-1. The mass average molecular weight (Mw) as converted into standard polystyrene determined by means of GPC measurement is 23,000, and the degree of molecular weight dispersion (Mw/Mn) is 1.8. The copolymerization composition ratio (proportion (molar ratio) of the respective constituent units in the structural formula) determined by means of the carbon 13 nuclear magnetic resonance spectroscopy (600 MHz $^{13}$C-NMR) is l/m=77/23.

(S)-1: γ-Butyrolactone
(S)-2: Mixed solvent of PGMEA/PGME/cyclohexanone=45/35/20 (mass ratio)

(Chemical formula 57)

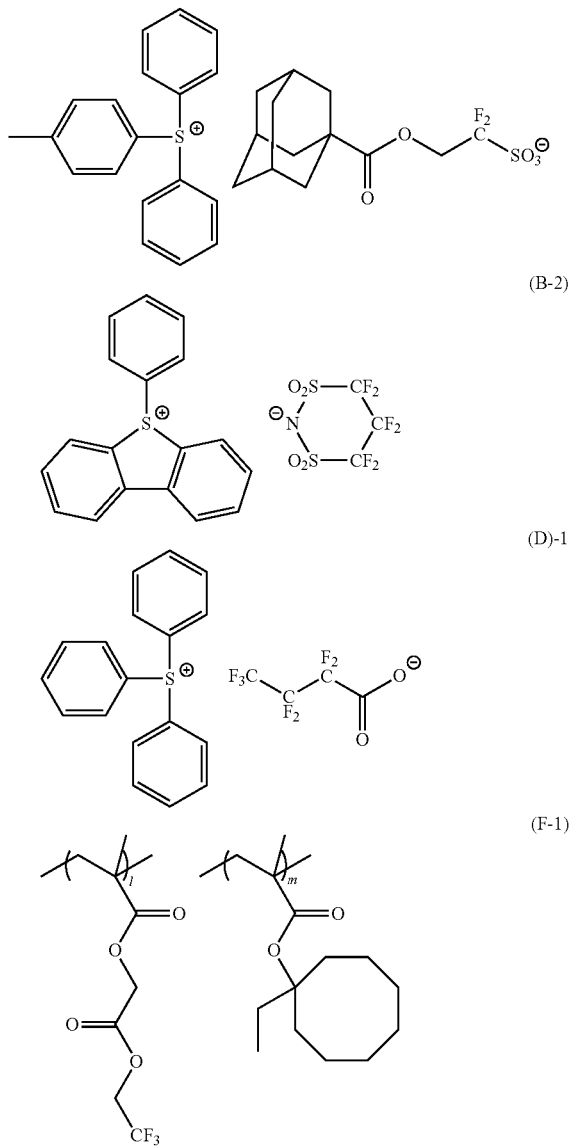

[Evaluation of Residual Film Properties of Exposed Areas of Resist Film]

On a 12-inch silicon wafer after a treatment with hexamethyldisilazane (HMDS), the resist composition of each of the Examples and Comparative Examples was coated using a spinner and subjected to a prebake (PAB) treatment on a hot plate at 105° C. for 60 seconds and dried, thereby forming a resist film having a film thickness of 100 nm.

The entire surface of the resist film was exposed with ArF excimer lasers (193 nm) at an exposure amount of 0 to 80 mJ/cm² by an ArF exposure apparatus, NSR-S308 (a product name, manufactured by Nikon Corporation, NA (numerical aperture)=0.92, 2/3 annular illumination).

Thereafter, the resultant was subjected to a post exposure bake (PEB) treatment at 85° C. for 60 seconds, further subjected to solvent development with butyl acetate for 13 seconds, and dried by shaking, followed by a post beak treatment at 100° C. for 60 seconds.

A resist film thickness ($FT_1$) after the PEB treatment and a resist film thickness ($FT_2$) after the development and post bake were measured, respectively by Nanospec 6100A (manufactured by Nanometrics Incorporated).

Then, a rate of change (shrink rate, %) from each resist film thickness at an exposure amount of 80 mJ/cm² to the resist film thickness by subjecting the resist film after the PEB treatment to the development and post bake treatment was determined according to the following equation.

Rate of change of resist film thickness(shrink rate,%)= ($FT_2/FT_1$)×100

The resist film thickness ($FT_1$) (nm) after the PEB treatment, the resist film thickness ($FT_2$) (nm) after the development and post bake, the rate of change of the resist film thickness (shrink rate, %) determined according to the foregoing equation are shown in Table 2.

It is meant that the larger the value of the rate of change of the resist film thickness (shrink rate, %) is, the smaller the change of the resist film thickness is, and the higher the residual film rate of exposed areas of the resist film is.

TABLE 2

|  | Example 3 | Comparative Example 1 | Comparative Example 3 |
| --- | --- | --- | --- |
| Resist film thickness after PAB treatment (nm) | 100 | 100 | 100 |
| Resist film thickness ($FT_1$) after PEB treatment (nm) | 85 | 86 | 72 |
| Resist film thickness ($FT_2$) after development and post bake (nm) | 77 | 60 | 63 |
| Rate of change of resist film thickness (shrink rate, %) | 90 | 70 | 87 |

From the evaluation results shown in Table 2, in patterning by the negative type development with an organic developing solution, it is noted that the case of using the resist composition of Example 3 is high in the residual film rate of exposed areas of the resist film as compared with the case of using each of the resist compositions of Comparative Examples 1 and 3.

<Resist Pattern Formation>

An organic antireflection film having a film thickness of 150 nm was formed on a 12-inch silicon wafer, and subsequently, an inorganic antireflection film having a film thickness of 35 nm was laminated on the organic antireflection film.

On the inorganic antireflection film, the resist composition of each of the Examples and comparative Examples was coated using a spinner and subjected to a prebake (PAB) treatment on a hot plate at 105° C. for 60 seconds and dried, thereby forming a resist film having a film thickness of 100 nm.

Subsequently, the resist film was selectively irradiated with ArF excimer lasers (193 nm) through a photomask by an ArF exposure apparatus for liquid immersion, NSR-S609B [manufactured by Nikon Corporation, NA (numerical aperture)=1.07, annular (0.97/0.78) with XY-polarization, liquid immersion medium: water].

Thereafter, a post exposure bake (PEB) treatment was conducted at a heating temperature shown in Table 3 for 60 seconds.

Subsequently, the resultant was subjected to solvent development with butyl acetate at 23° C. for 13 seconds and dried by shaking.

As a result, in all of the Examples and comparative Examples, a contact hole pattern (hereinafter referred to as "CH pattern") in which holes having a diameter of 55 nm were disposed at regular intervals (pitch: 110 nm) was formed.

An optimum exposure amount Eop (mJ/cm$^2$) at which the CH pattern was formed was determined. The results are shown in Table 3.

[Evaluation of Mask Reproducibility]

A CH pattern was formed in the same manner as that in the above-described <Resist pattern formation>, except that a photomask having a different target size was used at the above-described Eop. At that time, the target size of the photomask was changed at intervals of 1 nm within the range of the hole diameter of 55 nm±5 nm while fixing the pitch to 110 nm.

As for the CH patterns formed at 11 points in total, the hole diameter (nm) of each hole was plotted on the ordinate, and the hole diameter (nm) of the target size was plotted on the abscissa. A gradient of the straight line at that time was calculated as "MEEF". The results are shown in Table 3.

It is meant that closer the value of MEEF is, the more satisfactory the mask reproducibility is.

[Evaluation of Critical Dimension Uniformity (CDU) of Pattern Dimension]

100 holes in the above-described CH pattern were observed from above using a measuring SEM (scanning electron microscope) (a trade name: S-9380, manufactured by Hitachi High-Technologies Corporation; accelerating voltage: 300 V), and a hole diameter (nm) of each hole was measured. Then, a value of 3 times the standard deviation ($\sigma$) (i.e., 3$\sigma$) calculated from the measurement results was determined. The results are shown as "CDU (nm)" in Table 3.

It is meant that the smaller the thus determined 3$\sigma$ value is, the higher the dimension (CD) uniformity of the plural holes formed on the resist film is.

[Evaluation of Depth of Focus (DOF)]

A CH pattern was formed in the same manner as that in the above-described <Resist pattern formation>, except that the focus was properly slid upward and downward at the above-described Eop. At that time, a depth of focus (DOF, unit: µm) at which the CH pattern could be formed within a range of a rate of change of dimension of (target dimension) ±5% (namely, 52.25 to 57.75 nm) was determined. The results are shown in Table 3.

[Evaluation of Pattern Height]

A height (nm) of the CH pattern formed by the above-described <Resist pattern formation> was measured using a wafer shape/characteristic measurement apparatus (a product name: SCD-XT, manufactured by KLA-TENCOR Corporation). The results are shown in Table 3.

TABLE 3

| | PEB (°C.) | EOP (mJ/cm$^2$) | MEEF | CDU (nm) | DOF (µm) | Pattern height (nm) |
|---|---|---|---|---|---|---|
| Example 1 | 85 | 18.4 | 6.43 | 8.49 | 0.31 | 84.49 |
| Example 2 | 85 | 20.5 | 6.50 | 6.99 | 0.31 | 79.48 |
| Example 3 | 85 | 26.3 | 6.38 | 7.35 | 0.33 | 83.75 |
| Example 4 | 85 | 20.5 | 6.80 | 7.99 | 0.31 | 80.68 |
| Example 5 | 85 | 21.7 | 7.12 | 8.32 | 0.30 | 77.47 |
| Example 6 | 85 | 27.5 | 7.03 | 8.01 | 0.29 | 78.82 |
| Example 7 | 85 | 25.3 | 6.99 | 8.23 | 0.31 | 76.53 |
| Comparative Example 1 | 90 | 20.7 | 7.46 | 11.24 | 0.25 | 71.69 |
| Comparative Example 2 | 85 | 19.7 | 7.26 | 9.05 | 0.25 | 69.73 |
| Comparative Example 3 | 85 | 20.5 | 7.32 | 8.59 | 0.28 | 68.82 |

From the evaluation results shown in Table 3, it is noted that on the occasion of forming a resist pattern by patterning by negative type development with an organic developing solution, by using each of the resist compositions of Examples 1 to 7, the mask reproducibility is excellent, the lithography properties are satisfactory, and the film reduction is hardly caused.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for forming a resist pattern comprising:
   a step of forming a resist film on a support by using a resist composition which generates an acid upon exposure;
   a step of exposing the resist film; and
   a step of heating the exposed resist film and conducting patterning by negative type development with a developing solution containing an organic solvent, wherein
   the resist composition contains a resin component (A) which exhibits decreased solubility in the organic solvent under the action of the acid and which contains a high-molecular weight compound (A1) having a constituent unit (a0) represented by the following general formula (a0-1), wherein the constituent unit (a0) exhibits increased polarity under the action of the acid:

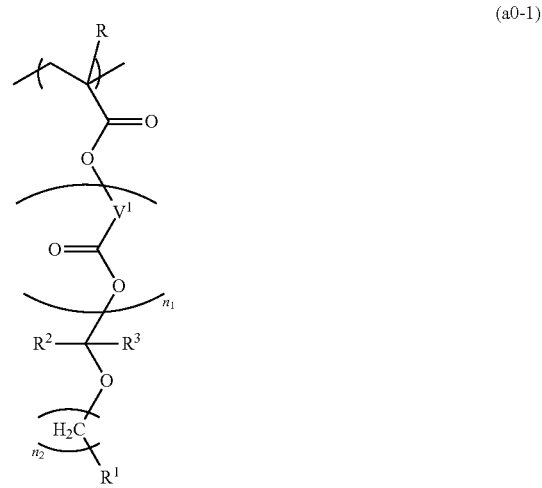

(a0-1)

wherein R represents a hydrogen atom, an alkyl group having 1 to 5 carbon atoms, or a halogenated alkyl group having 1 to 5 carbon atoms; $V^1$ represents a divalent hydrocarbon group which may have an ether bond, a urethane bond, or an amide bond; $n_1$ is 0 to 2; $n_2$ is 0 to 3; $R^1$ represents a lactone-containing cyclic group, an —SO$_2$—-containing cyclic group, or a carbonate-containing cyclic group; and each of R$^2$ and R$^3$ independently represents a hydrogen atom or an alkyl group having 1 to 5 carbon atoms.

2. The method for forming a resist pattern according to claim 1, wherein the high-molecular weight compound (A1) further contains a constituent unit (a1) other than the constituent unit (a0), which contains an acid decomposable group whose polarity increases by the action of an acid.

3. The method for forming a resist pattern according to claim 1, wherein the high-molecular weight compound (A1) further contains a constituent unit (a2) other than the constituent unit (a0), which contains a lactone-containing cyclic group, an —SO$_2$—-containing cyclic group, or a carbonate-containing cyclic group.

4. The method for forming a resist pattern according to claim 2, wherein the high-molecular weight compound (A1) has two kinds of the constituent unit (a1).

5. The method for forming a resist pattern according to claim 1, wherein the resist composition further contains an acid diffusion controlling agent component (D).

6. The method for forming a resist pattern according to claim 5, wherein the acid diffusion controlling agent component (D) is a photodegradable base component (D1) which is decomposed upon exposure to lose acid diffusion controlling properties.

7. The method for forming a resist pattern according to claim 6, wherein the component (D1) contains a compound represented by the following general formula (d1-1):

(d1-1)

wherein Rd$^1$ represents an optionally substituted cyclic group, an optionally substituted chain alkyl group, or an optionally substituted chain alkenyl group; m is an integer of 1 or more; and each of M$^{m+}$s independently represents an m-valent organic cation.

8. The method for forming a resist pattern according to claim 7, wherein Rd$^1$ has a fluorine atom or a fluorinated alkyl group as the substituent.

* * * * *